(12) United States Patent
Taylor

(10) Patent No.: US 10,304,981 B2
(45) Date of Patent: May 28, 2019

(54) DUAL WAVELENGTH IMAGING CELL ARRAY INTEGRATED CIRCUIT

(71) Applicants: THE UNIVERSITY OF CONNECTICUT, Farmington, CT (US); Opel Solar, Inc., Storrs Mansfield, CT (US)

(72) Inventor: Geoff W. Taylor, Mansfield, CT (US)

(73) Assignees: THE UNIVERSITY OF CONNECTICUT, Farmington, CT (US); Opel Solar, Inc., Storrs Mansfield, CT (US)

( * ) Notice: Subject to any disclaimer, the term of this patent is extended or adjusted under 35 U.S.C. 154(b) by 206 days.

(21) Appl. No.: 15/435,413

(22) Filed: Feb. 17, 2017

(65) Prior Publication Data

US 2017/0301809 A1    Oct. 19, 2017

Related U.S. Application Data

(63) Continuation of application No. 14/023,525, filed on Sep. 11, 2013, now Pat. No. 9,614,112.

(51) Int. Cl.
*H01L 27/146* (2006.01)
*H01L 31/0352* (2006.01)
(Continued)

(52) U.S. Cl.
CPC .. *H01L 31/035218* (2013.01); *H01L 27/1461* (2013.01); *H01L 27/14616* (2013.01);
(Continued)

(58) Field of Classification Search
CPC ......... H01L 31/035218; H01L 27/1461; H01L 27/14616; H01L 27/14629;
(Continued)

(56) References Cited

U.S. PATENT DOCUMENTS 4,933,731 A    6/1990    Kimura
6,031,243 A    2/2000    Taylor
(Continued)

FOREIGN PATENT DOCUMENTS

WO    02/071490 A1    9/2002
WO    2008/011152 A2    1/2008

OTHER PUBLICATIONS

"Kodak CCD Primer, #KCP-001, Charge-Coupled Device (CCD) Image Sensors," 1992, downloaded from http://www.kodal.com/US/en/digital/pdf/ccdPrimerPart2.pdf.
(Continued)

*Primary Examiner* — Kevin K Pyo
*Assistant Examiner* — Don J Williams
(74) *Attorney, Agent, or Firm* — Sughrue Mion, PLLC

(57) ABSTRACT

A semiconductor device that includes an array of imaging cells is provided. Each imaging cell of the array of imaging cells includes an imaging region and first and second charge storage regions. Further, each imaging cell includes first and second quantum dot-in-quantum well (QD-in-QW) structures. The first QD-in-QW structure absorbs an incident electromagnetic radiation having a wavelength within a predetermined first wavelength band and generates a hole photocurrent. The second QD-in-QW structure absorbs an incident electromagnetic radiation having a wavelength within a predetermined second wavelength band and generates an electron photocurrent. Each imaging cell further includes p-type and n-type modulation doped QW structures that defines first and second buried QW channels. The first and second buried QW channels provide for lateral transfer of the hole and electron photocurrents for charge accumulation in the first and second charge storage regions, respectively.

20 Claims, 26 Drawing Sheets

(51) Int. Cl.
  *H01L 31/0224* (2006.01)
  *H01L 31/0232* (2014.01)
  *H01L 31/111* (2006.01)
  *H01L 27/148* (2006.01)

(52) U.S. Cl.
  CPC .. *H01L 27/14629* (2013.01); *H01L 27/14643* (2013.01); *H01L 27/14652* (2013.01); *H01L 27/14689* (2013.01); *H01L 27/14812* (2013.01); *H01L 27/14831* (2013.01); *H01L 31/02327* (2013.01); *H01L 31/022408* (2013.01); *H01L 31/035236* (2013.01); *H01L 31/1113* (2013.01)

(58) Field of Classification Search
  CPC ......... H01L 27/14643; H01L 27/14652; H01L 27/14689; H01L 27/14812; H01L 31/02327; H01L 31/035236; H01L 31/1113; H01L 27/14831; H01L 31/022408
  See application file for complete search history.

(56) References Cited

U.S. PATENT DOCUMENTS

| | | | |
|---|---|---|---|
| 6,040,936 | A | 3/2000 | Kim et al. |
| 6,479,844 | B2 | 11/2002 | Taylor |
| 6,841,795 | B2 | 1/2005 | Taylor et al. |
| 6,849,866 | B2 | 2/2005 | Taylor |
| 6,853,014 | B2 | 2/2005 | Taylor et al. |
| 6,870,207 | B2 | 3/2005 | Taylor |
| 6,873,273 | B2 | 3/2005 | Taylor et al. |
| 6,954,473 | B2 | 10/2005 | Dehmubed et al. |
| 6,995,407 | B2 | 2/2006 | Taylor et al. |
| 7,332,752 | B2 | 2/2008 | Taylor et al. |
| 2004/0021138 | A1 | 2/2004 | Shields |
| 2005/0051861 | A1 | 3/2005 | Shi |
| 2005/0271092 | A1 | 12/2005 | Ledentsov |
| 2010/0006143 | A1* | 1/2010 | Welser .................. B82Y 20/00 136/255 |
| 2011/0073762 | A1 | 3/2011 | Soma |
| 2012/0104358 | A1 | 5/2012 | de Rochemont |
| 2012/0205541 | A1 | 8/2012 | Lee et al. |
| 2014/0050242 | A1 | 2/2014 | Taylor |

OTHER PUBLICATIONS

"Optimum Design for a 2-PhaseCCD", Y. Kayakami et al., Microelectronics Research Labortories, NEC Corporation, 1995.
U.S. Appl. No. 08/949,504, filed Oct. 14, 1997 (Abandoned).
U.S. Appl. No. 09/710,217, filed Nov. 10, 2000 (Abandoned).
U.S. Appl. No. 60/376,238, filed Apr. 26, 2002.
"Extraordinary Transmission in Metal Hole Arrayphotonic Crystal Hybrid Structures", O. Glushko et al., Optics Express 17174, Jul. 16, 2012, vol. 20. No. 15.

* cited by examiner

| Layer Material | Layer Doping Type | Typical Doping Concentration | Typical Layer Thickness (Å) | Layer # | Notes |
|---|---|---|---|---|---|
| InGaAs | P+ | 1e20 | 30 | 1065 / 38 | preferably 10% In, assists in forming top ohmic contact during anneal |
| GaAs | P+ | 1e20 | 500-1300 | 1063 | forms top ohmic contact |
| Al(0.7)Ga(0.3)As | P | 5e17 | 600-1000 | 1061 | assists in confinement |
| Al(0.15)Ga(0.85)As | P+ | 7e18 | 60 | 1059 / 36 | top plate of upper capacitor |
| Al(0.15)Ga(0.85)As |  | UD | 100-200 | 1057 / 34 |  |
| Al(0.15)Ga(0.85)As | N+ | 3e18 | 80 | 1055 | N+ charge sheet - bottom plate of upper capacitor and modulation doping layer |
| Al(0.15)Ga(0.85)As |  | UD | 30 | 1053 / 32 | GaAs barrier layer |
| GaAs |  | UD | 10 | 1051 |  |
| InGaAs |  | UD | 60 | 1049 | QW layer, digital grading of In with 15-20% In |
| GaAs |  | UD | 300-500 | 1047 / 30 | GaAs barrier layer |
| InGaAs |  | UD | 100-120 | 1045 | QW layer, preferably digital grading of In with 15-20% In |
|  |  |  |  | 1043 / 28 | 5-8x InAs QD growth; forms QDs embedded between top side and bottom side of digitally-graded InGaAs QW |
| InAs |  | UD |  | 1041 | QW layer, digital grading of In with 15-20% In |
| InGaAs |  | UD | 100-120 | 1039 | GaAs barrier layer with n-type delta doping |
| GaAs |  | UD | 300-500 | 1037 / 26 |  |
| Al(0.15)Ga(0.85)As | N | 1-2e16 | 2000 | 1035 |  |
| Al(0.15)Ga(0.85)As | P | 5e15 | 2000 |  |  |
| GaAs |  | UD |  | 1033 | GaAs barrier layer with p-type delta doping |
| InGaAs |  | UD | 300-500 | 1031 | QW layer, digital grading of In with 15-20% In |
|  |  |  | 100-120 | 1029 / 24 | 5-8x InAs QD growth; forms QDs embedded between top side and bottom side of digitally-graded InGaAs QW |
| InAs |  | UD |  | 1027 | QW layer, digital grading of In with 15-20% In |
| InGaAs |  | UD | 100-120 | 1025 / 22 | GaAs barrier layer |
| GaAs |  | UD | 300-500 | 1023 |  |
| InGaAs |  | UD | 60 | 1021 | QW layer, digital grading of In with 15-20% In |
| GaAs |  | UD | 10 | 1019 | GaAs barrier layer |
| Al(0.15)Ga(0.85)As |  | UD | 30 | 1017 / 20 |  |
| Al(0.15)Ga(0.85)As | P+ | 7e18 | 40 |  | P+ charge sheet - top plate of bottom capacitor and modulation doping layer |

FIG. 2A

| Layer Material | Layer Doping Type | Typical Doping Concentration | Typical Layer Thickness (Å) | Layer # | | Notes |
|---|---|---|---|---|---|---|
| Al(0.15)Ga(0.85)As | | UD | 100-300 | 1015 | } 18 | |
| Al(0.15)Ga(0.85)As | N+ | 3.5e18 | 60 | 1013 | } 16 | bottom plate of bottom capacitor |
| Al(0.7)Ga(0.3)As | N | 1e18 | 600-1000 | 1011 | | assists in confinement |
| GaAs | N+ | 3.5e18 | 3000 | 1009 | ) 14 | forms bottom ohmic contact |
| AlAs | | UD | 1500-1600 | 1007 | | forms bottom DBR mirror |
| GaAs | | UD | 650-750 | 1005 | } 12 | |
| AlAs | | UD | 1500-1600 | 1003 | | |
| GaAs substrate | | SI | | 1001 | ) 10 | |

FIG. 2B

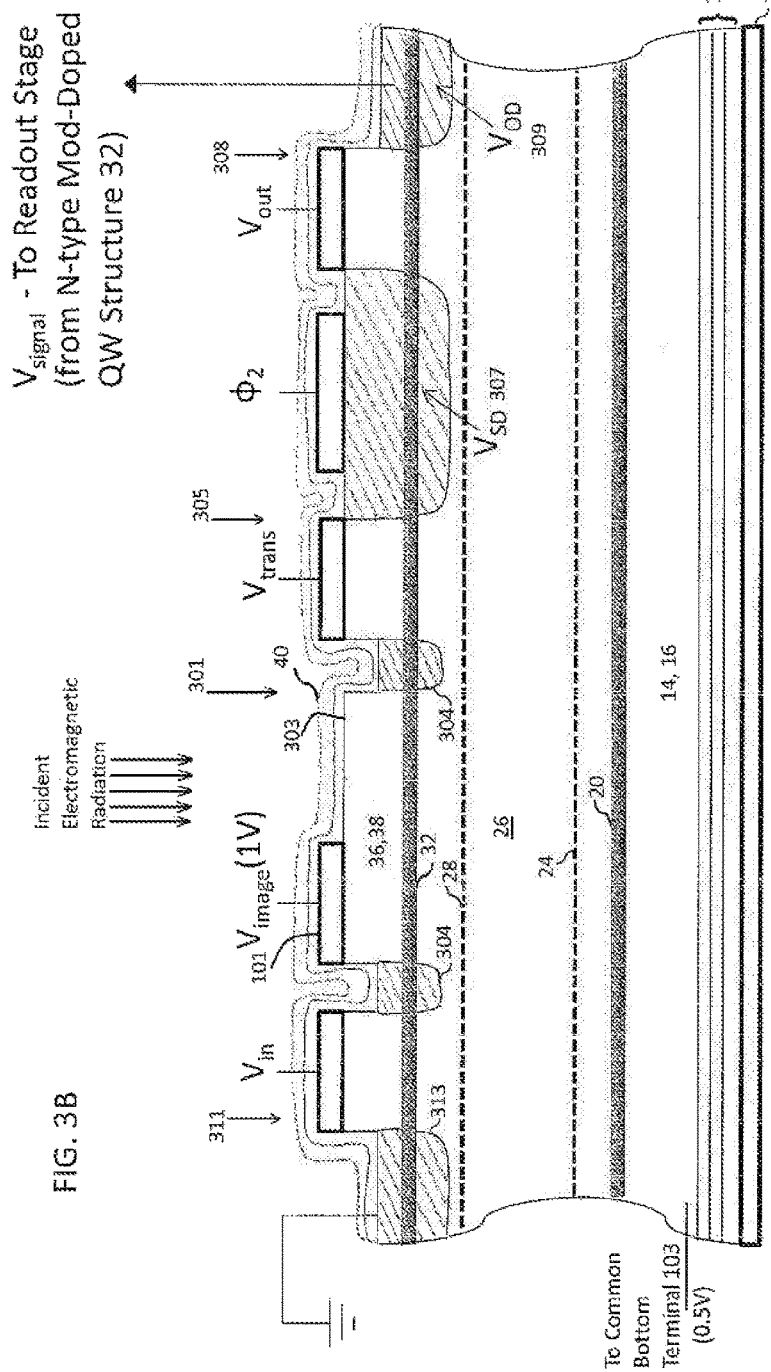

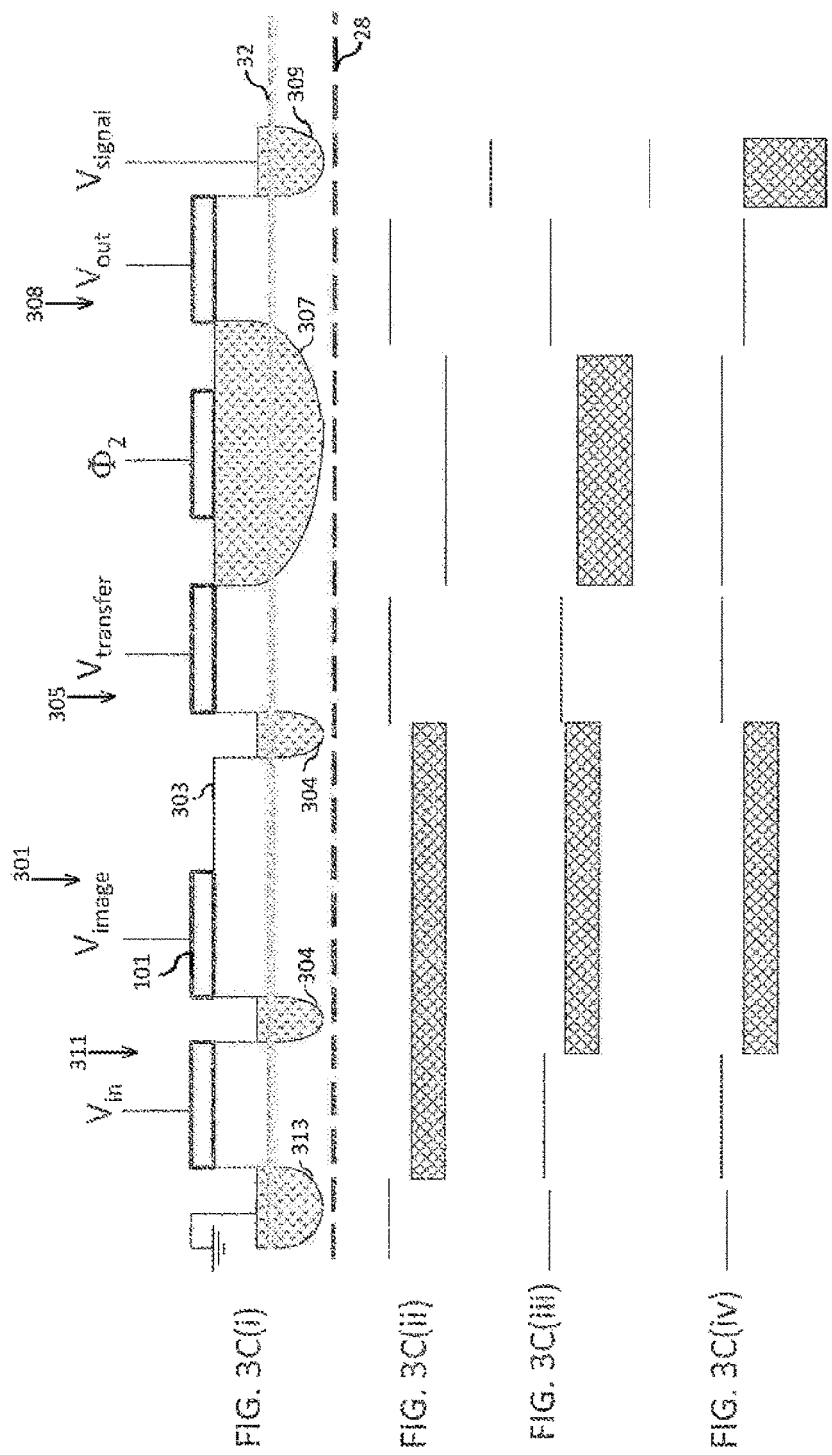

Energy Diagram of the Thyristor Imaging Cell utilizing N-type mod-doped QW Structure with zero bias voltage applied to the Collector with respect to the N-type mod-doped QW Structure 32

Energy Diagram of the Thyristor Imaging Cell utilizing N-type mod-doped QW Structure with a positive bias voltage applied the Collector with respect to the N-type mod-doped QW Structure 32

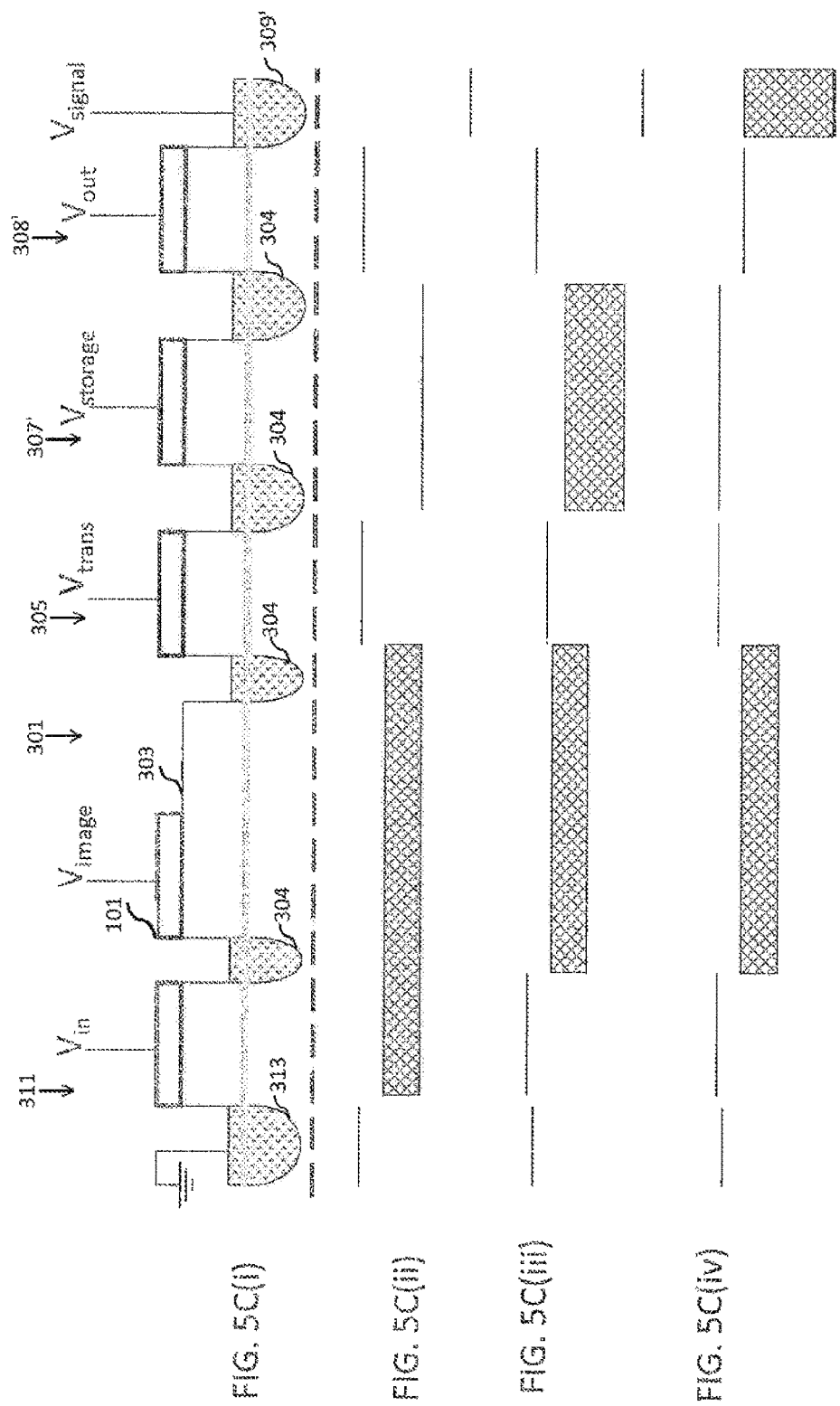

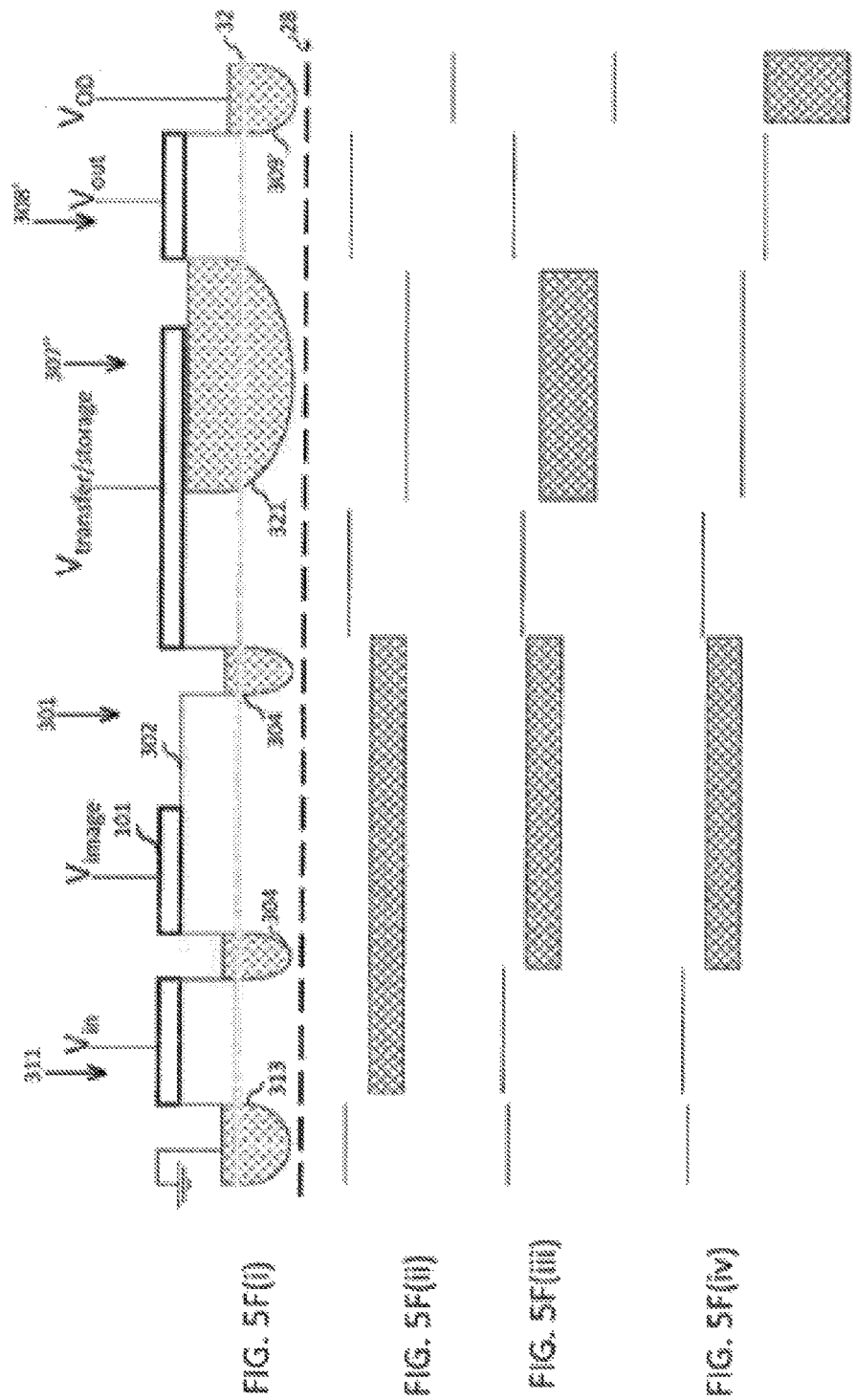

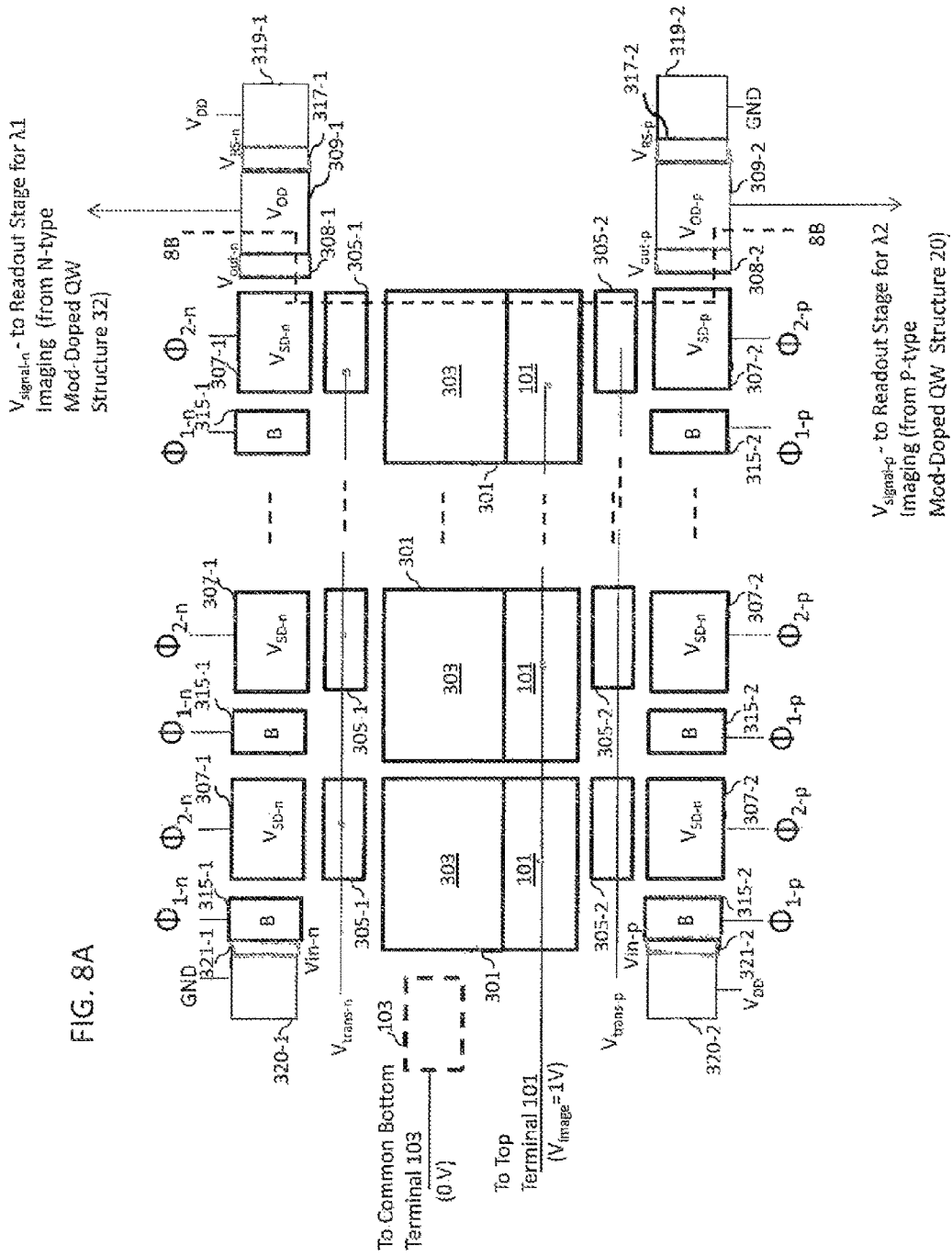

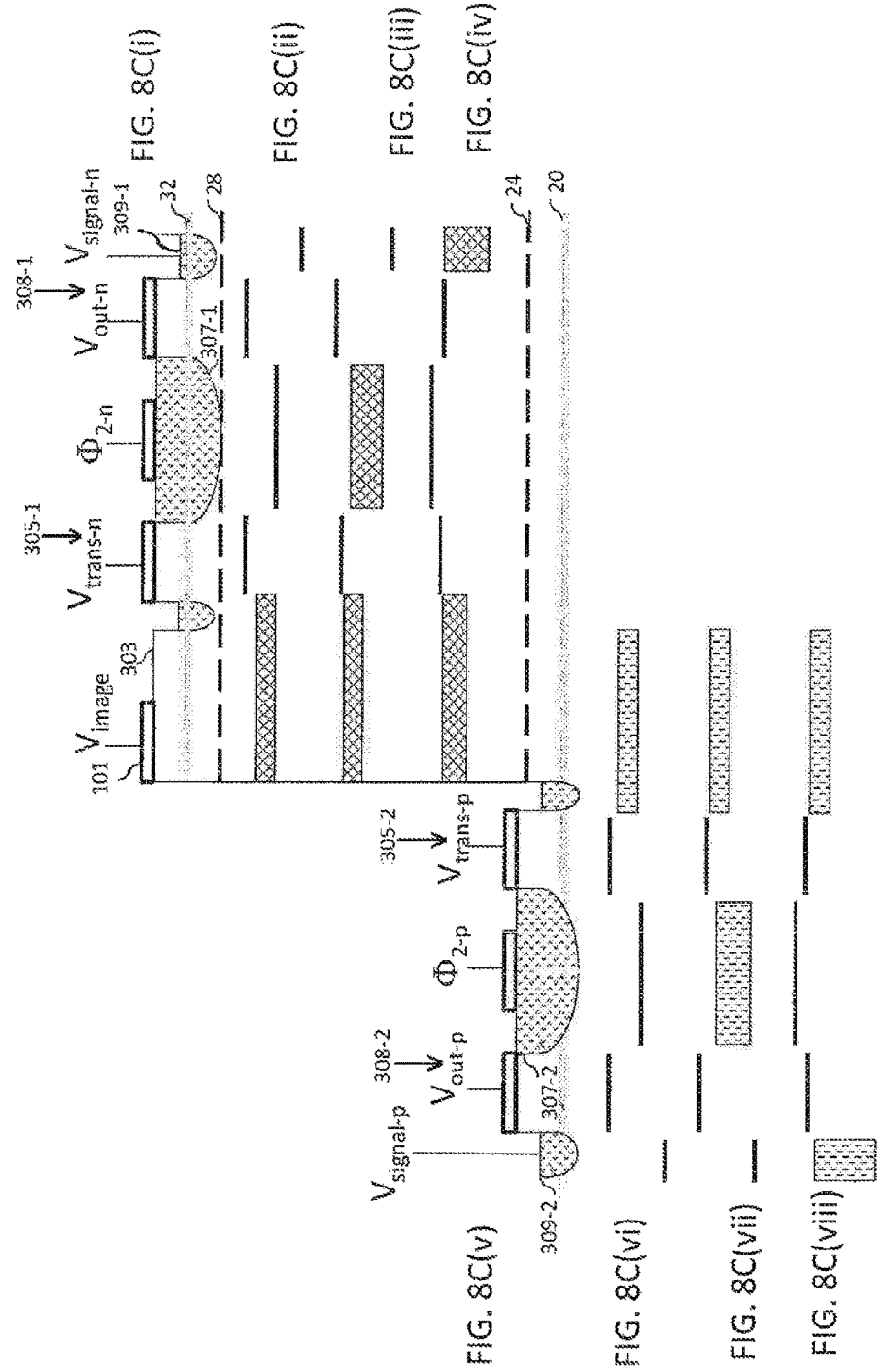

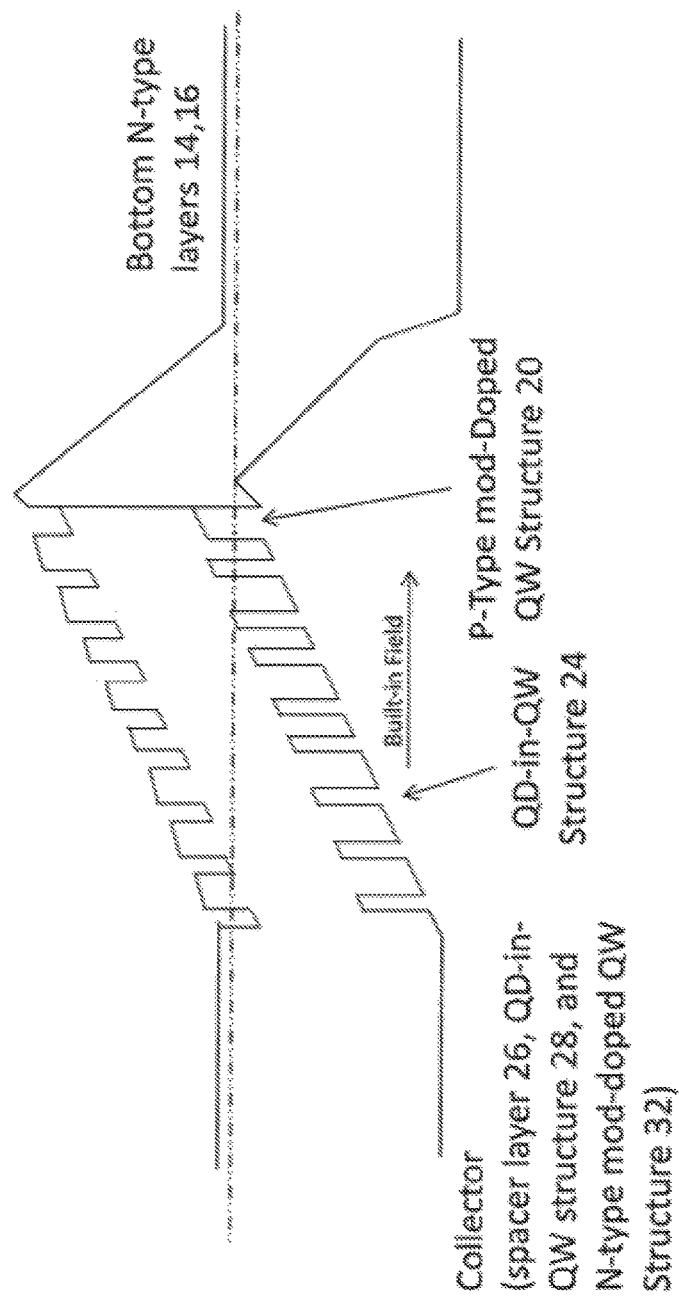
FIG. 9A Energy Diagram of the Thyristor Imaging Cell utilizing P-type mod-doped QW Structure with a zero bias voltage applied to the Collector with respect to the P-type mod-doped QW Structure 20

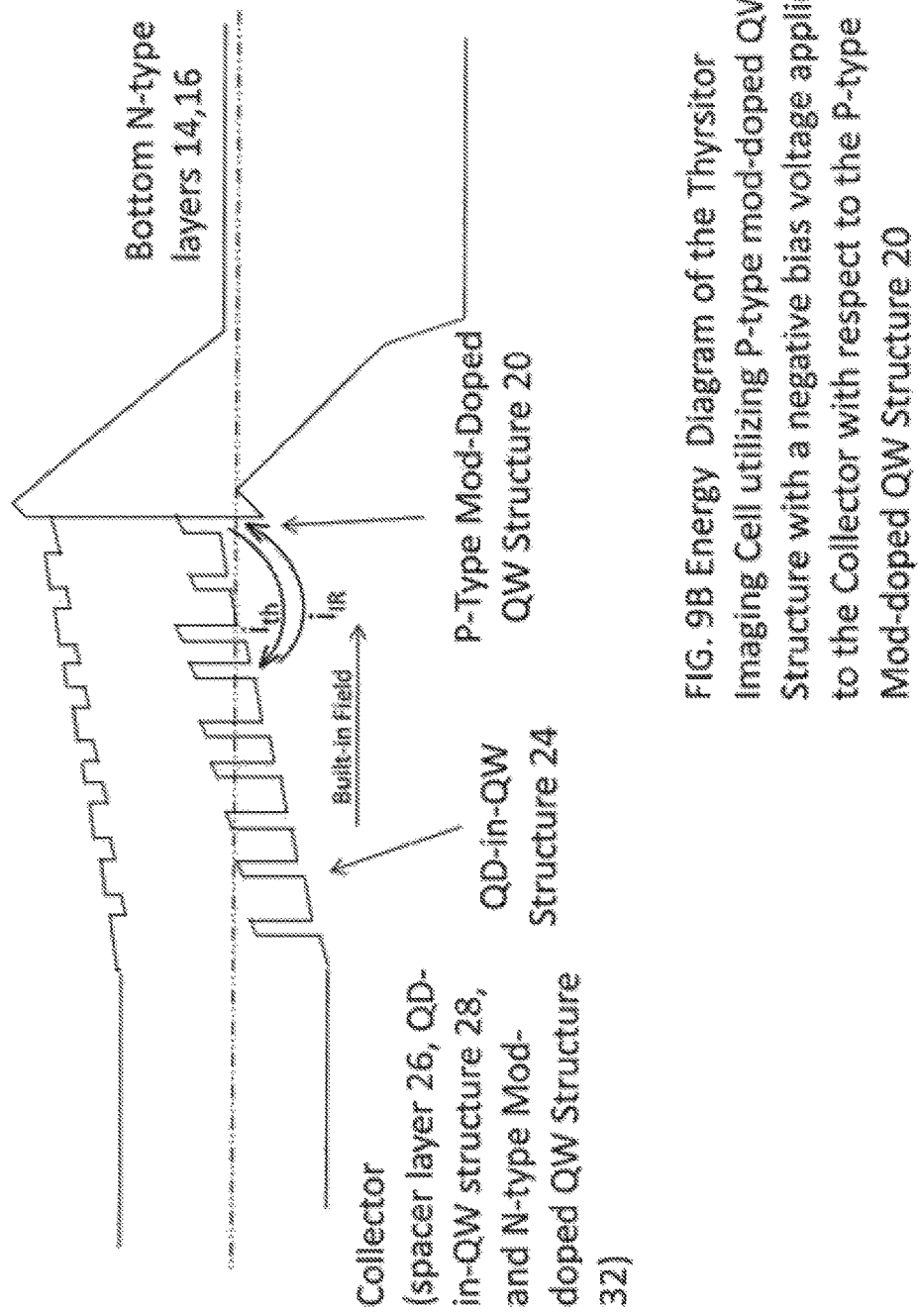
FIG. 9B Energy Diagram of the Thyristor Imaging Cell utilizing P-type mod-doped QW Structure with a negative bias voltage applied to the Collector with respect to the P-type Mod-doped QW Structure 20

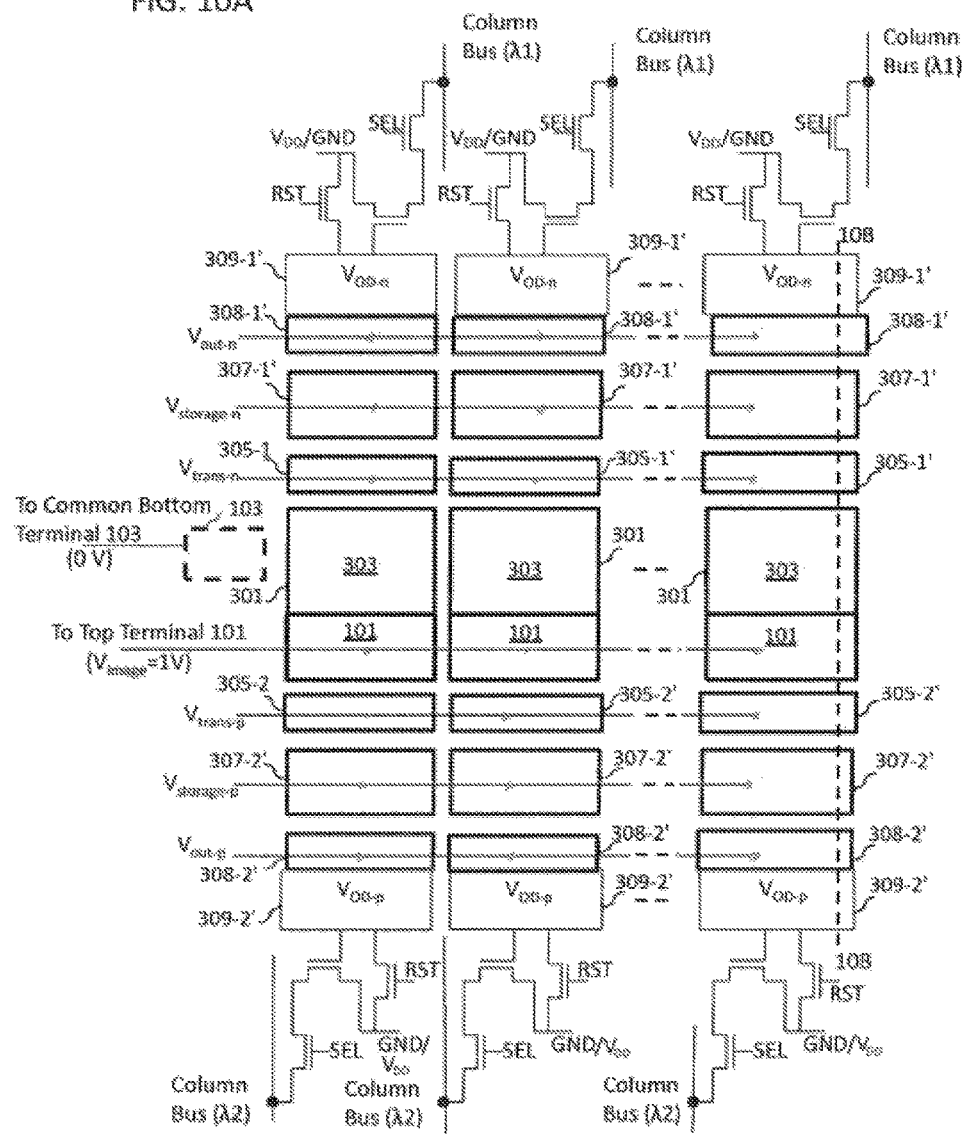

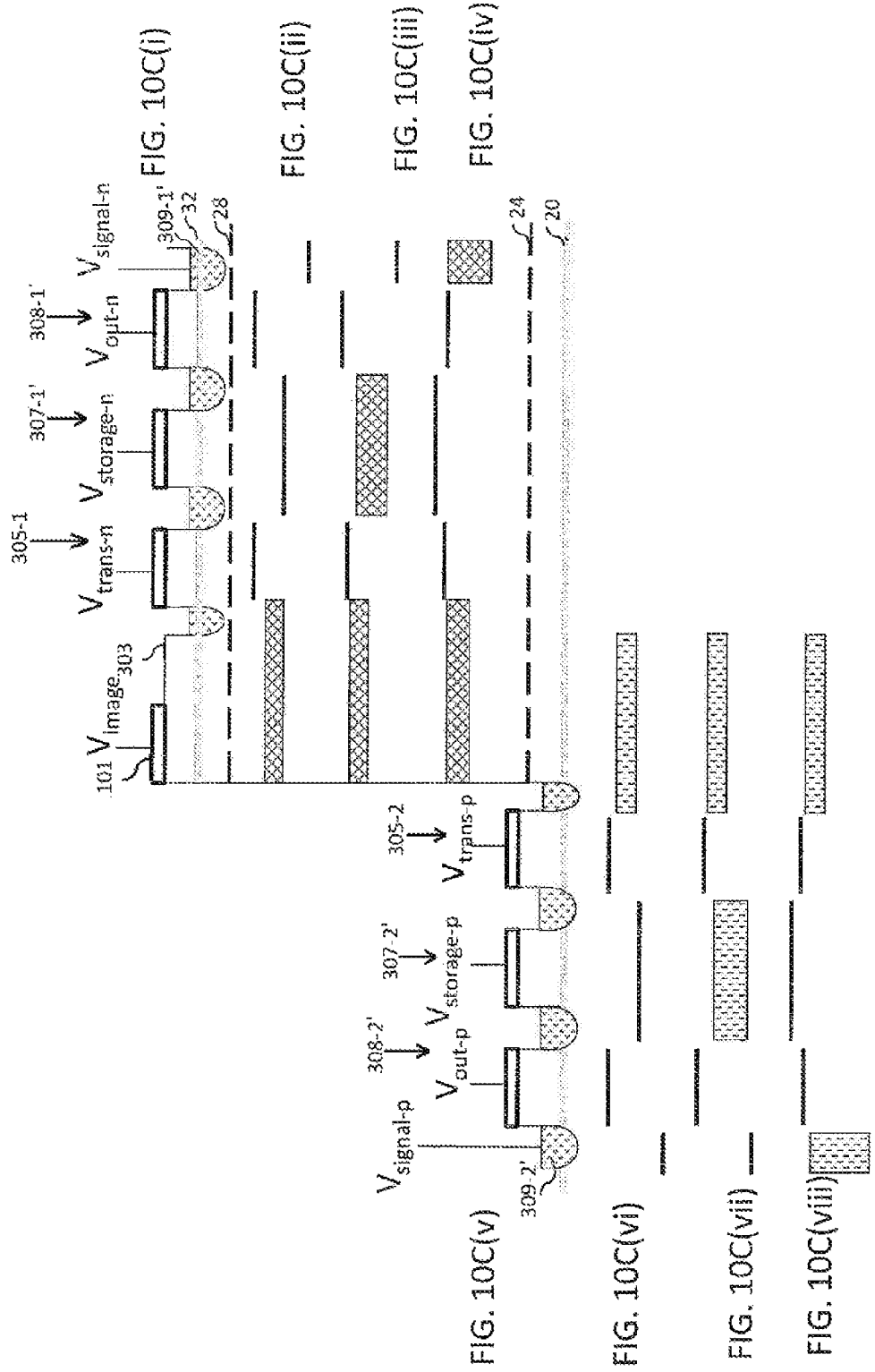

Top (Anode) Terminal of Thyristor Imaging Cell (101)

| Structured Metal Film 1200 |
| P-type Ohmic Contact 38 |
| P-type layer(s) 36 |
| Undoped Spacer Layer 34 |
| N-type Modulation Doped QW Structure 32 |
| Undoped Spacer Layer 30 |
| QD-in-QW Structure 28 |
| Spacer Layer(s) 26 |
| QD-in-QW Structure 24 |
| Undoped Spacer Layer 22 |
| P-type Modulation Doped QW Structure 20 |
| Undoped spacer layer 18 |
| N-type layer(s) 16 |
| N-type Ohmic Contact 14 |
| Substrate 10 |

Bottom (Cathode) Terminal of Thyristor Imaging Cell (103)

FIG. 12

DUAL WAVELENGTH IMAGING CELL ARRAY INTEGRATED CIRCUIT

CROSS REFERENCE TO RELATED APPLICATIONS

This application is a continuation of U.S. application Ser. No. 14/023,025 filed Sep. 11, 2013, the entire disclosures of which are incorporated by reference in their entirety.

BACKGROUND

1. Field

The present application relates to semiconductor integrated circuits that implement an array for imaging cells that detect electromagnetic radiation and associated functions.

2. State of the Art

The present application builds upon technology (referred to by the Applicant as "Planar Optoelectronic Technology" or "POET") that provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798, 316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application Ser. No. 60/376,238, filed on Apr. 26, 2002; U.S. patent application Ser. No. 10/323, 390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; all of which are hereby incorporated by reference in their entireties.

With these structures, a fabrication sequence can be used to make the devices on a common substrate. In other words, n type and p type contacts, critical etches, etc. can be used to realize all of these devices simultaneously on a common substrate. The essential features of this device structure include 1) an n-type modulation doped interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure. The active device structures are preferably realized with a material system of group III-V materials (such as a GaAs/AlGaAs).

POET can be used to construct a variety of optoelectronic devices. POET can also be used to construct a variety of high performance transistor devices, such as complementary NHFET and PHFET unipolar devices as well as n-type and p-type HBT bipolar devices.

SUMMARY

A semiconductor device is provided that includes an array of imaging cells realized from a plurality of layers formed on a substrate, wherein the plurality of layers includes at least one modulation doped quantum well structure spaced from at least one quantum dot structure. Each respective imaging cell includes an imaging region spaced from a corresponding charge storage region. The at least one quantum dot structure of the imaging region generates photocurrent arising from absorption of incident electromagnetic radiation. The at least one modulation doped quantum well structure defines a buried channel for lateral transfer of the photocurrent for charge accumulation in the charge storage region and output therefrom. The at least one modulation doped quantum well structure and the at least one quantum dot structure of each imaging cell can be disposed within a resonant cavity that receives the incident electromagnetic radiation.

In one embodiment, the at least one modulation doped quantum well structure includes a first-type modulation doped quantum well structure that includes a layer of modulation doping of a first doping type offset from a quantum well by a spacer layer, and the at least one quantum dot structure comprises a first quantum dot structure offset vertically from the first-type modulation doped quantum well structure. The first quantum dot structure can be configured to generate photocurrent arising from absorption of incident electromagnetic radiation within a predetermined first wavelength band, and the first-type modulation doped quantum well structure can be configured to define a buried channel for lateral transfer of the photocurrent generated by the first quantum dot structure for charge accumulation in the corresponding charge storage region and output therefrom.

In another embodiment, the plurality of layers defines a built-in electric field that transports carriers of the photocurrent generated by the first quantum dot structure of the imaging region of the respective imaging cell to the buried channel defined by the first-type modulation doped quantum well structure for charge accumulation in the corresponding charge storage region. The imaging region of the respective imaging cell can be configured to generate a diffusion current that supplies carriers to the first quantum dot structure of the imaging region, whereby the diffusion current is less than photocurrent generated by the first quantum dot structure of the imaging region. The first quantum dot structure of the imaging region can be configured to generate photocurrent by the carriers undergoing intersubband transitions arising from the absorption of incident electromagnetic radiation within the predetermined first wavelength band.

In another embodiment, the at least one modulation doped quantum well structure includes complementary n-type and p-type modulation doped quantum well structures spaced apart from one another in a vertical dimension, wherein the n-type modulation doped quantum well structure includes a layer of n-type modulation doping offset from a quantum well by a spacer layer, and wherein the p-type modulation doped quantum well structure includes a layer of p-type modulation doping offset from a quantum well by a spacer layer. The least one quantum dot structure can include a first quantum dot structure spaced from the n-type modulation doped quantum well structure as well as a second quantum dot structure spaced from the p-type modulation doped quantum well structure. The first quantum dot structure can be configured to generate electron photocurrent arising from absorption of incident electromagnetic radiation within a predetermined first wavelength band, and the second quantum dot structure can be configured to generate hole photocurrent arising from absorption of incident electromagnetic radiation within a predetermined second wavelength band. The n-type modulation doped quantum well structure can define a first buried channel for lateral transfer of the electron photocurrent generated by the first quantum dot structure for charge accumulation and output from the respective imaging cells. The p-type modulation doped quantum well structure of each respective imaging cell can define a second buried channel for lateral transfer of the hole photocurrent generated by the second quantum dot structure for charge accumulation and output from the respective imaging cells. The first quantum dot structure can include at least one barrier layer with n-type doping, and the second quantum dot structure can include at least one barrier layer with p-type doping.

The charge storage region for each respective imaging cell can be formed by ion implants of at least one dopant species into the modulated doped quantum well structure that defines the buried channel.

The semiconductor device can include a transfer gate that covers the buried channel and that is configured to selectively control the flow of photocurrent through the buried channel to the charge storage region of each respective imaging cell. In a signal integration mode, the transfer gate can be configured to control said potential barrier to block the flow of charge that initially fills the imaging region (i.e., the imaging region dark charge) while allowing for photocurrent to flow through the buried channel to the corresponding diode region of the respective imaging cell.

In one embodiment, the imaging cell is adapted to operate in at least one of the following modes:
  i) a pixel setup mode whereby the at least one modulation doped quantum well structure of each respective imaging cell is filled with majority carriers, thereby also filling the QDs of the QD-in-QW structure(s) located near the at least one modulation doped quantum well structure of each respective imaging cell with majority carriers;
  ii) a signal integration mode whereby photocurrent generated by the at least one quantum dot structure of the imaging region for each respective imaging cell is transported laterally by the buried channel defined by the at least one modulation doped quantum well structure for charge accumulation in the corresponding charge storage region of the respective imaging cell; and
  iii) a readout mode that generates output signals corresponding to the charge accumulated in the charge storage region of each respective imaging cell in the signal integration mode.

In the readout mode, the charge accumulated in the charge storage region of each respective imaging cell can be transferred between the charge storage regions of the imaging cells as part of a CCD-type imaging array. Alternatively, in the readout mode, the charge accumulated in the charge storage region of each respective imaging cell is output to corresponding output diode region for driving output transistors of the imaging cells as part of an active-pixel-type imaging array.

Other semiconductor device imaging arrays and methods are also described and claimed.

Dual-wavelength semiconductor device imaging arrays and method are also described and claimed.

BRIEF DESCRIPTION OF THE DRAWINGS

FIGS. 2A-2B, collectively, are a chart illustrating an exemplary layer structure for realizing the integrated circuit device structure of FIG. 1.

FIG. 3B is a schematic cross-sectional view of an imaging cell of the CCD-type imaging array of FIG. 3A.

FIGS. 3C(i)-(iv) are schematic diagrams illustrating the potential of a buried-QW-channel for different parts of an imaging cell of the CCD-type imaging array of FIGS. 3A-3B for a number of operational modes; FIG. 3C(i) is a schematic cross-sectional view that shows parts of the imaging cell of the CCD-type imaging array of FIGS. 3A and 3B; FIG. 3C(ii) is a schematic diagram that illustrates the potential of the buried-QW-channel for different parts of the imaging cell of FIG. 3C(i) in a pixel setup mode of operation; FIG. 3C(iii) is a schematic diagram that illustrates the potential of the buried-QW-channel for different parts of the imaging cell of FIG. 3C(i) in a signal integration mode of operation; and FIG. 3C(iv) is a schematic diagram that illustrates the potential of the buried-QW-channel for different parts of the imaging cell of FIG. 3C(i) in a readout mode of operation.

FIGS. 5C(i)-(iv) are schematic diagrams illustrating the potential of a buried-QW-channel for different parts of an imaging cell of the active-pixel-type imaging array of FIGS. 5A-5B for a number of operational modes; FIG. 5C(i) is a schematic cross-sectional view that shows parts of the imaging cell of the active-pixel-type imaging array of FIGS. 5A and 5B; FIG. 5C(ii) is a schematic diagram that illustrates the potential of the buried-QW-channel for different parts of the imaging cell of FIG. 5C(i) in a pixel setup mode of operation; FIG. 5C(iii) is a schematic diagram that illustrates the potential of the buried-QW-channel for different parts of the imaging cell of FIG. 5C(i) in a signal integration mode of operation; and FIG. 5C(iv) is a schematic diagram that illustrates the potential of the buried-QW-channel for different parts of the imaging cell of FIG. 5C(i) in a readout mode of operation.

FIGS. 5F(i)-(iv) are schematic diagrams illustrating the potential of a buried-QW-channel for different parts of an imaging cell of the active-pixel-type imaging array of FIGS. 5D-5E for a number of operational modes; FIG. 5F(i) is a schematic cross-sectional view that shows parts of the imaging cell of the active-pixel-type imaging array of FIGS. 5C and 5D; FIG. 5F(ii) is a schematic diagram that illustrates the potential of the buried-QW-channel for different parts of the imaging cell of FIG. 5F(i) in a pixel setup mode of operation; FIG. 5F(iii) is a schematic diagram that illustrates the potential of the buried-QW-channel for different parts of the imaging cell of FIG. 5F(i) in a signal integration mode of operation; and FIG. 5F(iv) is a schematic diagram that illustrates the potential of the buried-QW-channel for different parts of the imaging cell of FIG. 5F(i) in a readout mode of operation.

FIG. 8A is a schematic top view of an illustrative embodiment of a dual-wavelength CCD-type imaging array of imaging cells realized from the integrated circuit device structures of FIGS. 1-2B.

FIGS. 8C(i)-(viii) are schematic diagrams illustrating the potential of a buried-QW-channel for different parts of an imaging cell of the dual-wavelength CCD-type imaging array of FIGS. 8A-8B for a number of operational modes; FIG. 8C(i) is a schematic cross-sectional view that shows parts of the imaging cell of the dual-wavelength CCD-type imaging array of FIGS. 8A and 8B that relate to imaging electromagnetic radiation of a first characteristic wavelength ($\lambda 1$); FIG. 8C(ii) is a schematic diagram that illustrates the potential of the buried-QW-channel for different parts of the imaging cell of FIG. 8C(i) in a pixel setup mode of operation; FIG. 8C(iii) is a schematic diagram that illustrates the potential of the buried-QW-channel for different parts of the imaging cell of FIG. 8C(i) in a signal integration mode of operation; FIG. 8C(iv) is a schematic diagram that illustrates the potential of the buried-QW-channel for different parts of the imaging cell of FIG. 8C(i) in a readout mode of operation; FIG. 8C(v) is a schematic cross-sectional view that shows other parts of the imaging cell of the dual-wavelength CCD-type imaging array of FIGS. 8A and 8B that relate to imaging electromagnetic radiation of a second characteristic wavelength ($\lambda 2$); FIG. 8C(vi) is a schematic diagram that illustrates the potential of the buried-QW-channel for different parts of the imaging cell of FIG. 8C(v) in a pixel setup mode of operation; FIG. 8C(vii) is a schematic diagram that illustrates the potential of the buried-QW-channel for different parts of the imaging cell of FIG. 8C(v) in a signal integration mode of operation; and FIG. 8C(viii) is a schematic diagram that illustrates the potential of the buried-QW-channel for different parts of the imaging cell of FIG. 8C(v) in a readout mode of operation.

FIGS. 9A and 9B are band diagrams depicting exemplary bias conditions for the p-type modulation doped quantum well structure of the imaging region of each imaging cell of the imaging array of FIGS. 8A-8B; such bias conditions can also be used for the imaging cells of the imaging array of FIGS. 10A-10B.

FIG. 10A is a schematic top view of an illustrative embodiment of a dual-wavelength active-pixel-type imaging array of imaging cells realized from the integrated circuit device structures of FIGS. 1-2B.

FIGS. 10C(i)-(viii) are schematic diagrams illustrating the potential of a buried-QW-channel for different parts of an imaging cell of the dual-wavelength active-pixel-type imaging array of FIGS. 10A-10B for a number of operational modes; FIG. 10C(i) is a schematic cross-sectional view that shows parts of the imaging cell of the dual-wavelength active-pixel-type imaging array of FIGS. 10A and 10B that relate to imaging electromagnetic radiation of a first characteristic wavelength ($\lambda 1$); FIG. 10C(ii) is a schematic diagram that illustrates the potential of the buried-QW-channel for different parts of the imaging cell of FIG. 10C(i) in a pixel setup mode of operation; FIG. 10C(iii) is a schematic diagram that illustrates the potential of the buried-QW-channel for different parts of the imaging cell of FIG. 10C(i) in a signal integration mode of operation; FIG. 10C(iv) is a schematic diagram that illustrates the potential of the buried-QW-channel for different parts of the imaging cell of FIG. 10C(i) in a readout mode of operation; FIG. 10C(v) is a schematic cross-sectional view that shows other parts of the imaging cell of the dual-wavelength active-pixel-type imaging array of FIGS. 10A and 10B that relate to imaging electromagnetic radiation of a second characteristic wavelength ($\lambda 2$); FIG. 10C(vi) is a schematic diagram that illustrates the potential of the buried-QW-channel for different parts of the imaging cell of FIG. 10C(v) in a pixel setup mode of operation; FIG. 10C(vii) is a schematic diagram that illustrates the potential of the buried-QW-channel for different parts of the imaging cell of FIG. 10C(v) in a signal integration mode of operation; and FIG. 10C(viii) is a schematic diagram that illustrates the potential of the buried-QW-channel for different parts of the imaging cell of FIG. 10C(v) in a readout mode of operation.

FIG. 12 is a schematic illustration of another exemplary integrated circuit device structure in accordance with the present application, with a thyristor imaging cell included therein.

DETAILED DESCRIPTION OF THE PREFERRED EMBODIMENTS

Figure 1:
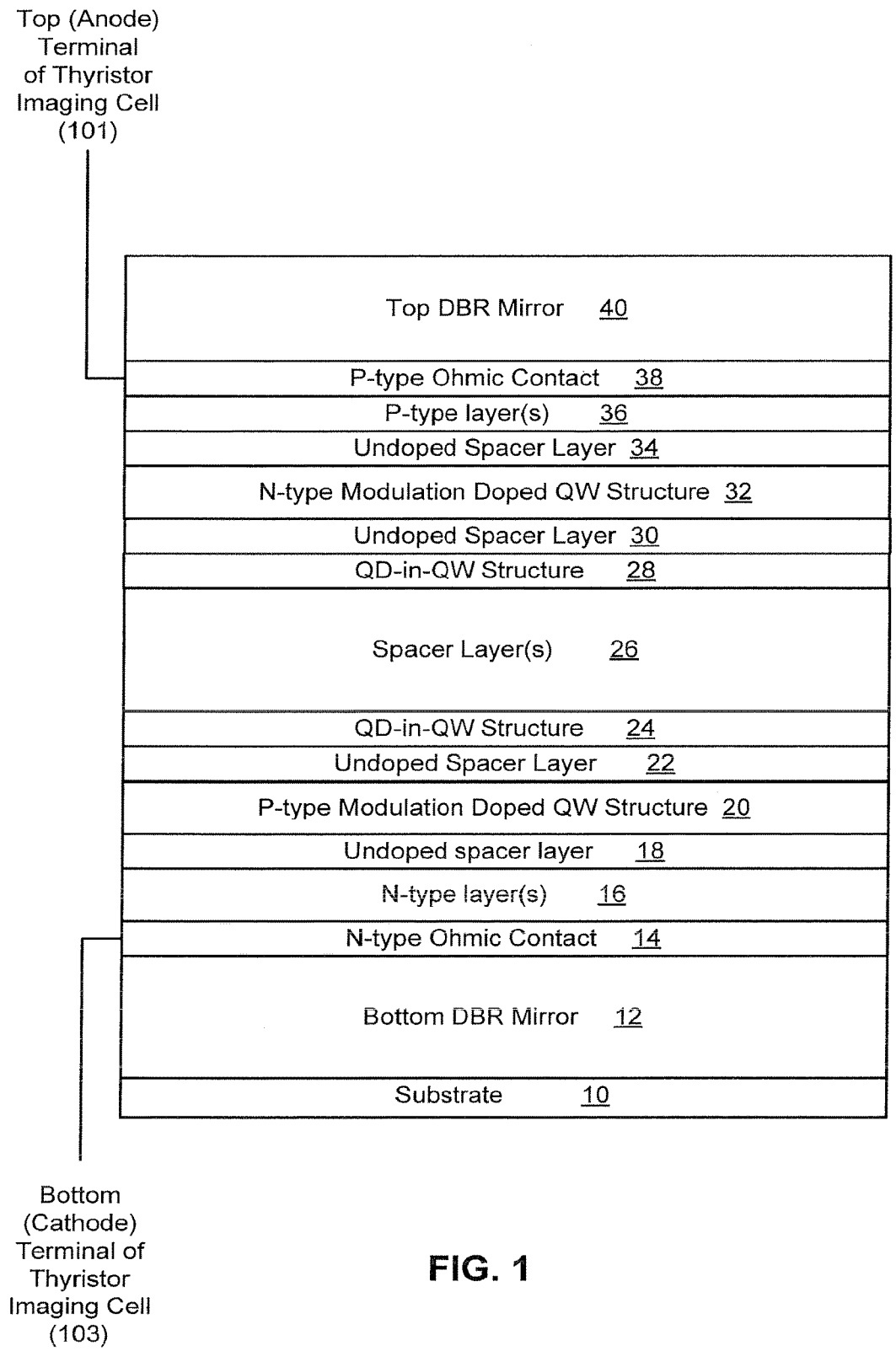
FIG. 1 is a schematic illustration of an exemplary integrated circuit device structure in accordance with the present application, with a thyristor imaging cell included therein.

Turning now to FIG. 1, the integrated circuit device structure of the present application includes a bottom dielectric distributed bragg reflector (DBR) mirror 12 formed on substrate 10. The bottom DBR mirror 12 is typically formed by depositing pairs of semiconductor or dielectric materials with different refractive indices. When two materials with different refractive indices are placed together to form a junction, electromagnetic radiation will be reflected at the junction. The amount of electromagnetic radiation reflected at one such boundary is small. However, if multiple junctions/layer pairs are stacked periodically with each layer having a quarter-wave ($\lambda/4$) thickness, the reflections from each of the boundaries will be added in phase to produce a large amount of reflected electromagnetic radiation (e.g., a large reflection coefficient) at the particular center wavelength $\lambda_D$. Deposited upon the bottom DBR mirror 12 is an active device structure that begins with n-type ohmic contact layer(s) 14 which enables the formation of ohmic contacts thereto. Deposited on layer 14 are one or more n-type layers 16 and an undoped spacer layer 18 which serve as part of the lower waveguide cladding of the device. Deposited on layer 18 is a p-type modulation doped quantum well (QW) structure 20 that defines a p-type charge sheet offset from one or more QWs (which may be formed from strained or unstrained heterojunction materials) by an undoped spacer layer. The p-type charge sheet is formed first below the undoped spacer and the one or more QWs of the p-type modulation doped QW structure 20. Deposited on the p-type modulation doped QW structure 20 is an undoped spacer layer 22 followed by the QD-In-QW structure 24 (which includes at least one QW layer with self-assembled QDs embedded therein). The undoped spacer layer 22 provides an offset between the QW(s) of the p-type modulation doped QW structure 20 and the QD-In-QW structure 24.

Deposited on the QD-In-QW structure 24 is the spacer layer(s) 26 followed by the QD-in-QW structure 28, the undoped spacer layer 30 and the n-type modulation doped QW structure 32. The n-type modulation doped QW structure 32 defines an n-type charge sheet offset from one or more QWs by an undoped spacer layer. The n-type charge sheet is formed last above the undoped spacer and the one or more QWs of the n-type modulation doped QW structure 32. The undoped spacer layer 30 provides an offset between the QD-In-QW structure 28 and the QW(s) of the n-type modulation doped QW structure 32.

Deposited on the n-type modulation doped QW structure 32 is an undoped spacer layer 34 and one or more p-type layers 36 which can serve as part of the upper waveguide cladding of the device. Preferably, the p-type layers 36 include two sheets of planar doping of highly doped p-material separated by a lightly doped layer of p-material. These p-type layers are offset from the n-type modulation doped quantum well structure 32 by the undoped spacer material 34. In this configuration, the top charge sheet achieves low contact resistance Deposited on p-type layer(s) 36 is one or more p-type ohmic contact layer(s) 38, which enables the formation of ohmic contacts thereto.

To form a resonant cavity device for detection of electromagnetic radiation, a top DBR mirror 40 can be formed over the active device structure described above. The top DBR mirror 40 can be formed by depositing pairs of semiconductor or dielectric materials with different refractive indices. The distance between the top DBR mirror 40 and bottom DBR mirror 12 represents the length of the resonant cavity and can be set to correspond to the range of wavelength(s) that are absorbed by the imaging elements of the imaging array as described herein. This distance can take into account the penetration depth of the electromagnetic radiation into the bottom and top DBR mirror. This distance is controlled by adjusting the thickness of one or more of the layers therebetween to enable this condition. The electromagnetic radiation can enter into the resonant cavity by propagation through the top DBR mirror 40 or by propagation through the substrate 10 and bottom DBR mirror 12.

The self-assembled quantum dots (QDs) embedded within the QD-in-QW structures 24 and 28 improves the efficiency of the thyristor imaging cells of the imaging array as described herein. Specifically, the photon absorption mechanism for necessary for detection occurs more efficiently with the introduction of the quantum dots and thus increases the photocurrent produced by absorption. Furthermore, the size of the embedded QDs can be controlled to dictate the wavelength of absorption for detection.

In one embodiment, both the QD-in-QW structure 24 and the QD-in-QW structure 28 are both realized by self-assembled QDs embedded in a digitally-graded QW. The self-assembled QDs can be formed during molecular beam epitaxy growth by a self-assembly method known as the Stranski-Krastanov process. In this process, an initial layer (such as InGaAs) that is part a digitally-graded quantum well (such as a digitally graded InGaAs QW) is deposited. A compound semiconductor that is lattice mismatched relative to the initial layer and underlying layer is deposited on the initial layer (such as lattice mismatched InAs grown in an InGaAs QW initial layer above GaAs). In particular, the lattice mismatch of the compound semiconductor is such that the growth forms three dimensional islands after a deposition of a critical thickness of the compound semiconductor. The growth is continued to allow the three dimensional islands to expand to form the self-assembled QDs that have the desired characteristic dimensional range. After the self-assembled QDs are formed on the initial layer, the deposition of the digitally-graded QW material resumes such that the self-assembled QDs are covered and fully embedded within the digitally-graded QW material. To provide for a larger density of QDs, this growth sequence can be repeated multiple times (such as 5 to 8 times) with an undoped GaAs barrier layer formed between the digitally-graded QW materials to realize multilayer QD-in-QW structures.

In another embodiment, the QD-in-QW structure 24 and the QD-in-QW structure 28 can be replaced by self-assembled QDs embedded in a barrier layer (such as InGaAs or InAs QDs embedded in a GaAs barrier layer). To provide for a larger density of QDs, this growth sequence can be repeated multiple times (such as 5 to 8 times) to realize a multilayer QD structures.

In such embodiments, the undoped GaAs barrier layers of the multilayer QD structure 24 can employ delta doping of acceptors. Such acceptor doping provides holes that can move into the self-assembled QDs of the multilayer QD structure 24 under the bias conditions of the device where the multilayer QD structure 24 is part of a depletion region as described herein. Similarly, the undoped GaAs barrier layers of the multilayer QD structure 28 can employ delta doping of donors. Such donor doping provides electrons that can move into the self-assembled QDs of the multilayer QD structure 28 under the bias conditions of the device where the multilayer QD structure 28 is part of a depletion region as described herein.

The size of the QDs of the QD structures 24 and 28 dictates the wavelength of the electromagnetic radiation absorbed by the QDs and the characteristic absorption wavelengths can be different for the QD structures 24 and 28 for dual wavelength imaging applications as described below. For example, the size of the QDs in the QD-in-QW structure 24 formed above the p-type modulation doped QW structure 20 can be controlled such that the QDs have a maximal characteristic dimension in the range of 70-85 Å with an aspect ratio (i.e., height-to-base ratio) in the range of 1-3, which provides for absorption of wavelengths in the long wavelength (LW) spectrum between 8000 nm and 12000 nm. The size of the QDs in the QD-in-QW structure 28 formed below the n-type modulation doped QW structure 32 can be controlled such that the QDs have a maximal characteristic dimension of 50-70 Å with an aspect ratio (i.e., height-to-base ratio) in the range of 1-3, which provides absorption of wavelengths in the mid-wave infrared (MW) wavelength spectrum between 2000 nm and 8000 nm for use in a dual LW/MW imaging applications.

FIGS. 2A-2B illustrates an exemplary layer structure utilizing group III-V materials for realizing the multilayer structures described herein. The layer structure of FIGS. 2A-2B can be made, for example, using known molecular beam epitaxy (MBE) techniques. As shown, a semiconductor layer 1003 of AlAs and a semiconductor layer 1005 of GaAs are alternately deposited (with preferably at least seven pairs) upon a semi-insulating gallium arsenide substrate 1001 in sequence to form the bottom distributed bragg reflector (DBR) mirror. The number of AlAs layers will preferably always be one greater than the number of GaAs layers so that the first and last layers of the mirror are shown as layer 1003. In the preferred embodiment, the AlAs layers 1003 are subjected to high temperature steam oxidation during fabrication to produce the compound $Al_xO_y$ so that a mirror will be formed at the designed center wavelength. This center wavelength is selected such that all of the resonant wavelengths for the various cavities of the array will be subject to high reflectivity. Therefore the thicknesses of layers 1003 and 1005 in the mirror are chosen so that the final thickness of GaAs and $Al_xO_y$ are one quarter wavelength of the center wavelength $\lambda_D$. Alternatively the mirrors could be grown as alternating layers of one-quarter wavelength thickness of GaAs and AlAs at the designed wavelength so that the oxidation step is not used. In that case, many more pairs are required (with typical numbers such as 22 pairs) to achieve the reflectivity needed for efficient detection.

Deposited upon the last bottom mirror layer 1003 is the active device structure which begins with layer 1009 of N+ type GaAs that enables the formation of ohmic contacts thereto (for example, when contacting to the cathode terminal of the thyristor imaging cell). Layer 1009 has a typical thickness of 3000 Å and a typical n-type doping of $3.5 \times 10^{18}$ cm$^{-3}$. The N+ doped GaAs layer 1009 corresponds to the ohmic contact layer 14 of FIG. 1 as described above.

Deposited on layer 1009 is layer 1011 of n-type $Al_{x1}Ga_{(1-x1)}As$ with a typical thickness of 600-1000 Å and a typical doping of $1 \times 10^{18}$ cm$^{-3}$. The parameter x1 is preferably in the range between 70% and 80% for layer 1009. This layer can serve as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. Next are four layers (1013, 1015, 1017, 1019) of $Al_{x2}Ga_{(1-x2)}As$. These four layers collectively have a total thickness of about 230-430 Å and where x2 is about 15%. The first layer 1013 is about 60 Å thick and is doped N+ type in the form of delta doping with a typical n-type doping of $3.5 \times 10^{18}$ cm$^{-3}$. The second layer 1015 is about 100-300 Å thick and is undoped. The third layer 1017 is about 40 Å thick and is doped P+ type in the form of delta doping with a typical p-type doping of $7 \times 10^{18}$ cm$^{-3}$. The fourth layer 1019 is about 30 Å thick and is undoped to form a spacer layer. This layer forms the lower separate confinement heterostructure (SCH) layer. The n-type AlGaAs layers 1011 and 1013 correspond to the n-type layer(s) 16 of FIG. 1 as described above. The undoped AlGaAs layer 1014 corresponds to the spacer layer 18 of FIG. 1 as described above.

Next is an undoped GaAs barrier layer 1021 and a InGaAs quantum well layer 1023 for the inverted p-type modulation doped QW structure 20. Multiple quantum well structures can also possible be used if desired. The undoped GaAs barrier layer 1021 preferably is about 10 Å thick. The InGaAs quantum well layer 1023 is preferably about 60 Å thick with digital grading of In with 15-20% of In. Layers 1017 to 1023 correspond to the inverted p-type modulation doped QW structure 20 of FIG. 1 as described above.

An undoped GaAs spacer layer 1025 that is about 300-500 Å thick follows the InGaAs quantum well layer 1023. Layer 1025 corresponds to spacer layer 22 of FIG. 1 as described above.

Following the spacer layer 1025 are layers 1027 to 1033 that correspond to the QD-in QW structure 24 of FIG. 1 as described above. Layers 1027 to 1033 form QDs embedded within an InGaAs quantum well that employs digital grading of In with 15-20% In. The initial layer 1027 of the InGaAs quantum well that is deposited before the QD growth sequence (specified as 1029) is preferably about 100-120 Å thick. The growth of the self-assembled QDs of 1029 can employ delta doping of acceptors so that holes are placed in the self-assembled QDs of 1029. The layer 1031 of the InGaAs quantum well that is deposited after the QD growth sequence is also preferably about 100-120 Å thick. Layer 1031 of the InGaAs quantum well covers the self-assembled QDs such that the QDs are fully embedded within the digitally-graded QW material. An undoped GaAs barrier layer 1033 is deposited on the InGaAs quantum well layer 1031. The undoped GaAs barrier layer 1033 is preferably about 300-500 Å thick. The growth sequence of layers 1027 to 1033 can be repeated multiple times (for example, five to eight times) to provide a multilayer QD-in-QW structure. The undoped GaAs barrier layer 1033 of the multilayer QD-in-QW structure can employ delta doping of acceptors. Such acceptor doping provides holes that can move into the self-assembled QDs of the multilayer QD-in-QW structure 24 under the bias conditions of the device where the multilayer QD-in-QW structure 24 is part of a depletion region as described herein. An exemplary acceptor delta doping that can provide 1 hole per QD can be created with p dopant flux corresponding to a 5e17 cm-3 bulk doping rate, and held stationary for 10 seconds (i.e., no layer growth during the 10 second interval). Layers 1027 to 1033 correspond to the QD-in QW structure 24 of FIG. 1 as described above.

Next are two layers (1035, 1037) of $Al_{x2}Ga_{(1-x2)}As$. These two layers collectively have a total thickness of about 4000 Å and where x2 is about 15%. The first layer 1035 is about 2000 Å thick and is doped P-type with a p-type doping of $5 \times 10^{15}$ cm$^{-3}$. The second layer 1037 is about 2000 Å thick and is doped n-type with an n-type doping of $1$-$2 \times 10^{16}$ cm$^{-3}$. Layers 1035 and 1037 correspond to the spacer layer(s) 26 of FIG. 1 as described above.

Following the spacer layers 1035 and 1037 are layers 1039 to 1047. Layer 1039 is an undoped GaAs barrier layer that is preferably on the order of 300-500 Å thick. Layers 1041 to 1045 form QDs embedded within an InGaAs quantum well that employs digital grading of In with 15-20% In. The initial layer 1041 of the InGaAs quantum well that is deposited before the QD growth sequence (specified as 1043) is preferably about 100-120 Å thick. The layer 1045 of the InGaAs quantum well that is deposited after the QD growth sequence is preferably about 100-120 Å thick. Layer 1045 of the InGaAs quantum well covers the self-assembled QDs such that the QDs are fully embedded within the digitally-graded QW material. The growth sequence of layers 1039 to 1045 can be repeated multiple times (for example, five to eight times) to provide a multilayer QD-in-QW structure. The undoped GaAs barrier layer 1039 of the multilayer QD-in-QW structure 28 can employ delta doping of donors. Such donor doping provides electrons that can move into the self-assembled QDs of the multilayer QD-in-QW structure 28 under the bias conditions of the device where the multilayer QD-in-QW structure 28 is part of a depletion region as described herein. An exemplary donor delta doping that can provide 1 electron per QD dot would be created with n dopant flux corresponding to a 5e17 cm-3 bulk doping rate, and held stationary for 10 seconds (i.e., no layer growth during 10 second interval). Layers 1039 to 1047 correspond to the QD-in QW structure 28 of FIG. 1 as described above.

An undoped GaAs barrier layer 1047 is deposited on the last InGaAs quantum well layer 1045. The undoped GaAs barrier layer 1047 is preferably about 300-500 Å thick. The GaAs barrier layer 1047 corresponds to the spacer layer 30 of FIG. 1.

Next is an InGaAs quantum well layer 1049 and an undoped GaAs barrier layer 1051 for the n-type modulation doped QW structure 32. Multiple quantum well structures may also be used if desired. The InGaAs quantum well layer 1049 is preferably about 60 Å thick. The undoped GaAs barrier layer 1051 is preferably about 10 Å thick.

Next are four layers (1053, 1055, 1057, 1059) of $Al_{x2}Ga_{(1-x2)}As$. These four layers collectively have a total thickness of about 270-470 Å and where x2 is about 15%. The first layer 1053 is about 30 Å thick and is undoped to form a spacer layer. The second layer 1055 is about 80 Å thick and is doped N+ type with an n-type doping of $3 \times 10^{18}$ $cm^{-3}$. The third layer 1057 is about 100-300 Å thick and is undoped. The fourth layer 1059 is about 60 Å thick and is doped P+ type with a p-type doping of $7 \times 10^{18}$ $cm^{-3}$. The layers 1049 to 1055 corresponds to the n-type modulation doped QW structure 32 of FIG. 1 as described above. The undoped AlGaAs layer 1057 corresponds to the undoped spacer layer 34 of FIG. 1 as described above.

Next, a layer 1061 of p-type $Al_{x1}Ga_{(1-x1)}As$ is deposited. Preferably, layer 1061 has a thickness on the order of 600-1000 Å and has a P-type doping of $5 \times 10^{17}$ $cm^{-3}$. The parameter x1 of layer 1061 is preferably about 70%. Layers 1059 and 1061 correspond to the p-type layer(s) 36 of FIG. 1 as described above.

Deposited next are ohmic contact layers of GaAs (1063) and InGaAs (1065). Layer 1063 is about 500-1500 Å thick. Layer 1065 is about 30 Å thick. Both layers 1063 and 1065 are doped to a very high level of P+ type doping (about $1 \times 10^{20}$ $cm^{-3}$) to enable formation of ohmic contacts thereto. Layers 1063 and 1065 correspond to the p-type ohmic contact layer(s) 38 of FIG. 1 as described above.

The size of the embedded QDs of layers 1027-1033 and 1039-1047 contributes to the absorption wavelength of such structures. In one embodiment, the embedded QDs of layers 1027-1033 and 1039-1045 have the following characteristics:

the QDs of layers 1027-1033 can have a maximal characteristic dimension in the range of 70-85 Å with an aspect ratio (i.e., height-to-base ratio) in the range of 1-3, which provides for absorption of wavelengths in the long wavelength (LW) spectrum between 8000 nm and 12000 nm;

QDs of layers 1039-1045 can have a maximal characteristic dimension of 50-70 Å with an aspect ratio (i.e., height-to-base ratio) in the range of 1-3, which provides absorption of wavelengths in the mid-wave infrared (MW) wavelength spectrum between 2000 nm and 8000 nm.

Such QD size and aspect ratio are dictated by growth conditions, particularly the number of monolayers for three dimensional InAs QD growth. For example, 2.2 ML of three dimensional InAs QD growth can be used to from QDs having a maximal characteristic dimension of 80 Å with an aspect ratio (i.e., height-to-base ratio) near 1-3 for layers 1027-1033 (which is suitable for absorption of electromagnetic radiation with a characteristic wavelength at or near 10000 nm in the long wavelength (LW) spectrum), and 2.5 ML of three dimensional InAs QD growth can be used to form QDs having a maximal characteristic dimension of 60 Å with an aspect ratio (i.e., height-to-base ratio) near 1-3 for layers 1039-1045 (which is suitable for absorption of electromagnetic radiation with a characteristic wavelength at or near 4000 nm in the midwave-infrared wavelength (MW) spectrum). Other suitable monolayer growths can be used as well. Moreover, the thickness of the barrier layer(s) between the QD-in-QW layers can be controlled in order that the strain energy from the underlying structures have a desired influence on the larger dot size and quality.

An integrated circuit that realizes an array of thyristor imaging cells and associated signal processing circuitry (i.e., transistor circuits) can be made utilizing the layer structure of FIGS. 1 to 2B. Note that the general structure of FIGS. 1 to 2B can be configured to operate as a wide range of electronic devices (e.g., field effect transistors, bipolar transistors) such that these devices can be integrated to form a monolithic imaging array integrated circuit as described herein.

Single Wavelength CCD-type Imaging Architecture

Figure 3A:
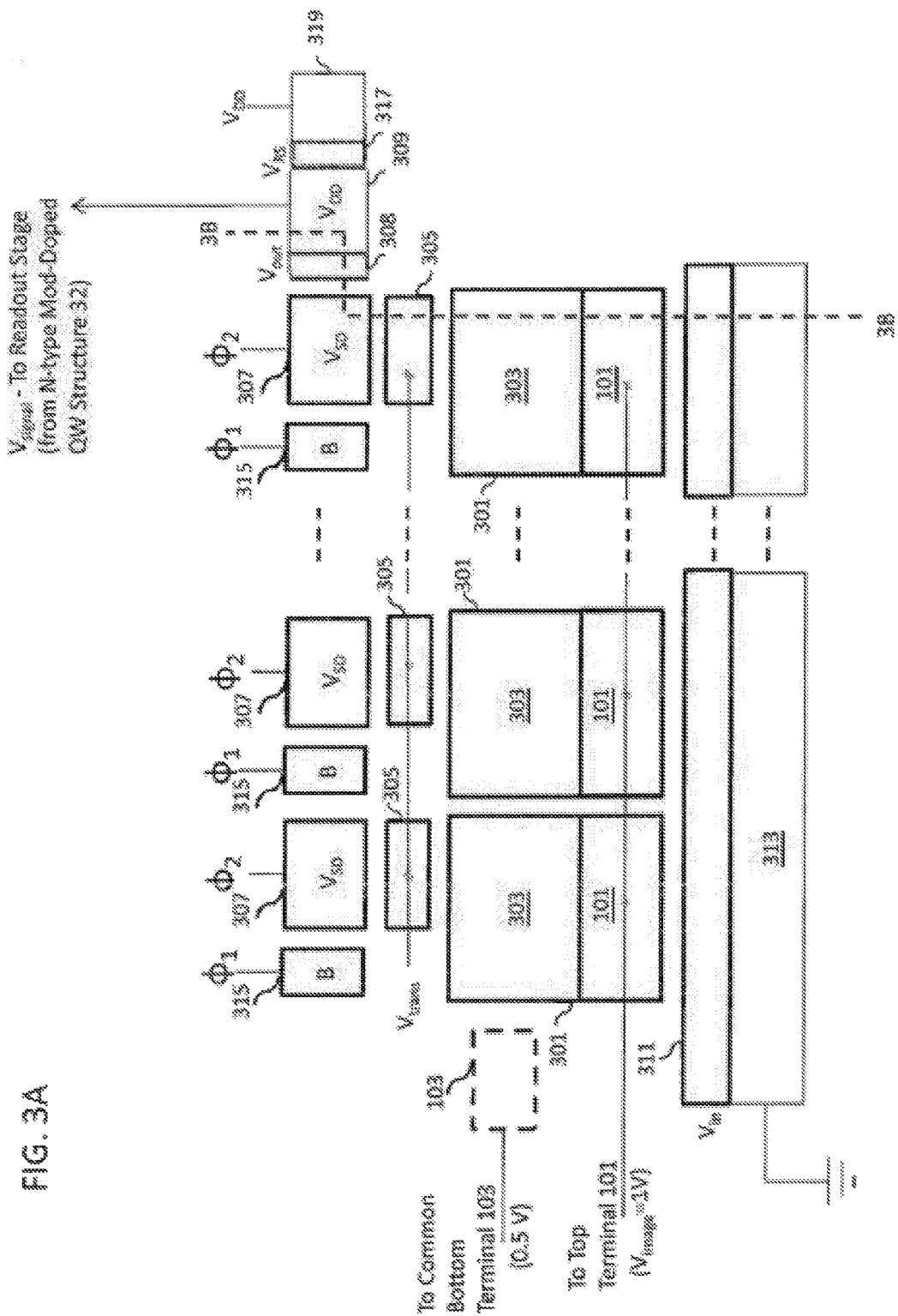
FIG. 3A is a schematic top view of an illustrative embodiment of a CCD-type imaging array of imaging cells realized from the integrated circuit device structures of FIGS. 1-2B.

The thyristor imaging cells can be part of a CCD-type imaging architecture for single wavelength imaging as shown in the illustrative embodiment of FIGS. 3A-3C(iv). In this illustrative embodiment, a linear array (row) of thyristor imaging cells is made utilizing the layer structure of FIGS. 1 to 2B. Multiple rows of thyristor imaging cells can be formed to provide a two-dimensional imaging array as desired. Each thyristor imaging cell includes an imaging region 301 defined by a mesa that includes a top (anode) terminal 101 formed adjacent the highly doped top p-type ohmic contact layer 38. A bottom (cathode) terminal 103 is operably coupled to the bottom n-type ohmic contact layer 14 that is common to the imaging cells of the array. The mesa of the imaging region 301 is defined by opposed trenches that extend downward at least to the p-type layer 36 of device structure and form sidewalls of the corresponding transfer output gate 305 and the common input gate 311. The other two sidewalls of the mesa (not shown in the cross-section of FIG. 3B) are formed by etching down past the QW channel of the p-type modulation-doped QW structure 20 for isolation between the imaging regions 301 of the row of imaging regions 301. The sidewalls of the mesa provide for lateral confinement of the electromagnetic radiation within the imaging region 301. The lateral extent of the mesa can vary by design. In one embodiment, the lateral extent of the mesa covers an area on the order of 30 μm by 1 μm. The layer structure between the top p-type ohmic contact layer 38 and the bottom n-type ohmic contact layer 14 of the mesa of the imaging region 301 defines a vertical thyristor (P-N-P-N ) structure. N-type doped regions 304 are formed at the bottom of the two trenches as shown. The doped regions 304 can be formed by ion implantation of an n-type species as desired or other suitable technique. A portion of the top surface of the mesa of each respective imaging region 301 is not covered by the top anode terminal 101 to form respective apertures 303 into the device structure of the imaging regions 301. The top DBR mirror 40 can be formed continuously across the integrated circuit structure and covers the apertures 303 as shown. The top DBR mirror 40 and the bottom DBR mirror 12 together form a resonant cavity with the device structure of the respective imaging regions 301 therebetween. For each imaging cell, incident electromagnetic radiation passes through the top DBR mirror 40 (and aperture 303) into this resonant cavity for absorption in the respective imaging region 301. During operation, the QW channel of the n-type modulation doped QW structure 32 of each respective imaging region 301 is initialized such that it is at or near ground potential and filled with majority carrier electrons, and the bias potential of the device structure is set via bias potential signals supplied to the top anode terminal 101 (e.g., $V_{image}$ of 1 volt) and to the bottom cathode terminal 103 (e.g., 0.5V) such that a positive bias potential is applied to a collector underlying the n-type modulation doped QW structure 32 with respect to the n-type modulation doped QW structure 32 of the respective imaging regions. The collector includes spacer layer 26, QD-in-QW structure 24 and the p-type modulation doped QW structure 20. These bias conditions form a depletion region that encompasses the QD-in-QW structure 28 and moves electrons from n-type delta doping of the QD-in-QW structure 28 into the QDs of the QD-in-QW structure 32 of the respective imaging regions 301. The bias conditions also introduce a relatively small electron diffusion current that flows vertically from the n-type modulation doped QW structure 32 toward the collector in the respective imaging regions 301. This diffusion current also supplies electrons to the QDs of the QD-in-QW structure 28 in the respective imaging regions 301. This electron diffusion current has a magnitude that is smaller than the expected electron photocurrent induced by absorption of electromagnetic radiation by the QDs of the QD-in-QW structure 28 in the respective imaging regions 301.

Figure 4A:
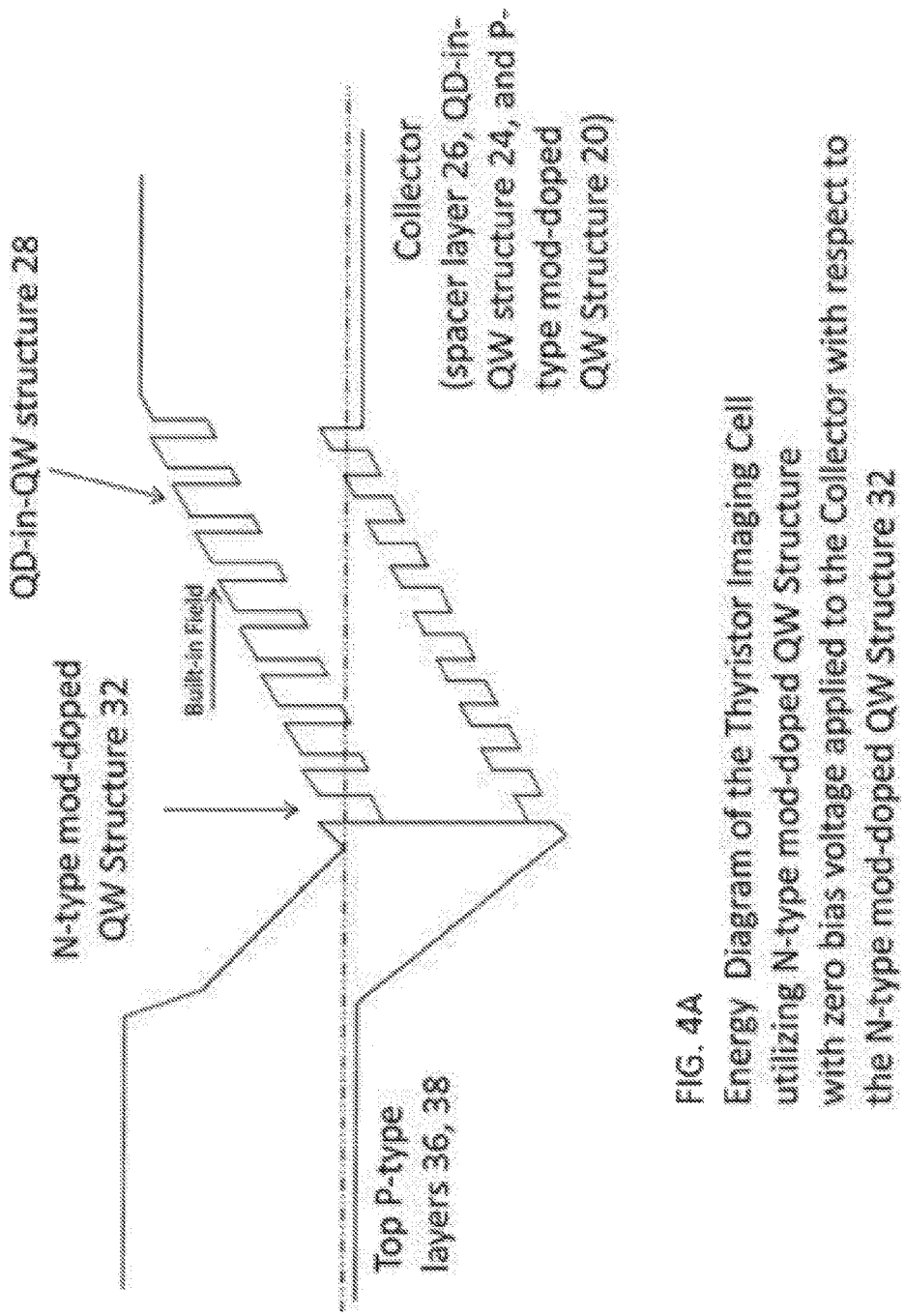
FIGS. 4A and 4B are band diagrams depicting exemplary bias conditions for the n-type modulation doped quantum well structure of the imaging region of each imaging cell of the imaging array of FIGS. 3A-3B; such bias conditions can also be used for the imaging cells of the imaging array of FIGS. 5A-5B and 5D-5E and the imaging arrays of FIGS. 8A-8B and 10A-10B.
Figure 4B:
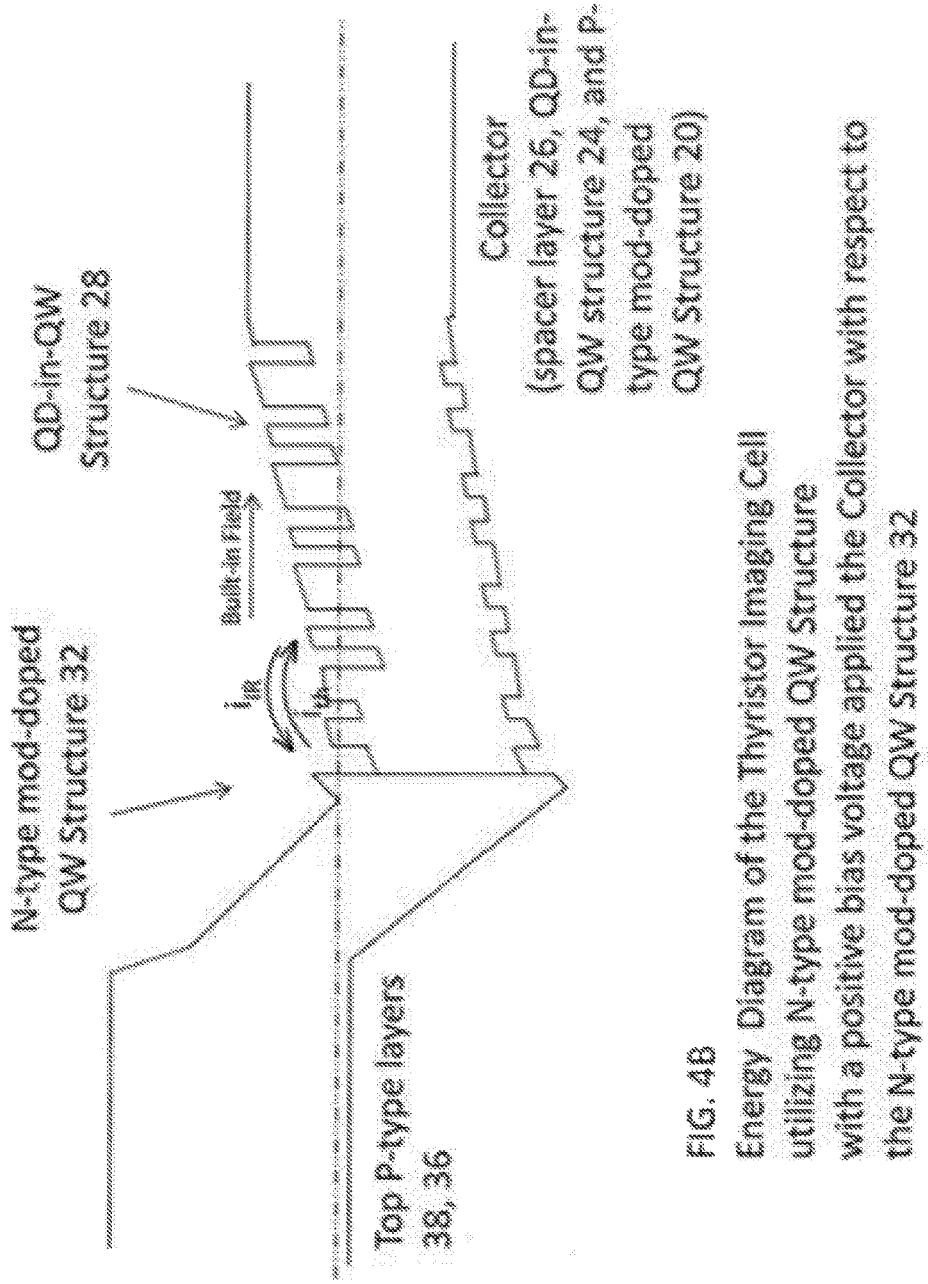

These bias conditions are shown in the energy diagrams of FIGS. 4A and 4B. FIG. 4A shows an exemplary energy diagram for a zero bias voltage between the n-type modulation doped structure 32 and the collector. FIG. 4B shows an exemplary energy diagram for a positive bias potential applied to the collector with respect to the n-type modulation doped QW structure 32. Note that under these bias conditions, the QD-in-QW structure 28 in a given imaging region 301 is in the depletion region of the collector, which is subject to a built-in electric field that moves mobile electrons toward the n-type modulation doped QW structure 32 of the imaging region 301. When electromagnetic radiation is absorbed by the QDs of the QD-in-QW structure 28 of the imaging region 301, the electrons in the QDs will receive enough energy to place them in the conduction band via intersubband transitions. Once in the conduction band, the built-in electric field moves the mobile electrons to the QW channel of the n-type modulation doped QW structure 32 of the imaging region 301. In this manner, the intersubband absorption mechanism of the QDs of the QD-in-QW structure 28 produces electron photocurrent (labeled $i_{IR}$ in FIG. 4B) that flows to the QW channel of the n-type modulation doped layer 32 under the influence of the built-in electric field of device structure. The bias conditions produce an applied electric field in an opposite sense to built-in electric field in order to provide for the desired electron diffusion current (labeled $i_{TH}$ in FIG. 4B) of majority carrier electrons from the QW channel of the n-type modulation doped QW structure 32 to the QDs of the QD-in-QW structure 28 in the imaging region 301.

The n-type modulation doped QW structure 32 provides a buried-QW-channel on one side of the respective imaging regions 301 that extends through a series of device structures for each respective imaging cell, including a transfer gate 305 and a storage diode region 307. This buried-QW-channel allows for lateral transport of electron photocurrent from the respective imaging regions 301 to respective storage diode regions 307 of the imaging cells via corresponding transfer gates 305 during signal integration as described below in more detail.

Each transfer gate 305 is realized by an undoped region disposed on one side adjacent the trench and doped region 304 and disposed on the other side adjacent the corresponding storage diode region 307. The transfer gate 305 has a sidewall that forms the trench adjacent the imaging region 301. This sidewall extends downward at least to the p-type layer 36 of device structure. The transfer gate 305 has two other sidewalls (not shown in the cross-sections of FIG. 3B) that are formed by etching down past the QW channel of the p-type modulation-doped QW structure 20 for isolation between the transfer gates 305 of the row of imaging cells. An electrode covers the top surface 38 of the transfer gate 305. The storage diode regions 307 are part of CCD shift registers as described below in more detail. The storage diode regions 307 can be formed by ion implantation of a suitable n-type species through the top surface 38 of the storage diode region 307 or other suitable techniques as desired. An electrode (Φ2) covers a portion of the top surface 38 of the storage diode region 307 as best shown in FIG. 3B.

The storage diode regions 307 are disposed adjacent corresponding barrier regions 315. The barrier regions 315 are formed in the active device structure and have a positive built-in potential relative to the n-doped storage diode regions 307 in order to provide a built-in barrier to electron charge transfer. The storage diode region 307 and barrier region 315 pairs realizes a row of charge-coupled device (CCD) registers that operate under control of a two phase clocking scheme (Φ1 and Φ2) to transfer charge (i.e., electrons) register-to-register to the last storage diode region 307 in the row. The n-type modulation doped structure 32 provides a buried-QW-channel that allows for lateral transport of charge (i.e., electrons) from register-to-register. The two phase clocking scheme operates in an analogous manner to the two phase clocking scheme described in detail in "Kodak CCD Primer, #KCP-001, CHARGE-COUPLED DEVICE (CCD) IMAGE SENSORS," downloaded from http://www.kodak.com/US/en/digital/pdf/ccdPrimerPart2.pdf. Other suitable CCD register structures and clocking schemes (such as 4-phase, 3-phase, pseudo 2-phase, true two phase and virtual phase clocking schemes) can also be employed.

An output gate 308 is disposed between the storage diode region 307 of the last CCD register of the row of imaging cells and an output storage diode 309. The output gate 308 is realized by an undoped region disposed on one side adjacent the storage diode region 307 of the last CCD register and disposed on the other side adjacent the output diode region 309 as shown in FIG. 3B. The output gate 308 has a sidewall that extends down to the output diode region 309. The output gate 308 also has other two other sidewalls (not shown in the cross-sections of FIG. 3B) that are formed by etching down past the QW channel of the p-type modulation-doped QW structure 20 for isolation purposes. An electrode covers the top surface 38 of the mesa of the output gate 308. The output diode region 309 can be formed by ion implantation of n-type species into a recess formed by etching down at least to the p-type layer 36 of device structure or other suitable techniques. The n-type modulation doped structure 32 provides a buried-QW-channel that allows for lateral transport of electron charge from the last storage diode region 307 to the output diode region 309 via the output gate 308.

As evident from FIGS. 3C(i)-3C(iv), potential signals $V_{trans}$ and Φ2 can be supplied to the electrodes of the transfer gate 305 and the storage diode region 307, respectively, in order to control (i.e., raise, lower and maintain) the potential barrier of the buried-QW-channel provided by the n-type modulation doped structure 32 between the imaging region 301 and the corresponding storage diode region 307 of each respective imaging cell and control electron current flow through this buried-QW-channel. More specifically, in the pixel setup mode of operation as shown in FIG. 3C(ii), the potential signals $V_{trans}$ and Φ2 are controlled to raise the potential barrier of the buried-QW-channel of the transfer gate 305 in order block electron current flow through this buried-QW-channel and thus isolate the imaging region 301 from the storage diode region 307. In the signal integration mode of operation as shown in FIG. 3C(iii), the potential signals $V_{trans}$ and Φ2 are controlled to lower the potential barrier of the buried-QW-channel of the transfer gate 305 in order produce a desired sub-threshold current flow through this buried-QW-channel to the storage diode region 307 for accumulation of charge arising from the electron photocurrent of the imaging region 301 in the storage diode region 307. In this configuration, the surface potential of the buried-QW-channel of the transfer gate 305 is at or near the potential of electron charge that fills the buried-QW-channel of the imaging region 301 during pixel setup mode as described below. At this level, the electron charge that initially fills the imaging region (i.e., the imaging region dark charge) is blocked from flowing through the buried-QW-channel of the transfer gate 305 while allowing for the electron photocurrent arising from absorption in the imaging region 301 to flow over this potential barrier and through the buried-QW-channel of the transfer gate 305 for accumulation in the storage diode region 307 of the imaging cell. In the readout mode of operation as shown in FIG. 3C(iv), the potential signals $V_{trans}$ and Φ2 are controlled to raise the potential barrier of the buried-QW-channel of the transfer gate 305 in order produce block reverse current flow through the buried-QW-channel back into the imaging region 301 of the imaging cell.

As evident from FIGS. 3C(i)-3C(iv), a potential signal $V_{out}$ can be supplied to the electrode of the output gate 308 to control (i.e., raise, lower and maintain) the potential barrier of the buried-QW-channel provided by the n-type modulation doped structure 32 between the last storage diode region 307 and the output diode region 309. Such control over the height of the potential barrier can be used to selectively control the conductivity of the buried-QW-channel of the output gate 308. During the pixel setup mode of operation as shown in FIG. 3C(ii) and the signal integration mode of operation as shown in FIG. 3C(iii), the potential signal $V_{out}$ can be controlled to raise the potential barrier of the buried-QW-channel of the output gate 308 in order to block electron current flow through this buried-QW-channel and thus isolate the last storage diode region 307 from the output diode region 309. During the readout mode operation as shown in FIG. 3C(iv), the potential signal $V_{out}$ can be controlled to lower the potential barrier of the buried-QW-channel of the output gate 308 in order to transfer the charge from the last storage diode region 307 to the output diode region 309 for output as a signal $V_{signal}$. The signal $V_{signal}$ represents the accumulated charge for each respective imaging cell during read-out. The signal $V_{signal}$ is supplied to read-out circuitry for signal processing as desired.

For the illustrate CCD-type imaging architecture, a reset gate 317 is disposed between the output diode region 309 and a reset diode region 319. The reset diode region 319 can be formed by ion implantation of n-type species into a recess formed by etching down at least to the p-type layer 36 of device structure or other suitable techniques. The reset gate 317 can be realized by an elongate rib-like mesa that extends between the output diode region 309 and the reset diode region 319. The reset gate 317 can have two opposed sidewalls that extend down to the output diode region 309 and to the reset diode region 319, respectively. The reset gate 317 can also have two other sidewalls that are formed by etching down past the QW channel of the p-type modulation-doped QW structure 20 for isolation purposes. An electrode covers the top surface 38 of the elongate mesa of the reset gate 317. The n-type modulation doped structure 32 provides a buried-QW-channel that allows for lateral transport of charge (i.e., electrons) through the reset gate 317 between the output diode region 309 and the reset diode region 319.

During certain operations (such as during pixel setup mode operations), the reset diode region 319 is supplied with a potential bias signal (such as a $V_{DD}$ potential) that is configured to empty the storage diode regions 307 and output diode region 309 of all electrons. A potential signal $V_{RS}$ can be supplied to the electrode of the reset gate 317 to control (i.e., raise, lower and maintain) the potential barrier of the buried-QW-channel of the reset gate 317. Such control over the height of the potential barrier can be used to selectively control the conductivity of the buried-QW-channel of the reset gate 317. During the pixel setup mode of operation, the potential signal $V_{RS}$ can be supplied to the electrode of the reset gate 317 to lower the potential barrier of the buried-QW-channel of the reset gate 317 in order to allow for electron charge transfer from the output diode region 309 to the reset diode region 319 (at $V_{DD}$ potential). The operation of the reset gate 317 can be operated in conjunction with register-to-register transfer of the CCD registers (barrier region 315/storage diode region 307 pairs) carried out under control of the two phase clocking scheme (Φ1 and Φ2) as well as in conjunction with operation of the output gate 308 in order to empty all of the storage diode regions 307 and the output diode region 309 of electrons and thus reset (i.e., clear) all of the storage diode regions 307 of the CCD register as well as the output diode region 309. During the signal integration mode of operations and the readout mode of operations, the potential signal $V_{RS}$ can be supplied to the electrode of the reset gate 317 to raise the potential barrier of the buried-QW-channel of the reset gate 317 in order to block charge transfer through this buried-QW-channel and thus isolate the output diode region 309 from the reset diode region 319.

For the illustrate CCD-type imaging architecture, a common input gate 311 is disposed between an input diode region 313 and the imaging regions 301 of the row of imaging cells. The input diode region 313 is realized by an elongate n-type doped region that extends parallel to the respective imaging regions 301 of the row of imaging cells. The input diode region 313 is supplied with a predetermined potential (e.g., ground potential) that is configured to populate the QW channel of the n-type modulation doped structure 32 of the imaging regions 301 of the imaging cells with electrons. The input diode region 313 can be formed by ion implantation of n-type species into a recess formed by etching down at least to the p-type layer 36 of device structure or other suitable techniques. The input gate 311 is realized by an elongate rib-like mesa that extends between the input diode region 313 and the respective imaging regions 301 of the row of imaging cells as evident from the cross-section of FIG. 3B. The input gate 311 has two opposed sidewalls that extend down to the input diode region 313 on one side and to the trench with doped region 304 adjacent the imaging regions 301 on the other side. The input gate 311 can also have two other sidewalls that are formed by etching down past the QW channel of the p-type modulation-doped QW structure 20 for isolation purposes. An electrode covers the top surface 38 of the elongate mesa of the input gate 311. The n-type modulation doped structure 32 provides a buried-QW-channel that allows for lateral transport of charge (i.e., electrons) through the input gate 311 between the input diode region 313 and the imaging regions 301 of the row of imaging cells.

As evident from FIGS. 3C(i)-3C(iv), a potential signal $V_{in}$ can be supplied to the electrode of the input gate 311 to control (i.e., raise, lower and maintain) the potential barrier of the buried-QW-channel of the input gate 311 between the input diode region 313 and the respective imaging regions 301 of the imaging cells. Such control over the height of the potential barrier can be used to selectively control the conductivity of the buried-QW-channel of the input gate 311. During pixel setup mode operations as shown in FIG. 3C(ii), the potential signal $V_{in}$ can be controlled to lower the potential barrier of the buried-QW-channel of the input gate 311 in order to allow for electron charge transfer from the input diode region 313 (at ground potential) to the imaging regions 301. This brings the potential of the buried-QW-channel of the n-type modulation-doped QW structure 32 of imaging regions 301 of the imaging cells to the predetermined potential (e.g., ground potential) of the input diode region 313 that populates the QW channel of the n-type modulation doped structure 32 of the imaging regions 301 of the imaging cells with electrons. During the signal integration mode of operation as shown in FIG. 3C(iii) and during the readout mode operations as shown in FIG. 3C(iv), the potential signal $V_{in}$ is controlled to raise the potential barrier of the buried-QW-channel of the input gate 311 in order to block electron charge transfer through this buried-QW-channel and thus isolate the input diode region 313 from the imaging regions 301.

Figure 6:
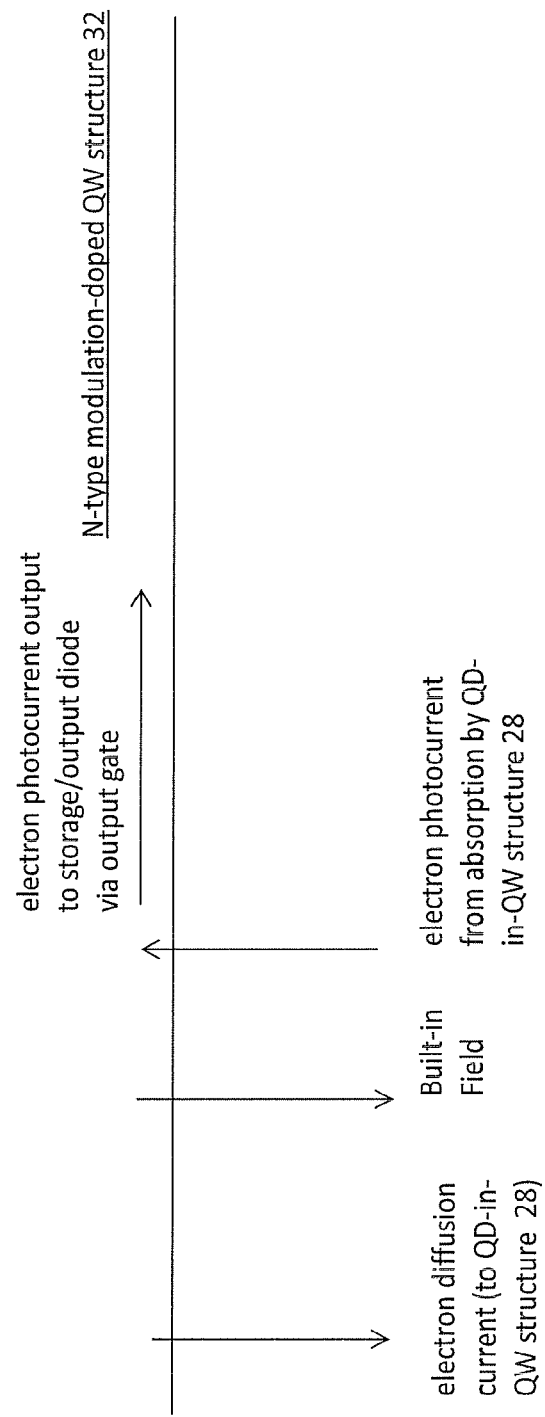
FIG. 6 is a schematic illustration of the electron currents that flow into and through the buried-QW-channel of the n-type modulation doped QW structure of the imaging cell for the CCD-type imaging array of FIGS. 3A-3B as well for the active-pixel-type imaging arrays of FIGS. 5A-5B and 5C-5D.
Figure 7:
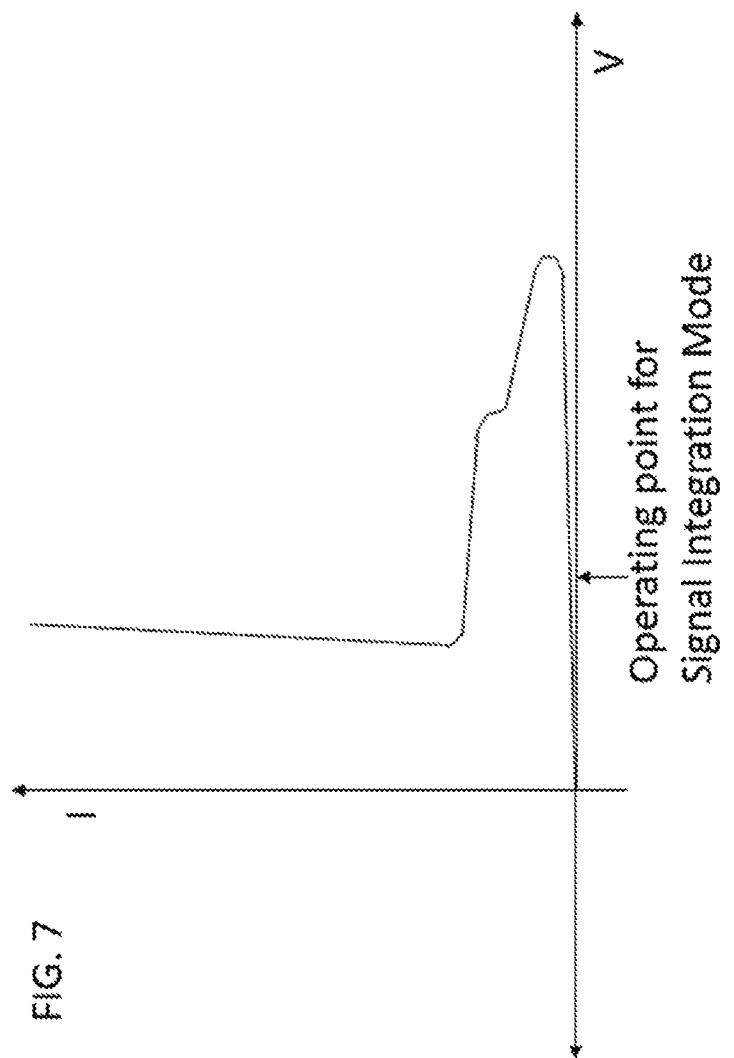
FIG. 7 is an current-voltage curve illustrating the operating point of thyristor action of the imaging region of each imaging cell for the CCD-type imaging array of FIGS. 3A-3B as well for the active-pixel-type imaging arrays of FIGS. 5A-5B and 5C-5D; the same operating point can be used for the thyristor action of the imaging region of each imaging cell for the dual-wavelength CCD-type imaging array of FIGS. 8A-8B and for the dual-wavelength active-pixel-type imaging array of FIG. 10A-10B.

FIG. 6 summarizes the current flow of the thyristor imaging cell during the signal integration mode operations for illustrate CCD-type imaging architecture of the embodiment of FIGS. 3A-3C(iv). Note that the device structure is preferably subject to bias conditions where the thyristor action of the imaging regions 301 is OFF (a non-conducting state) as shown in the IV curve of FIG. 7. These bias conditions form a depletion region that encompasses the QD-in-QW structure 28 of the respective imaging regions 301 and moves electrons from the n-type delta doping of the QD-in-QW structure 28 into the QDs of the QD-in-QW structure 28 of the respective imaging regions 301. These bias conditions also introduce a relatively small electron diffusion current from the n-type modulation doped QW structure 28 into the QDs of the QD-in-QW structure 28 of the respective imaging regions 301. In this manner, electrons are supplied to the QDs of the QD-in-QW structure 28 of the respective imaging regions 301. Moreover, the QDs of the QD-in-QW structure 28 are subject to a built-in electric field that moves mobile electrons toward the n-type modulation doped QW structure 28 of the respective imaging regions 301. When electromagnetic radiation is absorbed by the QDs of the QD-in-QW structure 28 of the respective imaging regions 301, the electrons in the QDs will receive enough energy to place them in the conduction band via intersubband transitions. Once in the conduction band, the built-in electric field moves the mobile electrons to the QW channel of the n-type modulation doped QW structure 32 of the respective imaging regions 301. In this manner, the inter-subband absorption mechanism of the QDs of the QD-in-QW structure 28 produces electron photocurrent that flows to the QW channel of the n-type modulation doped QW structure 32 under the influence of the built-in electric field of device structure. The n-type modulation doped QW structure 32 provides a buried-QW-channel that allows for lateral transport of electron photocurrent from the respective imaging regions 301 to respective storage diode regions 307 of the row of the imaging cells. The electron charge resulting from such photocurrent accumulates in respective storage diode regions 307 of the imaging cells over the time period of the signal integration mode. The amount of accumulated charge for the imaging cell is proportional to the power of the incident electromagnetic radiation at the characteristic wavelength absorbed by the QDs of the QD-in-QW structure 28 that is received at the imaging cell during the signal integration period.

The imaging cells of the illustrative CCD-type imaging architecture preferably operate over successive imaging cycles that include the three distinct modes as described above: a pixel setup mode; a signal integration mode; and a readout mode.

Single Wavelength Imaging Employing CCD-type Imaging Architecture—Pixel Setup Mode of Operation During the pixel setup mode of operation, the potential $V_{trans}$ of the transfer gate 305 is controlled to block electron charge transfer through the buried-QW-channel of the transfer gate 305 and thus isolate the imaging region 301 from corresponding storage diode regions 307 of the imaging cells.

The potential $V_{IN}$ of the input gate 311 is then controlled to lower the potential barrier of the input gate 311. This brings the potential of the buried-QW-channel of the imaging regions 301 of the imaging cells to the predetermined potential (e.g., ground potential) of the input diode region 313 that populates the QW channel of the n-type modulation doped structure 32 of the imaging regions 301 of the imaging cells with electrons. After allowing for such electron population to complete, the potential $V_{IN}$ of the input gate 311 is then controlled to raise the potential barrier in order to block electron charge transfer through the buried-QW-channel of the input gate 311 and thus isolate the input diode region 313 from the imaging regions 301 of the imaging cells.

The potential $V_{RS}$ of the reset gate 317 is controlled to lower the potential barrier of the reset gate 317 in order to allow for electron charge transfer from the output diode region 309 to the reset diode region 319 (at $V_{DD}$ potential). The operation of the reset gate 317 can be operated in conjunction with register-to-register transfer of the CCD registers (barrier region 315/storage diode region 307 pairs) carried out under control of the two phase clocking scheme ($\Phi 1$ and $\Phi 2$) as well as in conjunction with operation of the output gate 308 in order to empty all of the storage diode regions 307 and the output diode region 309 of electrons and thus reset (i.e., clear) all of the storage diode regions 307 of the CCD register as well as the output diode region 309. After the reset operations are complete, the potential $V_{RS}$ of the reset gate 317 is then controlled to raise the potential barrier and isolate the reset diode region 319.

Single Wavelength Imaging Employing CCD-type Imaging Architecture—Signal Integration Mode of Operation In the signal integration mode of operation, the potential $V_{IN}$ of the input gate 311 remains at the level that blocks electron charge transfer through the buried-QW-channel of the input gate 311 and thus isolates the input diode region 313 from the imaging regions 301 of the imaging cells.

Moreover, the potential signals $V_{trans}$ and $\Phi 2$ of the transfer gates 305 and the storage diode regions 307, respectively, are controlled to lower the potential barrier of the buried-QW-channel of the transfer gates 305 in order produce a desired subthreshold current flow through this buried-QW-channel to the respective storage diode regions 307. The electron photocurrent that results from absorption in the QDs of the QD-in-QW structure 28 of the imaging cells flows through the buried-QW-channels and accumulates in the respective storage diode regions 307. The amount of accumulated charge in each respective storage diode region 307 is proportional to the power of the incident electromagnetic radiation at the characteristic absorption wavelength of the QDs of the of the QD-in-QW structure 28 that is received at the imaging cell during the signal integration period.

Single Wavelength Imaging Employing CCD-type Imaging Architecture—Readout Mode of Operation During the readout mode of operation, the potential signal $V_{trans}$ of the transfer gate 305 is controlled to raise the potential barrier of the buried-QW-channel of the transfer gate 305 in order to block electron charge transfer through the buried-QW-channel of the input gate transfer gate and thus isolate the imaging regions 301 from the storage diode regions 307 of the imaging cells. Moreover, register-to-register transfer of the CCD registers (barrier region 315/storage diode region 307 pairs) is carried out under control of the two phase clocking scheme ($\Phi 1$ and $\Phi 2$) in order to transfer the accumulated charge (i.e., electrons) between the storage diode regions 307 to the last storage diode region 307 of the CCD registers of the row while controlling the potential of the output gate 308 to transfer the charge from the last storage region 307 to the output diode region 309 for output as a signal $V_{signal}$. The signal $V_{signal}$ which represents the accumulated charge for each respective imaging cell during readout and is proportional to the power of the incident electromagnetic radiation at the characteristic absorption wavelength of the QDs of the of the QD-in-QW structure 28 that is received at the imaging cell during the signal integration period. The signal $V_{signal}$ is supplied to read-out circuitry for signal processing as desired.

Single Wavelength Active-Pixel-type Imaging Architectures

Figure 5A:
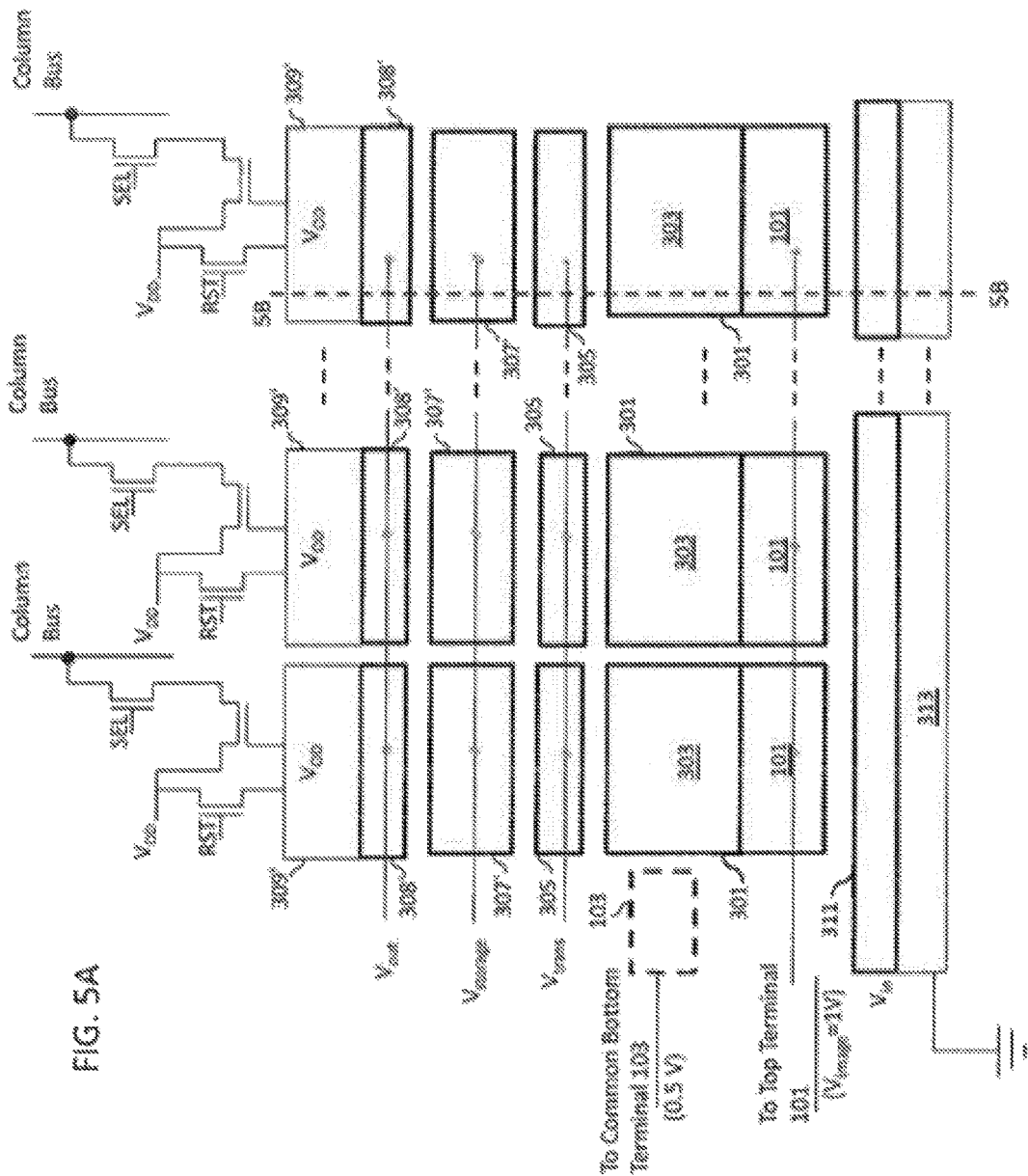
FIG. 5A is a schematic top view of an illustrative embodiment of an active-pixel-type imaging array of imaging cells realized from the integrated circuit device structures of FIGS. 1-2B.
Figure 5B:
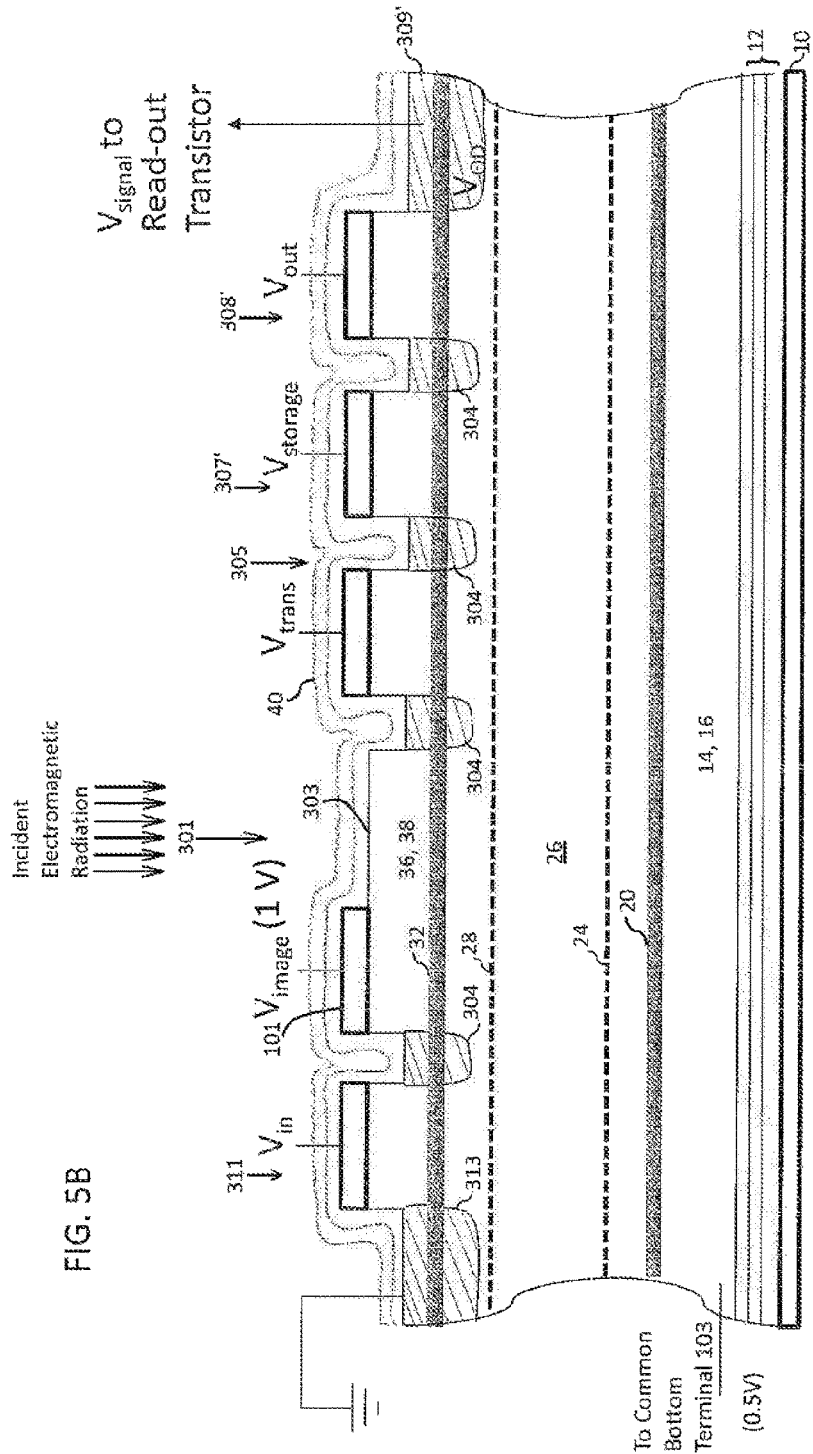
FIG. 5B is a schematic cross-sectional view of an imaging cell of the active-pixel-type imaging array of FIG. 5A.

The thyristor imaging cells can also be part of an active-pixel-type imaging architecture as shown in the illustrative embodiment of FIGS. 5A-5C(iv). In this illustrative embodiment, a linear array (row) of thyristor imaging cells is made utilizing the layer structure of FIGS. 1 to 2B. Multiple rows of thyristor imaging cells can be formed to provide a two-dimensional imaging array as desired. Each thyristor imaging cell includes an imaging region 301 defined by a mesa that includes a top (anode) terminal 101 formed adjacent the highly doped top p-type ohmic contact layer 38. A bottom (cathode) terminal 103 is operably coupled to the bottom n-type ohmic contact layer 14 that is common to the imaging cells of the array. The mesa of the imaging region 301 is defined by opposed trenches that extend downward at least to the p-type layer 36 of device structure and form sidewalls of the corresponding transfer output gate 305 and the common input gate 311. The other two sidewalls of the mesa (not shown in the cross-sections of FIGS. 3B and 5B) are formed by etching down past the QW channel of the p-type modulation-doped QW structure 20 for isolation between the imaging regions 301 of the row of imaging regions 301. The sidewalls of the mesa provide for lateral confinement of the electromagnetic radiation within the imaging region 301. The lateral extent of the mesa can vary by design. In one embodiment, the lateral extent of the mesa covers an area on the order of 30 µm by 1 µm. The layer structure between the top p-type ohmic contact layer 38 and the bottom n-type ohmic contact layer 14 of the mesa of the imaging region 301 defines a vertical thyristor (P-N-P-N) structure. N-type doped regions 304 are formed at the bottom of the two trenches as shown. The doped regions 304 can be formed by ion implantation of an n-type species as desired or other suitable technique. A portion of the top surface of the mesa of each respective imaging region 301 is not covered by the top anode terminal 101 to form respective apertures 303 into the device structure of the imaging regions 301. The top DBR mirror 40 can be formed continuously across the integrated circuit structure and covers the apertures 303 as shown. The top DBR mirror 40 and the bottom DBR mirror 12 together form a resonant cavity with the device structure of the respective imaging regions 301 therebetween. For each imaging cell, incident electromagnetic radiation passes through the top DBR mirror 40 (and aperture 303) into this resonant cavity for absorption in the respective imaging region 301. During operation, the QW channel of the n-type modulation doped QW structure 32 of each respective imaging region 301 is initialized such that it is at or near ground potential and filled with majority carrier electrons, and the bias potential of the device structure is set via bias potential signals supplied to the top anode terminal 101 (e.g., $V_{image}$ of 1 volt) and to the bottom cathode terminal 103 (e.g., 0.5V) such that a positive bias potential is applied to a collector underlying the n-type modulation doped QW structure 32 with respect to the n-type modulation doped QW structure 32 of the respective imaging regions. The collector includes spacer layer 26, QD-in-QW structure 24 and the p-type modulation doped QW structure 20. These bias conditions form a depletion region that encompasses the QD-in-QW structure 28 and moves electrons from n-type delta doping of the QD-in-QW structure 28 into the QDs of the QD-in-QW structure 32 of the respective imaging regions 301. The bias conditions also introduce a relatively small electron diffusion current that flows vertically from the n-type modulation doped QW structure 32 toward the collector in the respective imaging regions 301. This diffusion current also supplies electrons to the QDs of the QD-in-QW structure 28 in the respective imaging regions 301. This electron diffusion current has a magnitude that is smaller than the expected electron photocurrent induced by absorption of electromagnetic radiation by the QDs of the QD-in-QW structure 28 in the respective imaging regions 301. These bias conditions are described above with respect to the energy diagrams of FIGS. 4A and 4B.

The n-type modulation doped QW structure 32 provides a buried-QW-channel on one side of the respective imaging regions 301 that extends through a series of device structures for each respective imaging cell, including a transfer gate 305, a storage diode region 307', an output gate 308' and an output diode region 309'. This buried-QW-channel allows for lateral transport of electron photocurrent from the respective imaging regions 301 to respective storage diode regions 307' of the imaging cells via corresponding transfer gates 305 during signal integration as well as lateral transport of accumulated electron charge from the respective storage diode regions 307' to the output diode regions 309' during readout operations as described below in more detail.

The transfer gate 305, the storage diode region 307' and the output gate 308' are realized by mesas with trenches and doped regions 304 therebetween. The sidewalls of the trenches extend downward at least to the p-type layer 36 of device structure as best shown in FIG. 5B. The mesas of the transfer gate 305, the storage diode region 307' and the output gate 308' also have opposed sidewalls (not shown in the cross-section of FIG. 5B) that are formed by etching down past the QW channel of the p-type modulation-doped QW structure 20 for isolation between the transfer gates 305 of the row of imaging cells. An electrode ($V_{trans}$) covers the top surface 38 of the mesa of the transfer gate 305, an electrode ($\Phi 2$) covers the top surface 38 of the mesa of the storage diode region 307', and an electrode ($V_{out}$) covers the top surface 38 of the mesa of the storage output gate 308' as best shown in FIG. 5B. The output diode region 309' can be formed by ion implantation of n-type species into a recess formed by etching down at least to the p-type layer 36 of device structure or other suitable techniques.

As evident from FIGS. 5C(i)-5C(iv), potential signals $V_{trans}$ and $V_{storage}$ can be supplied to the electrodes of the transfer gate 305 and the storage diode region 307', respectively, in order to control (i.e., raise, lower and maintain) the potential barrier of the buried-QW-channel provided by the n-type modulation doped structure 32 between the imaging region 301 and the corresponding storage diode region 307' of each respective imaging cell and control electron current flow through this buried-QW-channel. More specifically, in the pixel setup mode of operation as shown in FIG. 5C(ii), the potential signals $V_{trans}$ and $V_{storage}$ are controlled to raise the potential barrier of the buried-QW-channel of the transfer gate 305 in order block electron current flow through this buried-QW-channel and thus isolate the imaging region 301 from the storage diode region 307'. In the signal integration mode of operation as shown in FIG. 5C(iii), the potential signals $V_{trans}$ and $V_{storage}$ are controlled to lower the potential barrier of the buried-QW-channel of the transfer gate 305 in order produce a desired sub-threshold current flow through this buried-QW-channel to the storage diode region 307' for accumulation of charge arising from the electron photocurrent of the imaging region 301 in the storage diode region 307'. In this configuration, the surface potential of the buried-QW-channel of the transfer gate 305 is at or near the potential of electron charge that fills the buried-QW-channel of the imaging region 301 during pixel setup mode as described below. At this level, the electron charge that initially fills the imaging region (i.e., the imaging region dark charge) is blocked from flowing through the buried-QW-channel of the transfer gate 305 while allowing for the electron photocurrent arising from absorption in the imaging region 301 to flow over this potential barrier and through the buried-QW-channel of the transfer gate 305 for accumulation in the storage diode region 307' of the imaging cell. In the readout mode of operation as shown in FIG. 5C(iv), the potential signals $V_{trans}$ and $V_{storage}$ are controlled to raise the potential barrier of the buried-QW-channel of the transfer gate 305 in order produce block reverse current flow through the buried-QW-channel back into the imaging region 301 of the imaging cell.

Figure 5D:
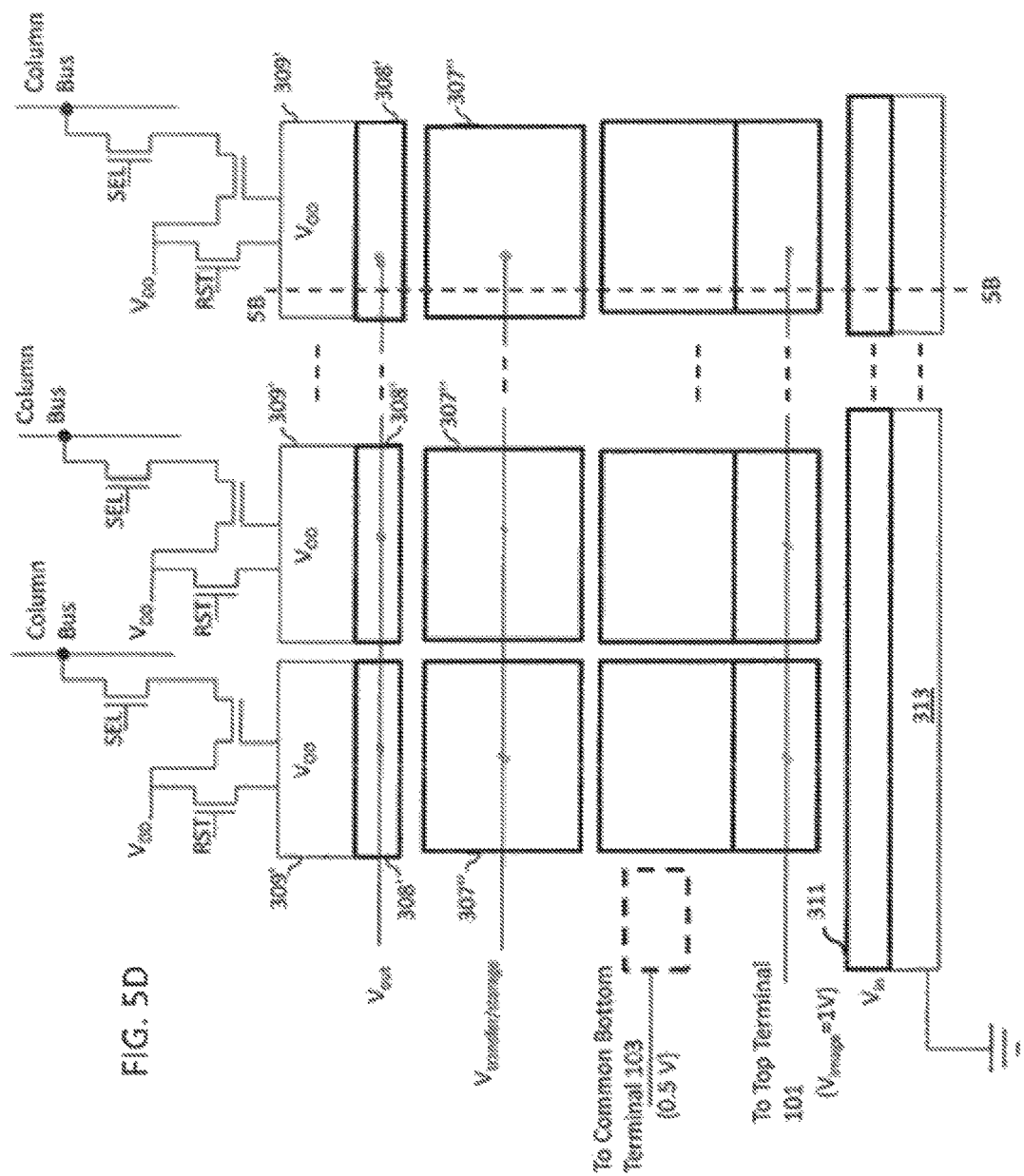
FIG. 5D is a schematic top view of an alternative embodiment of an active-pixel-type imaging array of imaging cells realized from the integrated circuit device structures of FIGS. 1-2B.
Figure 5E:
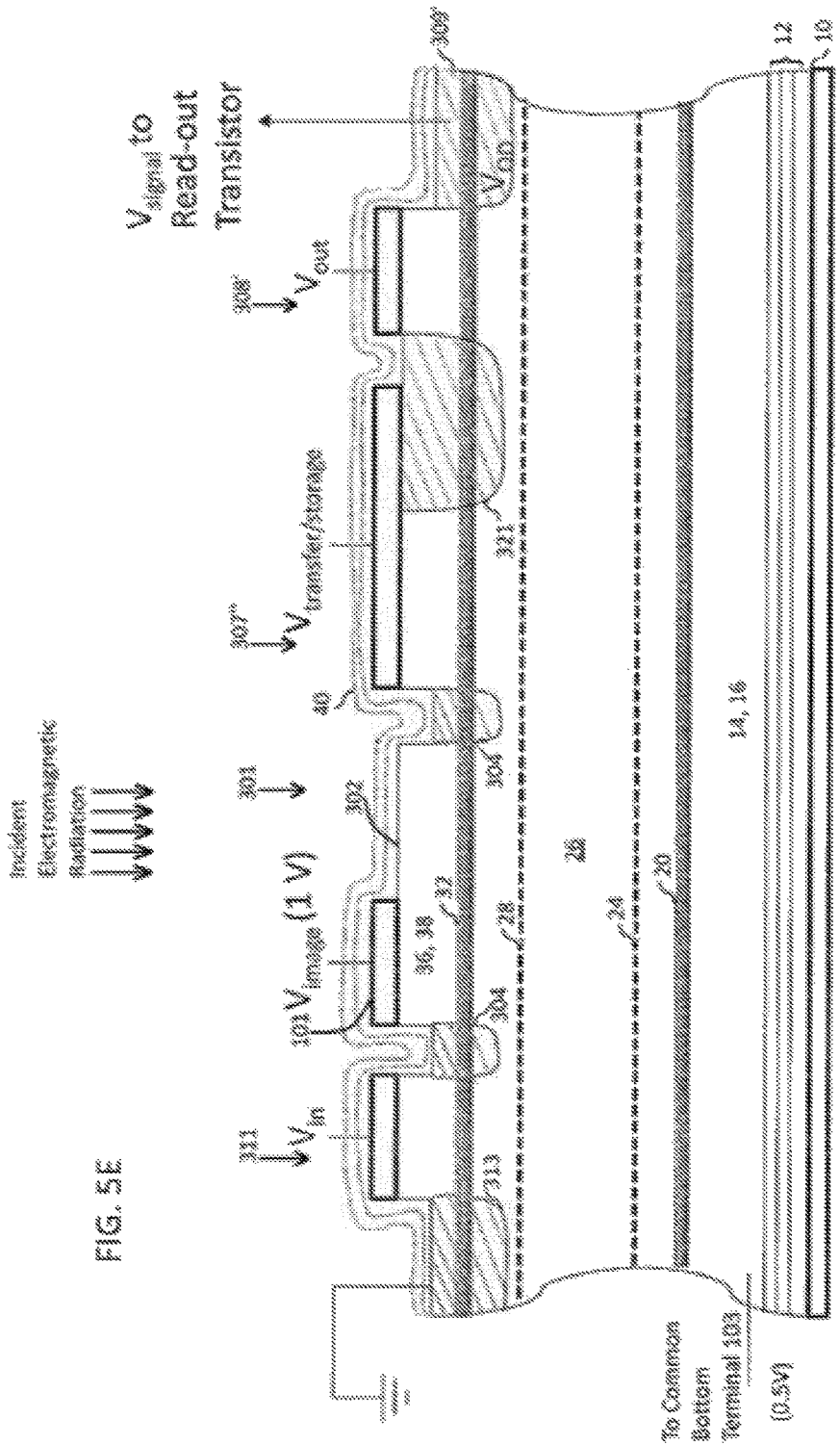
FIG. 5E is a schematic cross-sectional view of an imaging cell of the active-pixel-type imaging array of FIG. 5D.

FIGS. 5D-5F(iv) illustrates an alternate embodiment employing and active-pixel type imaging architecture wherein the function of the transfer gate and charge storage region of the embodiment of FIGS. 5A-5C(iv) are combined in a transfer and storage gate 307". In this configuration, an undoped barrier region 320 and doped charge storage region 321 are disposed adjacent one another under a common electrode ($V_{transfer/storage}$) with the undoped barrier region 320 located between the imaging region 301 and the doped charge storage region 321. The n-type modulation doped structure 32 provides a buried-QW-channel that allows for lateral transport of electron photocurrent from the respective imaging region 301 to the doped charge storage region 321 of the imaging cell. The storage diode region 321 can be realized by an n-type doped region that is configured as a potential well that accumulates charge (i.e., electrons) arising from the electron photocurrent produced in the corresponding imaging region 301 during imaging operations. The undoped barrier region 320 has a positive built-in potential relative to the n-doped charge storage regions 321 in order to provide a built-in barrier to electron current flow. An electrode ($V_{transfer/storage}$) covers the top surface 38 of the transfer and storage gate 307" as best shown in 5E.

As evident from FIGS. 5F(i)-5F(iv), a potential signal $V_{transfer/storage}$ can be supplied to the electrode of the transfer and storage gate 307" in order to control (i.e., raise, lower and maintain) the potential barrier of the buried-QW-channel provided by the n-type modulation doped structure 32 between the imaging region 301 and the corresponding storage diode region 321 of the respective thyristor imaging cell and control electron current flow through this buried-QW-channel. More specifically, in the pixel setup mode of operation as shown in FIG. 5F(ii), the potential signal $V_{transfer/storage}$ is controlled to raise the potential barrier of the buried-QW-channel of the transfer and storage gate 307" in order to block electron current flow through this buried-QW-channel and thus isolate the imaging region 301 from the storage diode region 321. In the signal integration mode of operation as shown in FIG. 5F(iii), the potential signal $V_{transfer/storage}$ is controlled to lower the potential barrier of the buried-QW-channel of the transfer and storage gate 307" in order to produce a desired subthreshold current flow through this buried-QW-channel to the respective charge storage region 321 for accumulation of charge arising from the electron photocurrent of the imaging region 301 in the charge storage region 321. In this configuration, the surface potential of the buried-QW-channel of the undoped barrier region 320 is at or near the potential of electron charge that fills the QW of the n-type modulation doped QW structure 32 of the imaging region 301 during pixel setup mode as described below. At this level, the electron charge that initially fills the imaging region (i.e., the imaging region dark charge) is blocked from flowing through the buried-QW-channel of the transfer and storage gate 307" while allowing for the electron photocurrent arising from absorption in the imaging region 301 to flow over this potential barrier and through the buried-QW-channel of the transfer and storage gate 307" for accumulation in the storage diode region 321 of the imaging cell. In the readout mode of operation as shown in FIG. 5C(iv), the potential barrier provided by the undoped barrier region 320 blocks reverse current flow through the buried-QW-channel of the transfer and storage gate 307" back into the imaging region 301 of the imaging cell.

In both embodiments, a common input gate 311 is disposed between an input diode region 313 and the imaging regions 301 of the row of imaging cells. The input diode region 313 is realized by an elongate n-type doped region that extends parallel to the respective imaging regions 301 of the row of imaging cells. The input diode region 313 is supplied with a predetermined potential (e.g., ground potential) that is configured to populate the QW channel of the n-type modulation doped structure 32 of the imaging regions 301 of the imaging cells with electrons. The input diode region 313 can be formed by ion implantation of n-type species into a recess formed by etching down at least to the p-type layer 36 of device structure or other suitable techniques. The input gate 311 is realized by an elongate rib-like mesa that extends between the input diode region 313 and the respective imaging regions 301 of the row of imaging cells as evident from the cross-section of FIG. 3B. The input gate 311 has two opposed sidewalls that extend down to the input diode region 313 on one side and to the trench with doped region 304 adjacent the imaging regions 301 on the other side. The input gate 311 can also have two other sidewalls that are formed by etching down past the QW channel of the p-type modulation-doped QW structure 20 for isolation purposes. An electrode covers the top surface 38 of the elongate mesa of the input gate 311. The n-type modulation doped structure 32 provides a buried-QW-channel that allows for lateral transport of charge (i.e., electrons) through the input gate 311 between the input diode region 313 and the imaging regions 301 of the row of imaging cells.

As evident from FIGS. 5C(i)-5C(iv) and 5F(i)-5F(iv), a potential signal $V_{in}$ can be supplied to the electrode of the input gate 311 to control (i.e., raise, lower and maintain) the potential barrier of the buried-QW-channel of the input gate 311 between the input diode region 313 and the respective imaging regions 301 of the imaging cells. Such control over the height of the potential barrier can be used to selectively control the conductivity of the buried-QW-channel of the input gate 311. During pixel setup mode operations as shown in FIGS. 5C(ii) and 5F(ii), the potential signal $V_{in}$ can be controlled to lower the potential barrier of the buried-QW-channel of the input gate 311 in order to allow for electron charge transfer from the input diode region 313 (at ground potential) to the imaging regions 301. This brings the potential of the buried-QW-channel of the n-type modulation-doped QW structure 32 of imaging regions 301 of the imaging cells to the predetermined potential (e.g., ground potential) of the input diode region 313 that populates the QW channel of the n-type modulation doped structure 32 of the imaging regions 301 of the imaging cells with electrons. During the signal integration mode of operation as shown in FIGS. 5C(iii) and 5F(iii) and during the readout mode operations as shown in FIGS. 5C(iv) and 5F(iv), the potential signal $V_{in}$ is controlled to raise the potential barrier of the buried-QW-channel of the input gate 311 in order to block electron charge transfer through this buried-QW-channel and thus isolate the input diode region 313 from the imaging regions 301.

In the embodiment of FIGS. 5A-5C(iv), the n-type modulation doped structure 32 also provides a buried-QW-channel that couples the storage diode region 307' to the output diode region 309' via the corresponding output gate 308'. Similarly, in the embodiment of FIGS. 5D-5F(iv), the n-type modulation doped structure 32 also provides a buried-QW-channel that couples the charge storage region 321 of the transfer and storage gate 307" to the output diode region 309' via the corresponding output gate 308'. In both embodiments, a potential signal $V_{out}$ can be supplied to the electrode of the output gate 308' to control (i.e., raise, lower and maintain) the potential barrier of the buried-QW-channel provided by the n-type modulation doped structure 32 between the storage diode region 307' or 321 and the output diode region 309'. Such control over the height of the potential barrier can be used to selectively control the conductivity of the buried-QW-channel of the output gate 308'. During the pixel setup mode of operation as shown in FIGS. 5C(ii) and 5F(ii) and the signal integration mode of operation as shown in FIGS. 5C(iii) and 5F(iii), the potential signal $V_{out}$ can be controlled to raise the potential barrier of the buried-QW-channel of the output gate 308' in order to block electron current flow through this buried-QW-channel and thus isolate the storage diode region 307' or 321 from the output diode region 309'. During the readout mode operation as shown in FIGS. 5C(iv) and 5F(iv), the potential signal $V_{out}$ can be controlled to lower the potential barrier of the buried-QW-channel of the output gate 308' in order to transfer the charge from the storage diode region 307' or 321 to the output diode region 309' for output as a signal $V_{signal}$. The signal $V_{signal}$ represents the accumulated charge for each respective imaging cell during read-out.

Moreover, in the embodiments of FIGS. 5A-5C(iv) and 5D-5F(iv), each imaging cell employs three transistors: a reset transistor (labeled "RST"), a source follower (labeled "SRC") and a row select transistor (labeled "SEL"). During pixel setup mode operations, the row select transistor is turned OFF and the reset transistor is turned ON to electrically couple the output diode region 309' of the corresponding imaging cell to a fixed potential (such as $V_{DD}$) that empties the output diode region 309' of electrons and thus resets the output diode region 309' of the corresponding imaging cell. During signal integration mode operations, the reset transistor is turned OFF to electrically isolate the output diode region 309' of the corresponding imaging cell from the fixed potential (such as $V_{DD}$), the row select transistor is turned OFF, and the source follower transistor generates a voltage signal corresponding to the charge level of electrons accumulated in the output diode region 309' during the signal integration mode. In the readout mode operations, the reset transistor is turned OFF to electrically isolate the output diode region 309' of the corresponding imaging cell from the fixed potential (such as $V_{DD}$) and the row select transistor (labeled "SEL) is turned ON to output the voltage signal $V_{signal}$ generated by the source follower transistor onto the corresponding column bus for the array of imaging cells. The signal $V_{signal}$ represents the accumulated charge for each respective imaging cell during readout and is proportional to the power of the incident electromagnetic radiation at the characteristic wavelength absorbed by the QDs of the QD-in-QW structure 28 that is received at the imaging cell during the signal integration period. The signal $V_{signal}$ is supplied to read-out circuitry for signal processing as desired.

FIG. 6 summarizes the current flow of the thyristor imaging cell during the signal integration mode operations for the active-pixel-type imaging architecture of the embodiment of FIGS. 5A-5C(iv) and 5D-5F(iv). Note that the device structure is preferably subject to bias conditions where the thyristor action of the imaging region 301 is OFF (a non-conducting state) as shown in the IV curve of FIG. 7. These bias conditions form a depletion region that encompasses the QD-in-QW structure 28 of the respective imaging regions 301 and moves electrons from the n-type delta doping of the QD-in-QW structure 28 into the QDs of the QD-in-QW structure 28 of the respective imaging regions 301. These bias conditions also introduce a relatively small electron diffusion current from the n-type modulation doped QW structure 28 into the QDs of the QD-in-QW structure 28 of the respective imaging regions. In this manner, electrons are supplied to the QDs of the QD-in-QW structure 28 of the respective imaging regions 301. Moreover, the QDs of the QD-in-QW structure 28 are subject to a built-in electric field that moves mobile electrons toward the n-type modulation doped QW structure 28 of the respective imaging regions 301. When electromagnetic radiation is absorbed by the QDs of the QD-in-QW structure 28 of the respective imaging regions 301, the electrons in the QDs will receive enough energy to place them in the conduction band via intersubband transitions. Once in the conduction band, the built-in electric field moves the mobile electrons to the QW channel of the n-type modulation doped QW structure 32 of the respective imaging regions 301. In this manner, the inter-subband absorption mechanism of the QDs of the QD-in-QW structure 28 produces electron photocurrent that flows to the QW channel of the n-type modulation doped QW structure 32 under the influence of the built-in electric field of device structure. The n-type modulation doped QW structure 32 provides a buried-QW-channel that allows for lateral transport of electron photocurrent from the respective imaging regions 301 to respective storage diode regions 307' (or the charge storage regions 321) of the row of the imaging cells. The electron charge resulting from such photocurrent accumulates in respective storage diode regions 307' (or in the charge storage regions 321) of the imaging cells over the time period of the signal integration mode. The amount of accumulated charge for the imaging cell is proportional to the power of the incident electromagnetic radiation at the characteristic wavelength absorbed by the QDs of the QD-in-QW structure 28 that is received at the imaging cell during the signal integration period.

The imaging cells of the illustrative active-pixel-type imaging architecture preferably operate over successive imaging cycles that include the three distinct modes as described above: a pixel setup mode; a signal integration mode; and a readout mode.

Single Wavelength Imaging Employing Active-Pixel-type Imaging Architecture—Pixel Setup Mode of Operation During the pixel setup mode of operation, the potential $V_{trans}$ of the transfer gate 305 (or the potential $V_{transfer/storage}$ of the transfer/storage gate 307") of each respective imaging cell is controlled to block electron charge transfer through the buried-QW-channel of the transfer gate 305 (or through the transfer/storage gate 307") and thus isolate the imaging region 301 from corresponding storage diode region 307 or 321 of the respective imaging cell.

The potential $V_{IN}$ of the input gate 311 is then controlled to lower the potential barrier of the input gate 311. This brings the potential of the buried-QW-channel of the imaging regions 301 of the imaging cells to the predetermined potential (e.g., ground potential) of the input diode region 313 that populates the QW channel of the n-type modulation doped structure 32 of the imaging regions 301 of the imaging cells with electrons. After allowing for such electron population to complete, the potential $V_{IN}$ of the input gate 311 is then controlled to raise the potential barrier in order to block electron charge transfer through the buried-QW-channel of the input gate 311 and thus isolate the input diode region 313 from the imaging regions 301 of the imaging cells.

Moreover, the potential $V_{out}$ of the output gate 308' of each respective imaging cell is controlled to raise the potential barrier of the output gate 308' in order to block electron charge transfer through the buried-QW-channel of the output gate 308' and thus isolate the storage diode region 307 or 321 from the corresponding output diode region 309' of the respective imaging cell. Moreover, the row select transistor is turned OFF and the reset transistor is turned ON to electrically couple the output diode region 309' of the corresponding imaging cell to a fixed potential (such as $V_{DD}$) that empties the output diode region 309' of electrons and thus resets the output diode region 309' of the respective imaging cell.

Single Wavelength Imaging Employing Active-Pixel-type Imaging Architecture—Signal Integration Mode of Operation In the signal integration mode of operation, the potential $V_{IN}$ of the input gate 311 remains at the level that blocks electron charge transfer through the buried-QW-channel of the input gate 311 and thus isolates the input diode region 313 from the imaging regions 301 of the imaging cells. The potential $V_{out}$ of the output gate 308' remains at the level that isolates the storage diode region 307' (or the charge storage region 321) from the output diode region 309' of the respective imaging cell.

For the active-pixel-type imaging architecture of the embodiments of FIGS. 5A-5C(iv), the potential signals $V_{trans}$ and $V_{storage}$ of the transfer gate 305 and the storage diode region 307' of each respective imaging cell are controlled to lower the potential barrier of the transfer gate 305 in order produce a desired subthreshold current flow through this buried-QW-channel to the respective storage diode regions 307'. The electron photocurrent that results from absorption in the QDs of the QD-in-QW structure 28 of the imaging cells flows through the buried-QW-channels and accumulates in the respective storage diode regions 307'. The amount of accumulated charge in each respective storage diode region 307' is proportional to the power of the incident electromagnetic radiation at the characteristic absorption wavelength of the QDs of the of the QD-in-QW structure 28 that is received at the imaging cell during the signal integration period.

For the active-pixel-type imaging architecture of the embodiments of FIGS. 5D-5F(iv), the potential signal $V_{transfer/storage}$ of the transfer/storage gate 307" of each respective imaging cell is controlled to lower the potential barrier of the buried-QW-channel provided by the transfer/storage gate 307" in order produce a desired subthreshold current flow through this buried-QW-channel to the respective charge storage regions 321. The electron photocurrent that results from absorption in the QDs of the QD-in-QW structure 28 of the imaging cells flows through the buried-QW-channels and accumulates in the respective charge storage region 321. The amount of accumulated charge in each respective charge storage region 321 is proportional to the power of the incident electromagnetic radiation at the characteristic absorption wavelength of the QDs of the of the QD-in-QW structure 28 that is received at the imaging cell during the signal integration period.

In both embodiments, the reset transistor of each respective imaging cell is turned OFF to electrically isolate the output diode region 309' of the imaging cell from the fixed potential (such as $V_{DD}$), and the row select transistor of the respective imaging cell is turned OFF.

Single Wavelength Imaging Employing Active-Pixel-type Imaging Architecture—Readout Mode of Operation For the readout mode of operation, the potential signal $V_{out}$ supplied to the output gate 308' of each respective imaging cell can be controlled to lower the potential barrier of the buried-QW-channel of the output gate 308' in order to transfer the charge from the storage diode region 307' (or the charge storage region 321) to the output diode region 309', which controls the source follower transistor (SRC) of the imaging cell to output a signal $V_{signal}$. The reset transistor of each respective imaging cell is turned OFF to electrically isolate the output diode region 309' of the imaging cell from the fixed potential (such as $V_{DD}$), and the row select transistor (labeled "SEL) of each respective imaging cell is turned ON to output the signal $V_{signal}$ generated by the source follower transistor onto the corresponding column bus for the array of imaging cells. The signal $V_{signal}$ represents the accumulated charge for each respective imaging cell during readout and is proportional to the power of the incident electromagnetic radiation at the characteristic absorption wavelength of the QDs of the of the QD-in-QW structure 32 that is received at the imaging cell during the signal integration period. The signal $V_{signal}$ is supplied to read-out circuitry for signal processing as desired.

Dual-Wavelength CCD-type Imaging Architecture

Figure 8B:
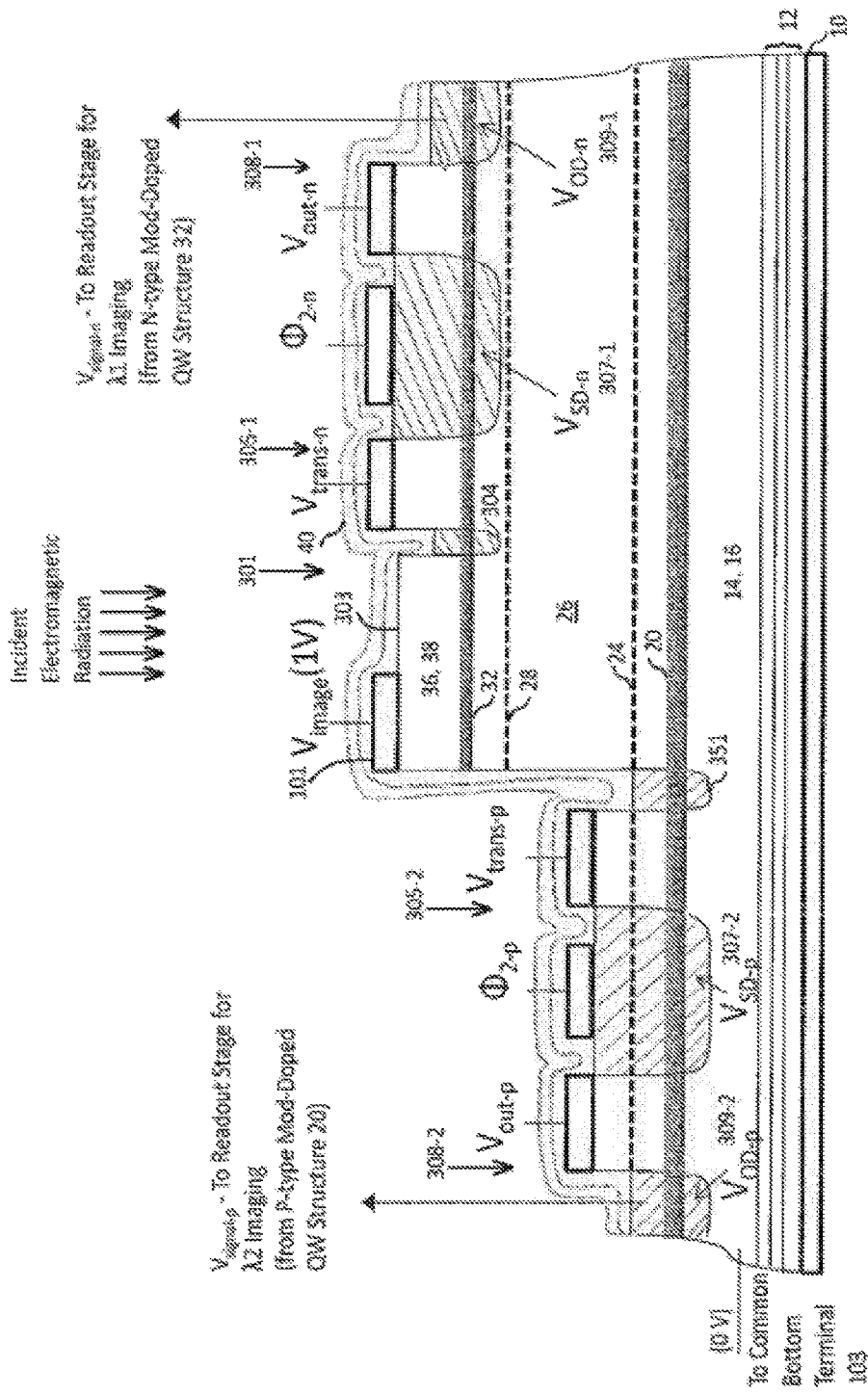
FIG. 8B is a schematic cross-sectional view of an imaging cell of the dual-wavelength CCD-type imaging array of FIG. 8A.

The thyristor imaging cells can also be part of a CCD-type imaging architecture for dual wavelength imaging as shown in the illustrative embodiment of FIGS. 8A-8C(viii). In this illustrative embodiment, a linear array (row) of thyristor imaging cells is made utilizing the layer structure of FIGS. 1 to 2B. Multiple rows of thyristor imaging cells can be formed to provide a two-dimensional imaging array as desired. Each thyristor imaging cell includes an imaging region 301 defined by a mesa that includes a top (anode) terminal 101 formed adjacent the highly doped top p-type ohmic contact layer 38. A bottom (cathode) terminal 103 is operably coupled to the bottom n-type ohmic contact layer 14. The mesa of the imaging region 301 is defined by two opposed trenches. One of the two trenches extends down to at least the p-type layer 36 of device structure adjacent the corresponding transfer gate 305-1, and the other trench extends down at or near the p-type modulation-doped QW structure 20 adjacent the corresponding transfer gate 305-2. The other two sidewalls of the mesa (not shown in the cross-sections of FIG. 8B) are formed by etching down past the QW channel of the p-type modulation-doped QW structure 20 for isolation between the imaging regions 301 of the row of imaging regions 301. The sidewalls of the mesa provide for lateral confinement of the electromagnetic radiation within the imaging region 301. The lateral extent of the mesa can vary by design. In one embodiment, the lateral extent of the mesa covers an area on the order of 30 μm by 1 μm. An n-type doped region 304 is formed at the bottom of the trench adjacent the common output gate 305-1. A p-type doped region 351 is formed at the bottom of the trench adjacent the corresponding transfer gate 305-2. The doped regions 304, 351 can be formed by ion implantation of an n-type and p-type species as desired or other suitable technique. The layer structure between the top p-type ohmic contact layer 38 and the bottom n-type ohmic contact layer 14 of the mesa of the imaging region 301 defines a vertical thyristor (P-N-P-N) structure. A portion of the mesa of each respective imaging region 301 is not covered by the top anode terminal 101 to form respective apertures 303 into the device structure for the imaging regions 301. The top DBR mirror 40 can be formed continuously across the integrated circuit structure and covers the aperture 303 as shown. The top DBR mirror 40 and the bottom DBR mirror 12 together form a resonant cavity with the device structure of the imaging regions 301 therebetween. The vertical dimension of the resonant cavity is configured to correspond to the characteristic wavelength band of absorption of the QDs of the QD structure 24 as well to the characteristic wavelength band of absorption of the QDs of the QD structure 28. Furthermore, the thickness of the layers of the top DBR mirror 40 and the bottom DBR mirror 12 are selected to reflect electromagnetic radiation within characteristic wavelength range of absorption of the QDs of both the QD structure 24 and the QD structure 20. Incident electromagnetic radiation passes through the top DBR mirror 40 (and aperture 303) into this resonant cavity for absorption. During operation, the QW channel of the n-type modulation doped QW structure 32 of each respective imaging region 301 is initialized such that it is at or near ground potential and filled with majority carrier electrons, the QW channel of the p-type modulation doped QW structure 20 of each respective imaging region 301 is initialized such that it is at or near $V_{DD}$ potential and filled with majority carrier holes, and the bias potential of the device structure is set via bias potential signals supplied to the top anode terminal 101 (e.g., $V_{image}$=1V) and to the bottom cathode terminal 103 (e.g., ground) such that the following two conditions are met. First, a positive bias potential is applied to a first collector region underlying the n-type modulation doped QW structure 32 with respect to the n-type modulation doped QW structure 32 of the respective imaging regions 301. The first collector region includes spacer layer 26, QD-in-QW structure 24 and the p-type modulation doped QW structure 20. Second, a negative bias potential is applied to a second collector region overlying the p-type modulation doped QW structure 20 with respect to the p-type modulation doped QW structure 20 of the respective imaging regions 301. The second collector region includes spacer layer 26, QD-in-QW structure 28 and the n-type modulation doped QW structure 32. These bias conditions form a first depletion region that encompasses the QD-in-QW structure 28 and moves electrons from the n-type delta doping of the QD-in-QW structure 28 into the QDs of the QD-in-QW structure 28 of the respective imaging regions 301 as well as a second depletion region that encompasses the QD-in-QW structure 24 and moves holes from the p-type delta doping of the QD-in-QW structure 24 into the QDs of the QD-in-QW structure 24 of the respective imaging regions 301. These bias conditions also introduce a relatively small electron diffusion current that flows vertically from the n-type modulation doped QW structure 32 toward the first collector region in the respective imaging regions 301. This electron diffusion current supplies electrons to the QDs of the QD-in-QW structure 28 in the respective imaging regions 301. This electron diffusion current has a magnitude that is smaller than the expected electron photocurrent induced by absorption of electromagnetic radiation by the QDs of the QD-in-QW structure 28 in the respective imaging regions 301. Moreover, the bias conditions introduce a relatively small hole diffusion current that flows vertically from the p-type modulation doped QW structure 20 toward the second collector region in the respective imaging regions 301. This hole diffusion current supplies holes to the QDs of the QD-in-QW structure 24 in the respective imaging regions 301. This hole diffusion current has a magnitude that is smaller than the expected hole photocurrent induced by absorption of electromagnetic radiation by the QDs of the QD-in-QW structure 24 in the respective imaging regions 301.

The bias conditions for the n-type modulation doped QW structure 32 and the first collector region are similar to that discussed above with respect to FIGS. 4A and 4B. The bias conditions for the p-type modulation doped QW structure 20 and the second collector region are shown in the energy diagrams of FIGS. 9A and 9B. FIG. 9A shows an exemplary energy diagram for a zero bias voltage the second collector region and the p-type modulation doped structure 20. FIG. 9B shows an exemplary energy diagram for a negative bias potential is applied to the second collector region with respect to the p-type modulation doped QW structure 20. Note that under these bias conditions, the QDs of the QD-in-QW structure 24 in a given imaging region 301 are in the depletion region of the second collector region, which is subject to a built-in electric field that moves mobile holes toward the p-type modulation doped QW structure 20 of the imaging region 301. When electromagnetic radiation is absorbed by the QDs of the QD-in-QW structure 24 of the imaging region 301, the holes in the QDs will receive enough energy to place them in the valence band via intersubband transitions. Once in the valence band, the built-in electric field moves the mobile holes to the QW channel of the p-type modulation doped QW structure 20 of the imaging region 301. In this manner, the intersubband absorption mechanism of the QDs of the QD-in-QW structure 24 produces hole photocurrent that flows to the QW channel of the p-type modulation doped layer 20 under the influence of the built-in electric field of device structure. The bias conditions produce an applied electric field in an opposite sense to built-in electric field in order to provide for the desired diffusion current of the majority carrier holes from the QW channel of the p-type modulation doped QW structure 20 to the QDs of the QD-in-QW structure 24 in the imaging region 301.

The n-type modulation doped QW structure 32 provides a buried-QW-channel that allows for lateral transport of electron photocurrent from the respective imaging regions 301 to respective storage diode regions 307-1 of the row of imaging cells via corresponding transfer gates 305-1, and the p-type modulation doped QW structure 20 provides a buried-QW-channel that allows for lateral transport of hole photocurrent from the respective imaging regions 301 to respective storage diode regions 307-2 of the row of the thyristor imaging cells via corresponding transfer gates 305-2. The storage diode regions 307-1 are realized by n-type doped regions that accumulate charge (i.e., electrons) that arises from the electron photocurrent produced in the corresponding imaging region 301 during operation. The storage diode regions 307-2 are realized by p-type doped regions that accumulate charge (i.e., electrons) that arises from the hole photocurrent produced in the corresponding imaging region 301 during operation. The storage diode regions 307-1 and 307-2 can be formed by ion implantation of n-type species or p-type species as desired or other suitable techniques. The transfer gates 305-1 and 305-2 are each realized by structures that extend between the respective imaging regions 301 and the respective storage diode regions 307-1 and 307-2 on opposite sides of the row of the imaging cells. The transfer gates 305-1 and storage diode regions 307-1 are similar to the transfer gates 305 and storage diode regions 307 of the embodiment described above with respect to FIGS. 3A-3C(iv). The transfer gates 305-2 and storage diode regions 307-2 are also similar in structure to the transfer gates 305 and storage diode regions 307 of the embodiment described above with respect to FIGS. 3A-3C(iv); however, they are formed into intermediate layers of the device layer structure of FIGS. 1 and 2 that overlie the p-type modulation doped quantum well structure 20 with p-type implants (instead of n-type implants) to support conduction of majority hole carriers through the buried-QW-channel provided by the QW of the p-type modulation doped QW structure 20.

As evident from FIGS. 8C(i)-8C(iv), potential signals $V_{trans-n}$ and Φ2-n can be supplied to the electrodes of the transfer gate 305-1 and the storage diode region 307-1, respectively, in order to control (i.e., raise, lower and maintain) the potential barrier of the buried-QW-channel of the transfer gate 305-1 in order to control current flow this buried-QW-channel. More specifically, in the pixel setup mode of operation as shown in FIG. 8C(ii), the potential signals $V_{trans-n}$ and Φ2-n are controlled to raise the potential barrier of the buried-QW-channel provided by the transfer gate 305-1 in order to block current flow through this buried-QW-channel and isolate the imaging region 301 from the storage diode region 307-1. In the signal integration mode of operation as shown in FIG. 8C(iii), the potential signals $V_{trans-n}$ and Φ2-n are controlled to lower the potential barrier of the buried-QW-channel of the transfer gate 305-1 in order produce a desired subthreshold electron current flow through this buried-QW-channel to the respective storage diode region 307-1 for accumulation of charge arising from the electron photocurrent of the imaging region 301 in the storage diode region 307-1. In this configuration, the surface potential of the buried-QW-channel of the transfer gate 305-1 is at or near the potential of electron charge that fills the QW of the n-type modulation doped QW structure 32 of the imaging region 301 during pixel setup mode as described below. At this level, the electron charge that initially fills the imaging region (i.e., the imaging region dark charge) is blocked from flowing through the buried-QW-channel of the transfer gate 305-1 while allowing for the electron photocurrent arising from absorption in the imaging region 301 to flow over this potential barrier and through the buried-QW-channel of the transfer gate 305-1 for accumulation in the storage diode region 307-1 of the imaging cell. In the readout mode of operation as shown in FIGS. 8C(iv), the potential signals $V_{trans-n}$ and Φ2-n are controlled to raise the potential barrier of the buried-QW-channel of the transfer gate 305-1 in order produce block reverse current flow through the buried-QW-channel of the transfer gate 305-1 back into the imaging region 301 of the imaging cell.

As evident from FIGS. 8C(v)-8C(viii), potential signals $V_{trans-p}$ and Φ2-p can be supplied to the electrodes of the transfer gate 305-2 and the storage diode region 307-12 respectively, in order to control (i.e., raise, lower and maintain) the potential barrier of the buried-QW-channel of the transfer gate 305-2 in order to control current flow this buried-QW-channel. More specifically, in the pixel setup mode of operation as shown in FIG. 8C(vi), the potential signals $V_{trans-p}$ and Φ2-p are controlled to raise the potential barrier of the buried-QW-channel provided by the transfer gate 305-2 in order to block current flow through this buried-QW-channel and isolate the imaging region 301 from the storage diode region 307-2. In the signal integration mode of operation as shown in FIG. 8C(vii), the potential signals $V_{trans-p}$ and Φ2-p are controlled to lower the potential barrier of the buried-QW-channel of the transfer gate 305-3 in order produce a desired subthreshold hole current flow through this buried-QW-channel to the respective storage diode region 307-2 for accumulation of charge arising from the hole photocurrent of the imaging region 301 in the storage diode region 307-2. In this configuration, the surface potential of the buried-QW-channel of the transfer gate 305-2 is at or near the potential of hole charge that fills the QW of the p-type modulation doped QW structure 20 of the imaging region 301 during pixel setup mode as described below. At this level, the hole charge that initially fills the imaging region (i.e., the imaging region dark charge) is blocked from flowing through the buried-QW-channel of the transfer gate 305-2 while allowing for the hole photocurrent arising from absorption in the imaging region 301 to flow over this potential barrier and through the buried-QW-channel of the transfer gate 305-2 for accumulation in the storage diode region 307-2 of the imaging cell. In the readout mode of operation as shown in FIG. 8C(viii), the potential signals $V_{trans-p}$ and Φ2-p are controlled to raise the potential barrier of the buried-QW-channel provided by the p-type modulation doped structure 32 between the imaging region 301 and the storage diode region 307-2 in order produce block reverse current flow through the buried-QWchannel of the transfer gate 305-2 back into the imaging region 301 of the imaging cell.

The storage diode regions 307-1 are disposed adjacent corresponding barrier regions 315-1. The storage diode region 307-1 and barrier region 315-1 pairs realize a top row of CCD registers similar to the embodiment of FIGS. 3A-3C(iv) that operates under control of a two phase clocking scheme (Φ1 and Φ2) to transfer charge (i.e., electrons) register-to-register to the last storage diode region 307-1 in the row. The n-type modulation doped structure 32 provides a buried-QW-channel that allows for lateral transport of charge (i.e., electrons) from register-to-register in the top row of CCD registers similar to that described above for the embodiment of FIGS. 3A-3C(iv). An output gate 308-1 is disposed between the storage diode region 307-1 of the last CCD register of the row and an output storage diode 309-1. The n-type modulation doped structure 32 provides a buried-QW-channel that allows for lateral transport of charge from this last storage diode region 307-1 to the output diode region 309-1. The output diode region 309-1 can be formed by ion implantation of n-type species as desired or other suitable techniques. The output gate 308-1 is realized by a rib-like mesa that extends between the last storage diode region 307-1 and the output diode region 309-1. An electrode covers the top surface 38 of the rib-like mesa of the output gate 308-1. During certain operations (such as during readout mode operations), a potential signal $V_{out-n}$ can be supplied to this electrode to lower the potential barrier of the buried-QW-channel provided by the n-type modulation doped structure 32 between the last storage diode region 307-1 and the output diode region 309-1 in order to transfer the charge from the last storage diode region 307-1 to the output diode region 309-1 for output as a signal $V_{signal-n}$, which represents the accumulated charge for each respective imaging cell for readout and is proportional to the power of the incident electromagnetic radiation at the characteristic wavelength (λ1) absorbed by the QDs of the QD-in-QW structure 28 that is received at the respective imaging cell during the signal integration time period. The signal $V_{signal-n}$ is supplied to read-out circuitry for signal processing as desired. The barrier regions 315-1, storage diode regions 307-1, output gate 308-1 and output diode region 309-1 are similar to the barrier regions 315, storage diode regions 307, output gate 308 and output diode region 309 of the embodiment described above with respect to FIGS. 3A-3C(iv).

Similarly, the storage diode regions 307-2 are disposed adjacent corresponding barrier regions 315-2. The storage diode region 307-2 and barrier region 315-2 pairs realize a bottom row of CCD registers similar to the embodiment of FIGS. 3A-3C(iv) that operates under control of the two phase clocking scheme (Φ1 and Φ2) to transfer charge (i.e., holes) register-to-register to the last storage diode region 307-2 in the row of CCD registers. The p-type modulation doped structure 20 provides a buried-QW-channel that allows for lateral transport of charge (i.e., holes) from register-to-register in the row of CCD registers similar to that described above for the embodiment of FIGS. 3A-3C(iv). An output gate 308-2 is disposed between the storage diode region 307-2 of the last CCD register of the row and an output storage diode 309-2. The p-type modulation doped structure 20 provides a buried-QW-channel that allows for lateral transport of charge from this last storage diode region 307-2 to the output diode region 309-2. The output diode region 309-2 can be formed by ion implantation of p-type species as desired or other suitable techniques. The output gate 308-2 is realized by a rib-like mesa that extends between the last storage diode region 307-2 and the output diode region 309-2. An electrode covers the top surface 38 of the rib-like mesa of the secondary output gate 308-2. During certain operations (such as during readout mode operations), a potential signal $V_{out-p}$ can be supplied to this electrode to lower the potential barrier of the buried-QW-channel provided by the p-type modulation doped structure 20 between the last storage diode region 307-2 and the output diode region 309-2 in order to transfer the charge from the last storage diode region 307-2 to the output diode region 309-2 for output as a signal $V_{signal-p}$, which represents the accumulated charge for each respective imaging cell for readout and is proportional to the power of the incident electromagnetic radiation at the characteristic wavelength (λ2) absorbed by the QDs of the QD-in-QW structure 24 that is received at the respective imaging cell during the signal integration time period. The signal $V_{signal-p}$ is supplied to read-out circuitry for signal processing as desired. The barrier regions 315-2, storage diode regions 307-2, output gate 308-2 and output diode region 309-2 are also similar to the barrier regions 315, storage diode regions 307, output gate 308 and output diode region 309 of the embodiment described above with respect to FIGS. 3A-3C(iv); however, they are formed into intermediate layers of the device layer structure of FIGS. 1 and 2 that overlie the p-type modulation doped quantum well structure 20 with p-type implants (instead of n-type implants) to support conduction of majority hole carriers through the buried-QW-channel provided by the QW of the p-type modulation doped QW structure 20.

An input diode region 320-1 and input gate 321-1 are disposed adjacent the barrier region 315-1 of the first register of the top row of CCD registers. The n-type modulation doped structure 32 provides a buried-QW-channel that allows for lateral transport of charge (i.e., electrons) between the input diode region 320-1 and the barrier region 315-1 of the first CCD register. The input diode region 320-1 can be formed by ion implantation of n-type species as desired or other suitable techniques. Similarly, an input diode region 320-2 and input gate 321-2 are disposed adjacent the barrier region 315-2 of the first register of the bottom row of CCD registers. The p-type modulation doped structure 20 provides a buried-QW-channel that allows for lateral transport of charge (i.e., holes) between the input diode region 320-2 and the barrier region 315-2 of the first CCD register. The input diode region 320-2 can be formed by ion implantation of p-type species as desired or other suitable techniques. The input gate 321-1 is realized by a rib-like mesa that extends between the input diode region 320-1 and the barrier region 315-1 of the top CCD register. An electrode covers the top surface 38 of the rib-like mesa of the input gate 321-1. The input gate 321-1 and the input diode region 320-1 are similar to the reset gate 317 and the reset diode region 319 of the embodiment described above with respect to FIGS. 3A-3C (iv). A potential signal $V_{IN-n}$ can be supplied to the electrode of the input gate 321-1 to control (e.g., raise, lower or maintain) the potential barrier of the buried-QW-channel provided by the n-type modulation doped structure 32 between the input diode region 320-1 and the first barrier region 313-1. The input gate 321-2 is realized by a rib-like mesa that extends between the input diode region 320-2 and the barrier region 315-2 of the bottom CCD register. The input gate 321-2 and the input diode region 320-2 are similar to the reset gate 317 and the reset diode region 319 of the embodiment described above with respect to FIGS. 3A-3C (iv); however, they are formed into intermediate layers of the device layer structure of FIGS. 1 and 2 that overlie the p-type modulation doped quantum well structure 20 with p-type implants (instead of n-type implants) to support conduction of majority hole carriers through the buried-QW-channel provided by the QW of the p-type modulation doped QW structure 20. A potential signal $V_{IN-p}$ can be supplied to the electrode of the input gate 321-2 to control (e.g., raise, lower or maintain) the potential barrier of the buried-QW-channel provided by the p-type modulation doped structure 20 between the input diode region 320-2 and the first barrier region 315-2 of the bottom CCD register.

During certain operations (such as during pixel setup mode operations), the input diode region 320-1 can be supplied with a potential bias signal (such as ground potential) that is configured to fill the storage diode regions 307-1 of the top CCD registers with electrons. The operation of the input gate 321-1 can be operated in conjunction with register-to-register transfer of the CCD registers (storage diode region 307-1/barrier region 315-1 pairs) carried out under control of the two phase clocking scheme (Φ1-n and Φ2-n) in order to fill all of the storage diode regions 307-1 of the top CCD registers with electrons. With all of the storage diode regions 307-1 of the top CCD registers filled with electrons, the potential signal $V_{trans-n}$ can be supplied to the electrode of the transfer gates 305-1 to lower the potential barrier of the buried-QW-channel provided by the n-type modulation doped structure 32 between the imaging regions 301 and the respective storage diode regions 307-1 of the top row of CCD registers in order to populate the n-type modulation doped structure 32 of the imaging regions 301 with electrons from the electron-filled storage diode regions 307-1 of the top row of CCD registers. After populating the n-type modulation doped structure 32 of the imaging regions 301 with electrons, the potential signal $V_{trans-n}$ can be supplied to the electrode of the transfer gates 305-1 to raise the potential barrier of the buried-QW-channel provided by the n-type modulation doped structure 32 between the imaging regions 301 and the respective storage diode regions 307-1 of the top row of CCD registers in order to isolate these regions from one another and thus block the flow of charge therebetween. Similarly, the input diode region 320-2 can be supplied with a potential bias signal (such as $V_{DD}$ potential) that is configured to fill the storage diode regions 307-2 of the bottom CCD registers with holes. The operation of the input gate 321-2 can be operated in conjunction with register-to-register transfer of the CCD registers (storage diode region 307-2/barrier region 315-2 pairs) carried out under control of the two phase clocking scheme (Φ1-p and Φ2-p) in order to fill all of the storage diode regions 307-2 of the bottom CCD registers with holes. With all of the storage diode regions 307-2 of the bottom CCD registers filled with holes, the potential signal $V_{trans-p}$ can be supplied to the electrode of the transfer gates 305-2 to lower the potential barrier of the buried-QW-channel provided by the p-type modulation doped structure 20 between the imaging regions 301 and the respective storage diode regions 307-2 of the bottom row of CCD registers in order to populate the p-type modulation doped structure 20 of the imaging regions 301 with holes from the hole-filled storage diode regions 307-2 of the bottom row of CCD registers. After populating the p-type modulation doped structure 20 of the imaging regions 301 with holes, the potential signal $V_{trans-p}$ can be supplied to the electrode of the transfer gates 305-2 to raise the potential barrier of the buried-QW-channel provided by the p-type modulation doped structure 20 between the imaging regions 301 and the respective storage diode regions 307-2 of the bottom row of CCD registers in order to isolate these regions from one another and thus block the flow of charge therebetween.

A reset gate 317-1 is disposed between a reset diode region 319-1 and the output diode region 309-1. The n-type modulation doped structure 32 provides a buried-n-type QW-channel that allows for lateral transport of charge (i.e., electrons) between the reset diode region 319-1 and the output diode region 309-1. The reset diode region 319-1 can be formed by ion implantation of n-type species as desired or other suitable techniques. The reset gate 317-1 is realized by a rib-like mesa that extends between the output diode region 309-1 and the reset diode region 319-1. An electrode covers the top surface 38 of the rib-like mesa of the reset gate 317-1. A potential signal $V_{RS-n}$ can be supplied to the electrode of the reset gate 317-1 to control (e.g., raise or lower) the potential barrier of the buried-QW-channel provided by the n-type modulation doped structure 32 between the output diode region 309-1 and the reset diode region 319-1. The reset gate 317-1 and the reset diode region 319-1 are similar to the reset gate 317 and the reset diode region 319 of the embodiment described above with respect to FIGS. 3A-3C(iv).

Similarly, a reset gate 317-2 is disposed between a reset diode region 319-2 and the output diode region 309-2. The p-type modulation doped structure 20 provides a buried-QW-channel that allows for lateral transport of charge (i.e., holes) between the reset diode region 319-2 and the output diode region 309-2. The reset diode region 319-2 can be formed by ion implantation of p-type species as desired or other suitable techniques. The reset gate 317-2 is realized by a rib-like mesa that extends between the output diode region 309-2 and the reset diode region 319-2. An electrode covers the top surface 38 of the rib-like mesa of the reset gate 317-2. A potential signal $V_{RS-p}$ can be supplied to the electrode of the reset gate 317-2 to control (e.g., raise or lower) the potential barrier of the buried-QW-channel provided by the p-type modulation doped structure 20 between the output diode region 309-2 and the reset diode region 319-2. The reset gate 317-2 and the reset diode region 319-2 are similar to the reset gate 317 and the reset diode region 319 of the embodiment described above with respect to FIGS. 3A-3C(iv); however, they are formed into intermediate layers of the device layer structure of FIGS. 1 and 2 that overlie the p-type modulation doped quantum well structure 20 with p-type implants (instead of n-type implants) to support conduction of majority hole carriers through the buried-QW-channel provided by the QW of the p-type modulation doped QW structure 20.

During certain operations (such as during pixel setup mode operations), the reset diode region 319-1 can be supplied with a potential bias signal (such as $V_{DD}$) that is configured to empty the storage diode regions 307-1 of the top CCD registers as well as the output diode region 309-1 of all electrons. The potential signal $V_{RS-n}$ can be supplied to the electrode of the reset gate 317-1 to lower the potential barrier of the buried-QW-channel of the reset gate 317-1. The operation of the reset gate 317-1 can be operated in conjunction with register-to-register transfer of the top row of CCD registers (storage diode region 307-1/barrier region 315-1 pairs) carried out under control of the two phase clocking scheme (Φ1-n and Φ2-n) and in conjunction with the operation of the output gate 308-1 in order to empty the storage diode regions 307-1 of the top row of CCD registers and the output diode region 309-1 of all electrons, and thus clear the storage diode regions 307-1 of the top CCD registers as well as the output diode region 309-1. Similarly, the reset diode region 319-2 can be supplied with a potential bias signal (such as ground potential) that is configured to empty the storage diode regions 307-2 of the bottom CCD registers as well as the output diode region 309-2 of all holes. The potential signal $V_{RS-p}$ can be supplied to the electrode of the reset gate 317-2 to lower the potential barrier of the buried-QW-channel of the reset gate 317-2. The operation of the reset gate 317-2 can be operated in conjunction with register-to-register transfer of the bottom row of CCD registers (storage diode region 307-2/barrier region 315-2 pairs) carried out under control of the two phase clocking scheme (Φ1-p and Φ2-p) and in conjunction with the operation of the output gate 308-2 in order to empty the storage diode regions 307-2 of the bottom row of CCD registers and the output diode region 309-2 of all holes, and thus clear the storage diode regions 307-2 of the top CCD registers as well as the output diode region 309-2.

During the readout mode of operation as shown in FIG. 8C(iv), the potential signal $V_{trans-n}$ of the transfer gate 305-1 is controlled to raise the potential barrier of the buried-QW-channel of the transfer gate 305-1 in order to block electron current flow through the buried-QW-channel of the transfer gate 305-1 and thus isolate the imaging regions 301 from the storage diode regions 307-1 of the imaging cells. Moreover, register-to-register transfer of the CCD registers (barrier region 315-1/storage diode region 307-1 pairs) is carried out under control of the two phase clocking scheme (Φ1-n and Φ2-n) in order to transfer the accumulated charge (i.e., electrons) between the storage diode regions 307-1 to the last storage diode region 307-1 of the top row of CCD registers while controlling the potential of the output gate 308-1 to transfer the charge from the last storage region 307-1 to the output diode region 309-1 for output as a signal $V_{signal-n}$. The signal $V_{signal-n}$ represents the accumulated charge for each respective imaging cell for readout and is proportional to the power of the incident electromagnetic radiation at the characteristic wavelength (λ1) absorbed by the QDs of the QD-in-QW structure 28 that is received at the respective imaging cell during the signal integration time period. The signal $V_{signal-n}$ is supplied to read-out circuitry for signal processing as desired.

During the readout mode of operation as shown in FIG. 8C(viii), the potential signal $V_{trans-p}$ of the transfer gate 305-2 is controlled to raise the potential barrier of the buried-QW-channel of the transfer gate 305-2 in order to block hole current flow through the buried-QW-channel of the transfer gate 305-2 and thus isolate the imaging regions 301 from the storage diode regions 307-2 of the imaging cells. Moreover, register-to-register transfer of the CCD registers (barrier region 315-2/storage diode region 307-2 pairs) is carried out under control of the two phase clocking scheme (Φ1-p and Φ2-p) in order to transfer the accumulated charge (i.e., holes) between the storage diode regions 307-2 to the last storage diode region 307-2 of the bottom row of CCD registers while controlling the potential of the output gate 308-2 to transfer the charge from the last storage region 307-2 to the output diode region 309-2 for output as a signal $V_{signal-p}$. The signal $V_{signal-p}$ represents the accumulated charge for each respective imaging cell for readout and is proportional to the power of the incident electromagnetic radiation at the characteristic wavelength (λ2) absorbed by the QDs of the QD-in-QW structure 24 that is received at the respective imaging cell during the signal integration time period. The signal $V_{signal-p}$ is supplied to read-out circuitry for signal processing as desired.

Figure 11:
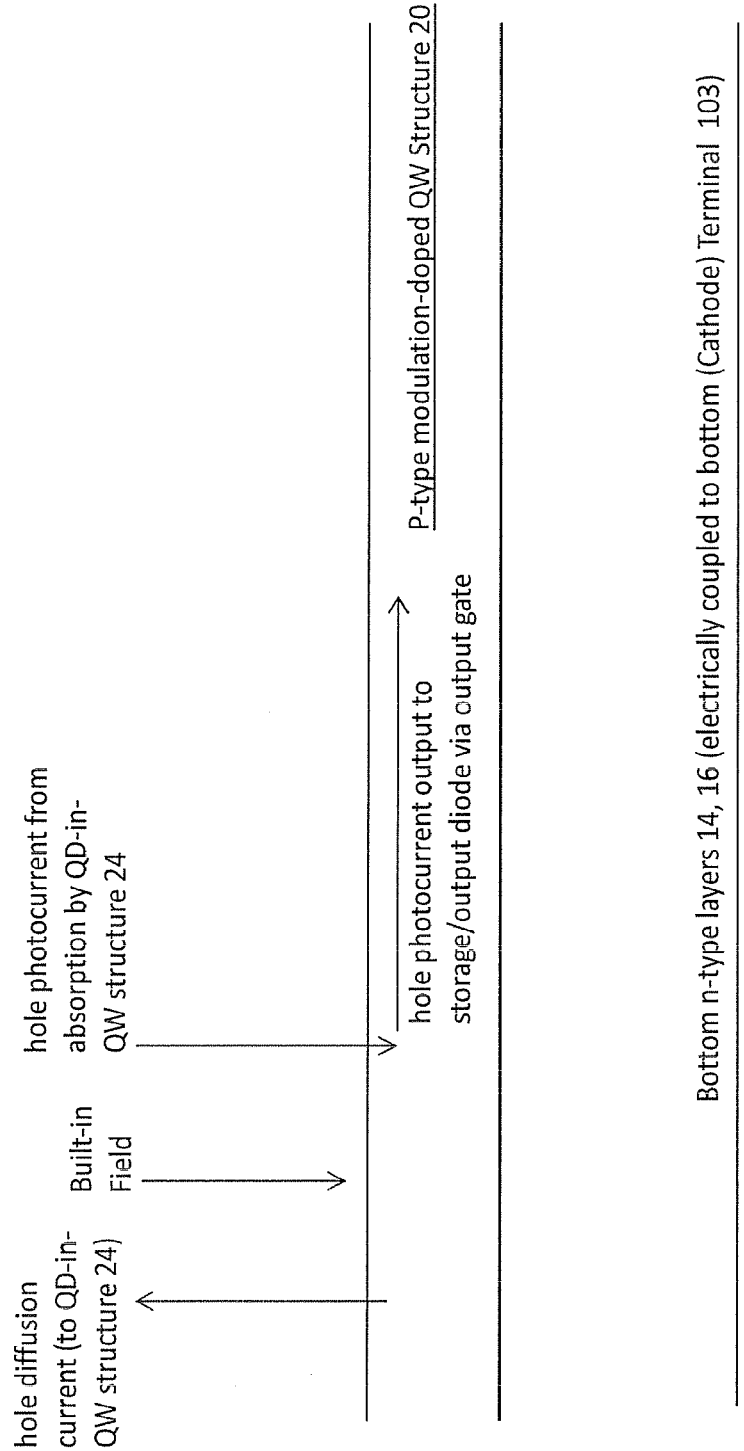
FIG. 11 is a schematic illustration of the electron currents that flow into and through the buried-QW-channel of the p-type modulation doped QW structure of the imaging cell for the dual-wavelength CCD-type imaging array of FIGS. 8A-8B as well for the dual-wavelength active-pixel-type imaging array of FIGS. 10A-10B.

FIG. 11 summarizes the hole current flow of the thyristor imaging cell for the signal $V_{signal-p}$ during the signal integration mode operations for both the CCD-type imaging architecture of the embodiment of FIGS. 8A-8C(viii). The electron current flow of the thyristor imaging cell for the signal $V_{signal-n}$ during the signal integration mode is similar to that discussed above with respect to FIG. 6. Note that the device structure is preferably subject to bias conditions where the thyristor action of the imaging regions 301 is OFF (a non-conducting state) similar to the operating point shown in the IV curve of FIG. 7. These bias conditions form a first depletion region that encompasses the QD-in-QW structure 28 of the respective imaging regions 301 and moves electrons from the n-type delta doping of the QD-in-QW structure 28 into the QDs of the QD-in-QW structure 28 of the respective imaging regions 301 as well as a second depletion region that encompasses the QD-in-QW structure 24 of the respective imaging regions 301 and moves holes from the p-type delta doping of the QD-in-QW structure 24 into the QDs of the QD-in-QW structure 24 of the respective imaging regions 301. These bias conditions also introduce a relatively small hole diffusion current from the p-type modulation doped QW structure 20 into the QDs of the QD-in-QW structure 24 of the respective imaging regions. Moreover, the QDs of the QD-in-QW structure 24 in the respective imaging regions 301 are in the depletion region of the second collector region, which is subject to a built-in electric field that moves mobile holes toward the p-type modulation doped QW structure 20 of the respective imaging regions 301. When electromagnetic radiation is absorbed by the QDs of the QD-in-QW structure 24 of the respective imaging regions 301, the holes in the QDs will receive enough energy to place them in the valence band via intersubband transitions. Once in the valence band, the built-in electric field moves the mobile holes to the QW channel of the p-type modulation doped QW structure 20 of the respective imaging regions 301. In this manner, the intersubband absorption mechanism of the QDs of the QD-in-QW structure 24 produces hole photocurrent that flows to the QW channel of the p-type modulation doped QW structure 20 under the influence of the built-in electric field of device structure. The n-type modulation doped QW structure 32 provides a buried-QW-channel that allows for lateral transport of electron photocurrent from the respective imaging regions 301 to respective storage diode regions 307-1 via corresponding output gates 305-1. The electron charge resulting from such photocurrent accumulates in respective storage diode regions 307-1 of the row of the imaging cells over the time period of the signal integration mode. The amount of accumulated charge is proportional to the power of the electromagnetic radiation at the characteristic absorption wavelength (λ1) of the QDs of the of the QD-in-QW structure 28 that is received at the imaging cell during the signal integration period. The p-type modulation doped QW structure 20 provides a buried-QW-channel that allows for lateral transport of hole photocurrent from the respective imaging regions 301 to respective storage diode regions 307-2 via corresponding output gates 305-2. The hole charge resulting from such photocurrent accumulates in respective storage diode regions 307-2 of the row of the imaging cells over the time period of the signal integration mode. The amount of accumulated charge is proportional to the power of the electromagnetic radiation at the characteristic absorption wavelength (λ2) of the QDs of the QD-in-QW structure 24 that is received at the imaging cell during the signal integration period.

The imaging cells of the illustrative dual wavelength CCD-type imaging architecture preferably operate over successive imaging cycles that include the three distinct modes as described above: a pixel setup mode; a signal integration mode; and a readout mode.

Dual-Wavelength Active-Pixel Imaging Architecture

Figure 10B:
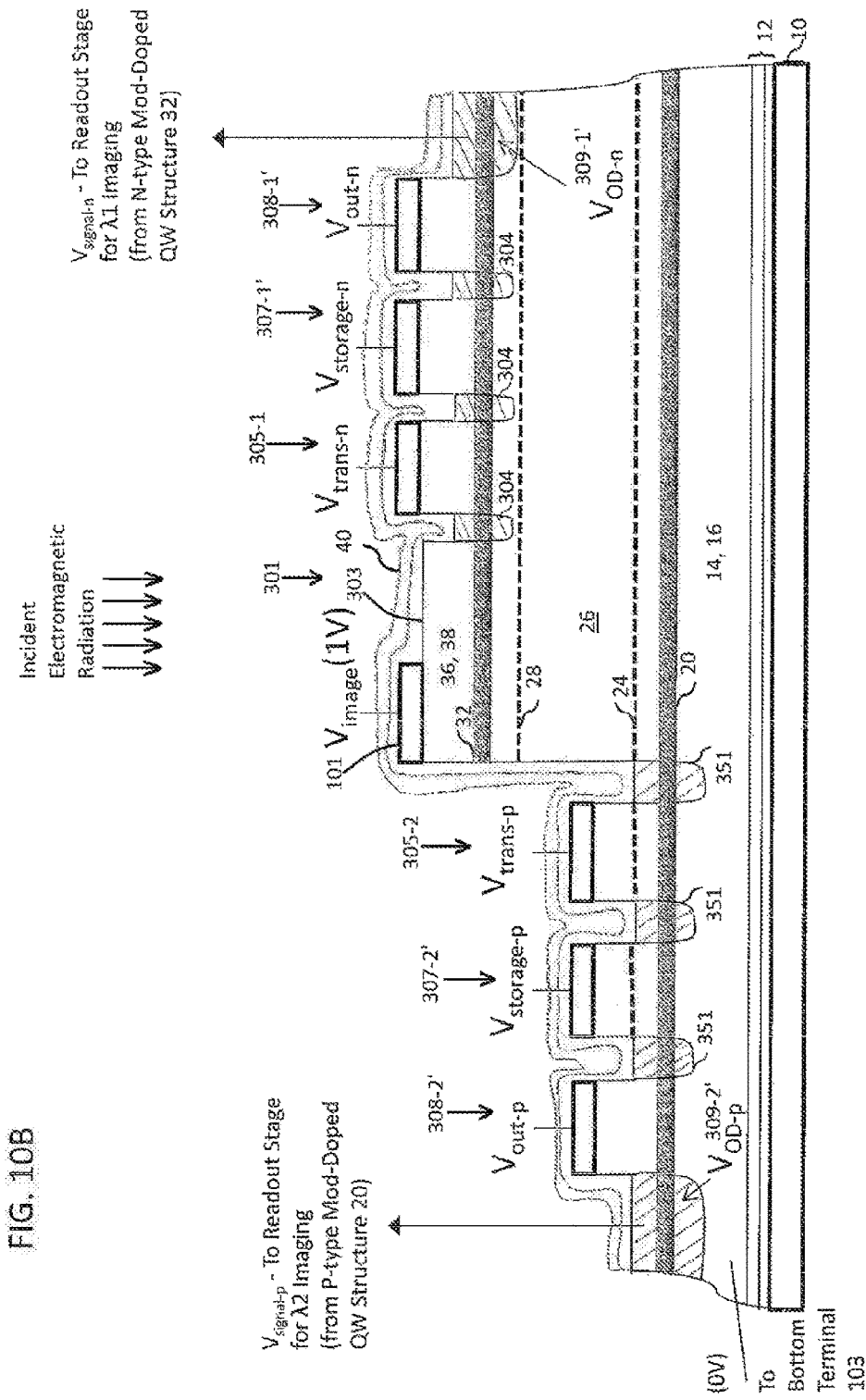
FIG. 10B is a schematic cross-sectional view of an imaging cell of the dual-wavelength active-pixel-type imaging array of FIG. 10A.

The thyristor imaging cells can also be part of an active-pixel-type imaging architecture for dual wavelength imaging as shown in the illustrative embodiment of FIGS. 10A-10C(viii). In this illustrative embodiment, a linear array (row) of thyristor imaging cells is made utilizing the layer structure of FIGS. 1 to 2B. Multiple rows of thyristor imaging cells can be formed to provide a two-dimensional imaging array as desired. Each thyristor imaging cell includes an imaging region 301 defined by a mesa that includes a top (anode) terminal 101 formed adjacent the highly doped top p-type ohmic contact layer 38. A bottom (cathode) terminal 103 is operably coupled to the bottom n-type ohmic contact layer 14. The mesa of the imaging region 301 is defined by two opposed trenches. One of the two trenches extends down to at least the p-type layer 36 of device structure adjacent the corresponding transfer gate 305-1, and the other trench extends down at or near the p-type modulation-doped QW structure 20 adjacent the corresponding transfer gate 305-2. The other two sidewalls of the mesa (not shown in the cross-sections of FIG. 8B) are formed by etching down past the QW channel of the p-type modulation-doped QW structure 20 for isolation between the imaging regions 301 of the row of imaging regions 301. The sidewalls of the mesa provide for lateral confinement of the electromagnetic radiation within the imaging region 301. The lateral extent of the mesa can vary by design. In one embodiment, the lateral extent of the mesa covers an area on the order of 30 µm by 1 µm. An n-type doped region 304 is formed at the bottom of the trench adjacent the common output gate 305-1. A p-type doped region 351 is formed at the bottom of the trench adjacent the corresponding transfer gate 305-2. The doped regions 304, 351 can be formed by ion implantation of an n-type and p-type species as desired or other suitable technique. The layer structure between the top p-type ohmic contact layer 38 and the bottom n-type ohmic contact layer 14 of the mesa of the imaging region 301 defines a vertical thyristor (P-N-P-N) structure. A portion of the mesa of each respective imaging region 301 is not covered by the top anode terminal 101 to form respective apertures 303 into the device structure for the imaging regions 301. The top DBR mirror 40 can be formed continuously across the integrated circuit structure and covers the aperture 303 as shown. The top DBR mirror 40 and the bottom DBR mirror 12 together form a resonant cavity with the device structure of the imaging regions 301 therebetween. The vertical dimension of the resonant cavity is configured to correspond to the characteristic wavelength band of absorption of the QDs of the QD structure 24 as well to the characteristic wavelength band of absorption of the QDs of the QD structure 28. Furthermore, the thickness of the layers of the top DBR mirror 40 and the bottom DBR mirror 12 are selected to reflect electromagnetic radiation within characteristic wavelength range of absorption of the QDs of both the QD structure 24 and the QD structure 20. Incident electromagnetic radiation passes through the top DBR mirror 40 (and aperture 303) into this resonant cavity for absorption. During operation, the QW channel of the n-type modulation doped QW structure 32 of each respective imaging region 301 is initialized such that it is at or near ground potential and filled with majority carrier electrons, the QW channel of the p-type modulation doped QW structure 20 of each respective imaging region 301 is initialized such that it is at or near $V_{DD}$ potential and filled with majority carrier holes, and the bias potential of the device structure is set via bias potential signals supplied to the top anode terminal 101 (e.g., $V_{image}$=1V) and to the bottom cathode terminal 103 (e.g., ground) such that the following two conditions are met. First, a positive bias potential is applied to a first collector region underlying the n-type modulation doped QW structure 32 with respect to the n-type modulation doped QW structure 32 of the respective imaging regions 301. The first collector region includes spacer layer 26, QD-in-QW structure 24 and the p-type modulation doped QW structure 20. Second, a negative bias potential is applied to a second collector region overlying the p-type modulation doped QW structure 20 with respect to the p-type modulation doped QW structure 20 of the respective imaging regions 301. The second collector region includes spacer layer 26, QD-in-QW structure 28 and the n-type modulation doped QW structure 32. These bias conditions form a first depletion region that encompasses the QD-in-QW structure 28 and moves electrons from the n-type delta doping of the QD-in-QW structure 28 into the QDs of the QD-in-QW structure 28 of the respective imaging regions 301 as well as a second depletion region that encompasses the QD-in-QW structure 24 and moves holes from the p-type delta doping of the QD-in-QW structure 24 into the QDs of the QD-in-QW structure 24 of the respective imaging regions 301. These bias conditions also introduce a relatively small electron diffusion current that flows vertically from the n-type modulation doped QW structure 32 toward the first collector region in the respective imaging regions 301. This electron diffusion current supplies electrons to the QDs of the QD-in-QW structure 28 in the respective imaging regions 301. This electron diffusion current has a magnitude that is smaller than the expected electron photocurrent induced by absorption of electromagnetic radiation by the QDs of the QD-in-QW structure 28 in the respective imaging regions 301. Moreover, the bias conditions introduce a relatively small hole diffusion current that flows vertically from the p-type modulation doped QW structure 20 toward the second collector region in the respective imaging regions 301. This hole diffusion current supplies holes to the QDs of the QD-in-QW structure 24 in the respective imaging regions 301. This hole diffusion current has a magnitude that is smaller than the expected hole photocurrent induced by absorption of electromagnetic radiation by the QDs of the QD-in-QW structure 24 in the respective imaging regions 301.

The bias conditions for the n-type modulation doped QW structure 32 and the first collector region are similar to that discussed above with respect to FIGS. 4A and 4B. The bias conditions for the p-type modulation doped QW structure 20 and the second collector region are shown in the energy diagrams of FIGS. 9A and 9B as described above.

The n-type modulation doped QW structure 32 provides a buried-QW-channel on one side of the respective imaging regions 301 that extends through a series of device structures for each respective imaging cell, including a transfer gate 305-1, a storage diode region 307-1', an output gate 308-1' and an output diode region 309-1'. This buried-QW-channel allows for lateral transport of electron photocurrent from the respective imaging regions 301 to respective storage diode regions 307-1' of the imaging cells via corresponding transfer gates 305-1 during signal integration as well as lateral transport of accumulated electron charge from the respective storage diode regions 307-1' to the output diode regions 309-1' during readout operations as described below in more detail.

The transfer gate 305-1, the storage diode region 307-1' and the output gate 308-1' are realized by mesas with trenches and doped regions 304 therebetween. The sidewalls of the trenches extend downward at least to the p-type layer 36 of device structure as best shown in FIG. 10B. The mesas of the transfer gate 305-1, the storage diode region 307-1' and the output gate 308-1' also have opposed sidewalls (not shown in the cross-section of FIG. 10B) that are formed by etching down past the QW channel of the p-type modulation-doped QW structure 20 for isolation between the transfer gates 305-1 of the row of imaging cells. An electrode ($V_{trans-n}$) covers the top surface 38 of the mesa of the transfer gate 305-1, an electrode ($\Phi$2-n) covers the top surface 38 of the mesa of the storage diode region 307', and an electrode ($V_{out-n}$) covers the top surface 38 of the mesa of the storage output gate 308-1' as best shown in FIG. 10B. The output diode region 309-1' can be formed by ion implantation of n-type species into a recess formed by etching down at least to the p-type layer 36 of device structure or other suitable techniques.

The p-type modulation doped QW structure 20 provides a buried-QW-channel on the other side of the respective imaging regions 301 that extends through a series of device structures for each respective imaging cell, including a transfer gate 305-2, a storage diode region 307-2', an output gate 308-2' and an output diode region 309-2'. This buried-QW-channel allows for lateral transport of hole photocurrent from the respective imaging regions 301 to respective storage diode regions 307-2' of the imaging cells via corresponding transfer gates 305-2 during signal integration as well as lateral transport of accumulated hole charge from the respective storage diode regions 307-2' to the output diode regions 309-2' during readout operations as described below in more detail.

The transfer gate 305-2, the storage diode region 307-2' and the output gate 308-2' are realized by mesas with trenches and doped regions 351 therebetween. The sidewalls of the trenches extend downward to at least the QD-in-QW structure 24 of device structure as best shown in FIG. 10B. The mesas of the transfer gate 305-2, the storage diode region 307-2' and the output gate 308-2' also have opposed sidewalls (not shown in the cross-section of FIG. 10B) that are formed by etching down past the QW channel of the p-type modulation-doped QW structure 20 for isolation between the transfer gates 305-2 of the row of imaging cells. An electrode ($V_{trans-p}$) covers the top surface 38 of the mesa of the transfer gate 305-2, an electrode ($\Phi$2-p) covers the top surface 38 of the mesa of the storage diode region 307-2', and an electrode ($V_{out-p}$) covers the top surface 38 of the mesa of the storage output gate 308-2' as best shown in FIG. 10B. The output diode region 309-2' can be formed by ion implantation of p-type species into a recess formed by etching down at least to the QD-in-QW structure 24 of device structure or other suitable techniques.

As evident from FIGS. 10C(i)-10C(iv), potential signals $V_{trans-n}$ and $V_{storage-n}$ can be supplied to the electrodes of the transfer gate 305-1 and the storage diode region 307-1', respectively, in order to control (i.e., lower and raise) the potential barrier of the buried-QW-channel of the transfer gate 305-1 in order to control current flow through this buried-QW-channel. More specifically, in the pixel setup mode of operation as shown in FIG. 10C(ii), the potential signals $V_{trans-n}$ and $V_{storage-n}$ are controlled to raise the potential barrier of the buried-QW-channel of the transfer gate 305-1 in order to block current flow through this buried-QW-channel and thus isolate the imaging region 301 from the storage diode region 307-1'. In the signal integration mode of operation as shown in FIG. 10C(iii), the potential signals $V_{trans-n}$ and $V_{storage-n}$ are controlled to lower the potential barrier of the buried-QW-channel of the transfer gate 305-1 in order produce a desired subthreshold current flow through this buried-QW-channel to the respective storage diode region 307-1' for accumulation of charge arising from the electron photocurrent of the imaging region 301 in the storage diode region 307-1'. In this configuration, the surface potential of the buried-QW-channel of the transfer gate 305-1 is at or near the potential of electron charge that fills the QW of the n-type modulation doped QW structure 32 of the imaging region 301 during pixel setup mode as described below. At this level, the electron charge that initially fills the imaging region (i.e., the imaging region dark charge) is blocked from flowing through the buried-QW-channel of the transfer gate 305-1 while allowing for the electron photocurrent arising from absorption in the imaging region 301 to flow over this potential barrier and through the buried-QW-channel of the transfer gate 305-1 for accumulation in the storage diode region 307-1' of the imaging cell. In the readout mode of operation as shown in FIG. 10C(iv), the potential signals $V_{trans-n}$ and $V_{storage-n}$ are controlled to raise the potential barrier of the buried-QW-channel of the reset gate 305-1 in order produce block reverse current flow through the buried-QW-channel of the transfer gate 305-1 back into the imaging region 301 of the imaging cell.

As evident from FIGS. 10C(v)-10C(viii), potential signals $V_{trans-p}$ and $V_{storage-p}$ can be supplied to the electrodes of the transfer gate 305-2 and the storage diode region 307-2', respectively, in order to control (i.e., lower and raise) the potential barrier of the buried-QW-channel of the transfer gate 305-2 in order to control current flow through this buried-QW-channel. More specifically, in the pixel setup mode of operation as shown in FIG. 10C(vi), the potential signals $V_{trans-p}$ and $V_{storage-p}$ are controlled to raise the potential barrier of the buried-QW-channel of the transfer gate 305-2 in order to block current flow through this buried-QW-channel and thus isolate the imaging region 301 from the storage diode region 307-2'. In the signal integration mode of operation as shown in FIG. 10C(vii), the potential signals $V_{trans-p}$ and $V_{storage-p}$ are controlled to lower the potential barrier of the buried-QW-channel of the transfer gate 305-2 in order produce a desired subthreshold current flow through this buried-QW-channel to the respective storage diode region 307-2' for accumulation of charge arising from the hole photocurrent of the imaging region 301 in the storage diode region 307-2'. In this configuration, the surface potential of the buried-QW-channel of the transfer gate 305-2 is at or near the potential of electron charge that fills the QW of the p-type modulation doped QW structure 20 of the imaging region 301 during pixel setup mode as described below. At this level, the hole charge that initially fills the imaging region (i.e., the imaging region dark charge) is blocked from flowing through the buried-QW-channel of the transfer gate 305-2 while allowing for the hole photocurrent arising from absorption in the imaging region 301 to flow over this potential barrier and through the buried-QW-channel of the transfer gate 305-2 for accumulation in the storage diode region 307-2' of the imaging cell. In the readout mode of operation as shown in FIG. 10C(viii), the potential signals $V_{trans-p}$ and $V_{storage-p}$ are controlled to raise the potential barrier of the buried-QW-channel of the reset gate 305-2 in order produce block reverse current flow through the buried-QW-channel of the transfer gate 305-2 back into the imaging region 301 of the imaging cell.

The n-type modulation doped structure 32 also provides a buried-QW-channel that allows for lateral transport of accumulated charge (i.e., electrons) from the respective storage diode regions 307-1' to the output diode regions 309-1' of the row of the thyristor imaging cells via corresponding output gates 308-1'. The output diode regions 309-1' drive output transistors for the imaging cells as described below in more detail. The p-type modulation doped structure 20 provides a buried-QW-channel that allows for lateral transport of accumulated charge (i.e., holes) from the respective storage diode regions 307-2' to the output diode regions 309-2' of the row of the thyristor imaging cells via corresponding output gates 308-2'. The output diode regions 309-2' drive output transistors for the imaging cells as described below in more detail.

As evident from FIGS. 10C(i)-10C(iv), a potential signal $V_{out-n}$ can be supplied to the electrode of the output gate 308-1' in order to control (i.e., raise, lower and maintain) the potential barrier of the buried-QW-channel of the output gate 308-1' in order to transfer charge through this buried-QW-channel. More specifically, in the signal integration mode of operation as shown in FIG. 10C(iii), the potential signal $V_{out-n}$ is controlled to raise the potential barrier of the buried-QW-channel of the output gate 308-1' in order to block the flow of charge through this buried-QW-channel and thus isolate the storage diode region 307-1' from the output diode region 309-1'. In the readout mode of operation as shown in FIG. 10C(iv), the potential signal $V_{out-n}$ is controlled to lower the potential barrier of the buried-QW-channel of the output gate 308-1' in order transfer accumulated charge (i.e., electrons) from the storage diode region 307-1' to the output diode region 309-1'.

As evident from FIGS. 10C(v)-10C(viii), a potential signal $V_{out-p}$ can be supplied to the electrode of the output gate 308-2' in order to control (i.e., raise, lower and maintain) the potential barrier of the buried-QW-channel of the output gate 308-2' in order to transfer charge through this buried-QW-channel. More specifically, in the signal integration mode of operation as shown in FIG. 10C(vii), the potential signal $V_{out-p}$ is controlled to raise the potential barrier of the buried-QW-channel of the output gate 308-2' in order to block the flow of charge through this buried-QW-channel and thus isolate the storage diode region 307-2' from the output diode region 309-2'. In the readout mode of operation as shown in FIG. 10C(viii), the potential signal $V_{out-p}$ is controlled to lower the potential barrier of the buried-QW-channel of the output gate 308-2' in order transfer accumulated charge (i.e., holes) from the storage diode region 307-2' to the output diode region 309-2'.

For the dual-wavelength active-pixel-type imaging architecture, each thyristor imaging cell of the row employs two sets (top and bottom) of three transistors: top and bottom reset transistors (labeled "RST"), top and bottom source followers (labeled "SRC") and top and bottom row select transistors (labeled "SEL).

During certain operations (such as during pixel setup mode operations), the top and bottom row select transistors are turned OFF. The top reset transistor of the imaging cell can be configured to electrically couple the output diode region 309-1 of the corresponding imaging cell to a first fixed potential (such as ground potential) that is configured to fill the storage diode regions 307-1' with electrons, and the potential signals $V_{out-n}$ and $V_{storage-n}$ can be supplied to the electrodes of the output gate 308-1' and the storage diode region 307-1', respectively, to lower the potential barrier of the buried-QW-channel provided by the n-type modulation doped structure 32 between the output diode region 309-1' and the storage diode region 307-1' in order to populate the n-type modulation doped structure 32 of the storage diode region 307-1' with electrons. After populating the n-type modulation doped structure 32 of the storage diode region 307-1' of the imaging cell with electrons, the potential signals $V_{trans-n}$ and $V_{storage-n}$ can be supplied to the electrodes of the transfer gate 305-1 and the storage diode region 307-1', respectively, to lower the potential barrier of the buried-QW-channel provided by the n-type modulation doped structure 32 between the storage diode region 307-1' and the imaging region 301 in order to populate the n-type modulation doped structure 32 of the imaging region 301 with electrons. After populating the n-type modulation doped structure 32 of the imaging region 301 of the imaging cell with electrons, the potential signals $V_{trans-n}$ and $V_{storage-n}$ can be supplied to the electrodes of the transfer gate 305-1 and the storage diode region 307-1', respectively, to raise the potential barrier of the buried-QW-channel provided by the n-type modulation doped structure 32 between the imaging region 301 and the storage diode region 307-1' and electrically isolate these two regions. The top reset transistor RST of the imaging cell can then be configured to electrically couple the output diode region 309-1 of the corresponding imaging cell to a second fixed potential (such as $V_{DD}$) that is configured to empty the storage diode region 307-1' of electrons, and the potential signals $V_{out-n}$ and $V_{storage-n}$ can be supplied to the electrodes of the output gate 308-1' and the storage diode region 307-1', respectively, to lower the potential barrier of the buried-QW-channel provided by the n-type modulation doped structure 32 between the output diode region 309-1' and the storage diode region 307-1' in order to empty the n-type modulation doped structure 32 of the storage diode region 307-1' of electrons and thus resets the storage diode region 307-1' of the corresponding imaging cell.

Similarly, the bottom reset transistor of the imaging cell can be configured to electrically couple the output diode region 309-2' of the corresponding imaging cell to a first fixed potential (such as $V_{DD}$ potential) that is configured to fill the storage diode regions 307-2' with holes, and the potential signals $V_{out-p}$ and $V_{storage-p}$ can be supplied to the electrodes of the output gate 308-2' and the storage diode region 307-2', respectively, to lower the potential barrier of the buried-QW-channel provided by the p-type modulation doped structure 20 between the output diode region 309-2' and the storage diode region 307-2' in order to populate the p-type modulation doped structure 20 of the storage diode region 307-2' with holes. After populating the p-type modulation doped structure 30 of the storage diode region 307-2' of the imaging cell with holes, the potential signals $V_{trans-p}$ and $V_{storage-p}$ can be supplied to the electrodes of the transfer gate 305-2 and the storage diode region 307-2', respectively, to lower the potential barrier of the buried-QW-channel provided by the p-type modulation doped structure 20 between the storage diode region 307-2' and the imaging region 301 in order to populate the p-type modulation doped structure 20 of the imaging region 301 with holes. After populating the p-type modulation doped structure 20 of the imaging region 301 of the imaging cell with holes, the potential signals $V_{trans-p}$ and $V_{storage-p}$ can be supplied to the electrodes of the transfer gate 305-2 and the storage diode region 307-2', respectively, to raise the potential barrier of the buried-QW-channel provided by the p-type modulation doped structure 20 between the imaging region 301 and the storage diode region 307-2' and electrically isolate these two regions. The bottom reset transistor RST of the imaging cell can then be configured to electrically couple the output diode region 309-2 of the corresponding imaging cell to a second fixed potential (such as ground potential) that is configured to empty the storage diode region 307-2' of holes, and the potential signals $V_{out-p}$ and $V_{storage-p}$ can be supplied to the electrodes of the output gate 308-2' and the storage diode region 307-2', respectively, to lower the potential barrier of the buried-QW-channel provided by the p-type modulation doped structure 20 between the output diode region 309-2' and the storage diode region 307-2' in order to empty the p-type modulation doped structure 20 of the storage diode region 307-2' of holes and thus resets the storage diode region 307-2' of the corresponding imaging cell.

During other certain operations (such as during signal integration mode operations), the bottom and top reset transistors are turned OFF, and the bottom and top row select transistors are turned OFF. The potential signals $V_{trans-n}$ and $V_{storage-n}$ are controlled to lower the potential barrier of the buried-QW-channel provided by the n-type modulation doped structure 32 between the imaging region 301 and the storage diode region 307-1' in order produce a desired subthreshold current flow through this buried-QW-channel to the respective storage diode region 307-1' for accumulation of charge arising from the hole photocurrent of the imaging region 301 in the storage diode region 307-1'. Similarly, the potential signals $V_{trans-p}$ and $V_{storage-p}$ are controlled to lower the potential barrier of the buried-QW-channel provided by the p-type modulation doped structure 32 between the imaging region 301 and the storage diode region 307-2' in order produce a desired subthreshold current flow through this buried-QW-channel to the respective storage diode region 307-2' for accumulation of charge arising from the hole photocurrent of the imaging region 301 in the storage diode region 307-2'.

In further operations (such as during readout mode operations), the reset transistors are turned OFF. The potential signal $V_{out-n}$ is controlled to lower the potential barrier of the buried-QW-channel provided by the n-type modulation doped structure 32 between the storage diode region 307-1' and the output diode region 309-1' in order transfer accumulated charge (i.e., electrons) from the storage diode region 307-1' to the output diode region 309-1', which controls the top output transistor (SRC) of the imaging cell to output the signal $V_{signal-n}$. Similarly, the potential signals $V_{out-p}$ is controlled to lower the potential barrier of the buried-QW-channel provided by the p-type modulation doped structure 20 between the storage diode region 307-2' and the output diode region 309-2' in order transfer accumulated charge (i.e., holes) from the storage diode region 307-2' to the output diode region 309-2', which controls the bottom output transistor (SRC) of the cell to output the signal $V_{signal-p}$. The top row select transistor (labeled "SEL) is turned ON to output the voltage signal $V_{signal-n}$ generated by the top output transistor (SRC) onto the corresponding column bus (labeled "λ1") for the array of imaging cells, and the bottom row select transistor (labeled "SEL) is turned ON to output the voltage signal $V_{signal-p}$ generated by the bottom output transistor onto the corresponding column bus (labeled λ2) for the array of imaging cells. The signal $V_{signal-n}$ represents the accumulated charge for each respective imaging cell during readout and is proportional to the power of the incident electromagnetic radiation at the characteristic wavelength (λ1) absorbed by the QDs of the QD-in-QW structure 28 that is received at the respective imaging cell during the signal integration time period. The signal $V_{signal-n}$ is supplied to read-out circuitry for signal processing as desired. The signal $V_{signal-p}$ represents the accumulated charge for each respective imaging cell during readout and is proportional to the power of the incident electromagnetic radiation at the characteristic wavelength (λ2) absorbed by the QDs of the QD-in-QW structure 24 that is received at the respective imaging cell during the signal integration time period. The signal $V_{signal-p}$ is supplied to read-out circuitry for signal processing as desired.

FIG. 11 summarizes the hole current flow of the thyristor imaging cell for the signal $V_{signal-p}$ during the signal integration mode operations for the active-pixel-type imaging architecture of the embodiment of FIGS. 10A-10C(viii). The electron current flow of the thyristor imaging cell for the signal $V_{signal-n}$ during the signal integration mode is similar to that discussed above with respect to FIG. 6. Note that the device structure is preferably subject to bias conditions where the thyristor action of the respective image regions 301 is OFF (a non-conducting state) similar to the operating point shown in the IV curve of FIG. 7. These bias conditions form a first depletion region that encompasses the QD-in-QW structure 28 of the respective image regions 301 and moves electrons from the n-type delta doping of the QD-in-QW structure 28 into the QDs of the QD-in-QW structure 28 of the respective imaging regions 301 as well as a second depletion region that encompasses the QD-in-QW structure 24 and moves holes from the p-type delta doping of the QD-in-QW structure 24 of the respective imaging regions 301 into the QDs of the QD-in-QW structure 24 of the respective imaging regions 301. These bias conditions also introduce a relatively small hole diffusion current from the p-type modulation doped QW structure 20 into the QDs of the QD-in-QW structure 24 of the respective imaging regions 301. Moreover, the QDs of the QD-in-QW structure 24 in the respective imaging region 301s are in the depletion region of the second collector region, which is subject to a built-in electric field that moves mobile holes toward the p-type modulation doped QW structure 20 of the respective imaging regions 301. When electromagnetic radiation is absorbed by the QDs of the QD-in-QW structure 24 of the respective imaging regions 301, the holes in the QDs will receive enough energy to place them in the valence band via intersubband transitions. Once in the valence band, the built-in electric field moves the mobile holes to the QW channel of the p-type modulation doped QW structure 20 of the respective imaging regions 301. In this manner, the intersubband absorption mechanism of the QDs of the QD-in-QW structure 24 produces hole photocurrent that flows to the QW channel of the p-type modulation doped QW structure 20 under the influence of the built-in electric field of device structure. The n-type modulation doped QW structure 32 provides a buried-QW-channel that allows for lateral transport of electron photocurrent from the respective imaging regions 301 to respective storage diode regions 307-1'. The electron charge resulting from such photocurrent accumulates in respective storage diode regions 307-1' of the imaging cells of the array over the time period of the signal integration mode. The amount of accumulated charge is proportional to the power of the electromagnetic radiation at the characteristic absorption wavelength (λ1) of the QDs of the of the QD-in-QW structure 28 that is received at the imaging cell during the signal integration period. The p-type modulation doped QW structure 20 provides a buried-QW-channel that allows for lateral transport of hole photocurrent from the respective imaging regions 301 to respective storage diode regions 307-2 (or an output diode region 309-2) of the row of the imaging cells via the output gate 305-2. The hole charge resulting from such photocurrent accumulates in respective storage diode regions 307-2 of the imaging cells of the array over the time period of the signal integration mode. The amount of accumulated charge is proportional to the power of the electromagnetic radiation at the characteristic absorption wavelength (λ2) of the QDs of the QD-in-QW structure 24 that is received at the imaging cell during the signal integration period.

The imaging cells of the illustrative dual wavelength active-pixel-type imaging architecture preferably operate over successive imaging cycles that include the three distinct modes as described above: a pixel setup mode; a signal integration mode; and a readout mode.

In alternate embodiments, the opposed DBR mirror structures of the thyristor imaging cells of the array can be omitted. Instead, a structured metal film 1200 can be formed adjacent the top p-type layer 38 and overlie the imaging region of the imaging cell as shown schematically in FIG. 12. The structured metal film 1200 can be realized by a metal hole array (MHA) having a periodic array of holes that are configured to excite (evanescent) surface plasmon-like electromagnetic modes in the active device structure of the imaging region of the imaging cell in response to incident electromagnetic radiation. The wavelength of the surface plasmon-like electromagnetic modes excited by the MHA is controlled primarily by the pitch of the periodic array of the holes. The holes can be different shapes, such as circular holes, square holes and triangular holes. The metal of the MHA can be a wide variety of metals. In one embodiment, the structured metal film 1200 is realized by a thin metal layer of gold Au of about 500 Å in thickness that is patterned with a periodic array of holes of a predetermined diameter (e.g., 1.6 μm) with a predetermined pitch (e.g., 2.4 μm to 3.2 μm). In other embodiments, the structured metal film 1200 can be a hybrid structure realized by combination of a MHA with another optical element exhibiting resonance which gives rise to additional excitation peaks or to enhancement of the excitation if resonances from different constituents fit each other. This provides additional tools to control and adjust the excitation of the surface plasmon-like electromagnetic modes in the active device structure of the imaging region of the imaging cell. Such hybrid structures can include an MHA sandwiched between two dielectric slabs, a dielectric slab sandwiched between two MHAs, and an MHA lying on top of a 1D photonic crystal structure. In yet other embodiment, the structured metal film 1200 can be a hybrid structure realized by a corrugated metal surface or other suitable structure for exciting surface plasmon-like electromagnetic modes in the active device structure of the imaging region of the imaging cell. Examples of such structures are described in U.S. Pat. No. 6,040,936 to Kim et al., and U.S. Patent Publ. No 2012/0205541 to Lee et al., which are hereby incorporated by reference in their entireties. Note that details of the coupling of incident radiation to the surface plasmon-like electromagnetic modes is sensitive to the periods of the metal holes, the sizes of the holes, the thicknesses of the metal and holes, the presence of additional films such as a low index dielectric film between the semiconductor and the metal structure, and the optical properties, including absorption, of the underlying semiconductor device. These details can be adjusted to optimize the coupling for a particular application. The structured metal film 1200 acts as a grating which causes the incident electromagnetic radiation to propagate parallel to the surface and at the metal/semiconductor surface in the form of surface plasmons. This may greatly enhance absorption since the surface plasmon radiation is polarized normal to the surface and thus better absorbed by the QDs of the QD-in-QW structures of the imaging region. The incident radiation preferably arrives from the top side (through the structured metal film 1200). Alternatively, it can arrive from the bottom side (through the substrate).

Signal processing operations can be performed to reduce the effect of unwanted noise components in the signals output from the imaging cells of the array. For example, signal processing techniques can be used to characterize the average dark signal noise output from the imaging cells and such average dark signal noise can be subtracted from the output signal of each imaging cell of the array. In another example, signal processing techniques can be used to characterize the dark signal noise output from each respective imaging cell and such dark signal noise values can be subtracted from the output signal of the corresponding imaging cell. In yet another example, correlated double sampling can be used to remove the effect of variation of the reference voltage of each imaging cell (i.e., due to variations in the potential of the diode region of the respective imaging cell after completion of the pixel setup operations) from the output signal of the respective pixel at the end of each signal integration period.

The imaging array of the present invention (and the signals produced therefrom) can be used in many applications. For example, it can be used to perform imaging operations over nanosecond to millisecond time increments (due to the high speed of response of the QDs of the device structure) together with accumulation of charge and readout functionality for each imaging cell as an integral part of the imaging array. Moreover, the imaging array is capable of imaging by top side illumination (through the side opposite the substrate) and thus can avoid the costly thinning of substrates required for backside illuminated imaging. Furthermore, the imaging array is expected to operate efficiently at or near room temperatures and thus does not require complex cooling systems typically provided by dewar cooler assemblies. Moreover, the imaging array can be part of a wide array of imaging architectures, such as interline-transfer CCD architectures and frame-transfer CCD architectures. Moreover, the imaging array can readily be adapted to image wavelengths over a broad spectrum of wavelengths (including mid-infrared wavelengths as well as long-infrared wavelengths). Moreover, the imaging array of the present invention can be efficiently integrated with a broad range of optical and electronic devices, for example to provide an integrated array together with associated optoelectronics and/or logic circuits and/or signal processing circuits.

Preferably, the imaging array of the present invention (and possibly other optoelectronic devices, logic circuits and/or signal processing circuits that are fabricated integral thereto) are realized from the applicant's POET technology as referred to herein. With these structures, a fabrication sequence can be used to make the devices on a common substrate. In other words, n type and p type contacts, critical etches, etc. can be used to realize all of these devices simultaneously on a common substrate. The essential features of this device structure include 1) self-aligned contacts to the QW channel of the n-type and p-type modulation doped QW structure formed by ion implantation, 2) n-type metal contacts to the n-type ion implants and the bottom n-type layer structure, and 3) p-type metal contacts to the p-type ion implants and the top p-type layer structure. The active device structures are preferably realized with a material system of group III-V materials (such as a GaAs/AlGaAs).

There have been described and illustrated herein several embodiments of an imaging array integrated circuit employing embedded quantum dots for single wavelength and dual-wavelength imaging applications. While particular embodiments of the invention have been described, it is not intended that the invention be limited thereto, as it is intended that the invention be as broad in scope as the art will allow and that the specification be read likewise. Thus, while particular group III-V material system and heterostructures have been disclosed, it will be appreciated that other III-V material systems and heterostructures can be used to realize the imaging array integrated circuitry as described herein. It will therefore be appreciated by those skilled in the art that yet other modifications could be made to the provided invention without deviating from its spirit and scope as claimed.

What is claimed is:

1. A semiconductor device comprising:
an array of imaging cells, wherein
an imaging cell of the array of imaging cells includes an imaging region and first and second charge storage regions, wherein the first and second charge storage regions are laterally spaced apart from the imaging region, and wherein the semiconductor device further comprises:
 a p-type modulation doped quantum well (QW) structure formed above a substrate and that extends laterally through the first charge storage region;
 a first quantum dot-in-quantum well (QD-in-QW) structure deposited above the p-type modulation doped QW structure, wherein the first QD-in-QW structure absorbs an incident electromagnetic radiation having a wavelength within a predetermined first wavelength band and generates a hole photocurrent, wherein the p-type modulation doped QW structure defines a first buried QW channel for lateral transfer of the hole photocurrent, and wherein the p-type modulation doped QW structure receives the hole photocurrent and transports the hole photocurrent towards the first charge storage region by way of the first buried QW channel;
 a spacer layer formed above the first QD-in-QW structure;
 a second QD-in-QW structure formed above the first QD-in-QW structure;
wherein the second QD-in-QW structure absorbs an incident electromagnetic radiation having a wavelength within a predetermined second wavelength band and generates an electron photocurrent; and
 an n-type modulation doped QW structure formed above the second QD-in-QW structure and that extends laterally through the second charge storage region, thereby defining a second buried QW channel for lateral transfer of the electron photocurrent, wherein the n-type modulation doped QW structure receives the electron photocurrent and transports the electron photocurrent towards the second charge storage region by way of the second buried QW channel.

2. The semiconductor device of claim 1, further comprising:
an n-type ohmic contact layer formed above the substrate;
an n-type layer formed on the n-type ohmic contact layer;
a p-type layer formed above the n-type modulation doped QW structure;
a p-type ohmic contact layer deposited on the p-type layer;
a first trench formed adjacent to the imaging region, and that extends till the spacer layer, wherein the first trench defines a first sidewall of the imaging region;
a first doped region formed directly below the first trench, and that extends below the p-type modulation doped QW structure, wherein the first doped region is a p-type doped region;
a second trench formed adjacent to the imaging region, and that extends till the p-type layer, wherein the second trench defines a second sidewall of the imaging region; and
a second doped region formed directly below the second trench, and that extends below the n-type modulation doped QW structure, wherein the second doped region is an n-type doped region.

3. The semiconductor device of claim 2, further comprising:
a cathode electrode coupled to the n-type ohmic contact layer;
an anode electrode deposited on a first mesa of the p-type ohmic contact layer in the imaging region;
a first transfer gate formed adjacent to the first trench, wherein the first transfer gate includes:
 a first transfer gate electrode that is deposited on a first mesa of the spacer layer, and wherein the first trench is between the imaging region and the first transfer gate;
a second transfer gate formed adjacent to the second trench, wherein the second transfer gate includes:
 a second transfer gate electrode that is deposited on a second mesa of the p-type ohmic contact layer, and wherein the second trench is between the imaging region and the second transfer gate;
a first charge storage electrode deposited on a second mesa of the spacer layer in the first charge storage region, wherein the first charge storage region is formed adjacent to the first transfer gate, and wherein the first transfer gate isolates the imaging region from the first charge storage region; and
a second charge storage electrode deposited on a third mesa of the p-type ohmic contact layer in the second charge storage region, wherein the second charge storage region is formed adjacent to the second transfer gate, and wherein the second transfer gate isolates the imaging region from the second charge storage region.

4. The semiconductor device of claim 3, further comprising:
first and second input diode regions formed by first and second ion implant regions, respectively, wherein
the first ion implant region extends vertically below the p-type modulation doped QW structure, and wherein the second ion implant region extends vertically below the n-type modulation doped QW structure;
a first input gate formed adjacent to the first input diode region, wherein the first input gate includes:
 a first input gate electrode that is formed on a third mesa of the spacer layer; and
a second input gate formed adjacent to the second input diode region, wherein the second input gate includes:
 a second input gate electrode that is formed on a fourth mesa of the p-type ohmic contact layer.

5. The semiconductor device of claim 4, further comprising:
a first output gate formed adjacent to the first charge storage region, wherein the first output gate includes:
 a first output gate electrode that is deposited on a fourth mesa of the spacer layer;
a second output gate formed adjacent to the second charge storage region, wherein the second output gate includes:

a second output gate electrode that is deposited on a fifth mesa of the p-type ohmic contact layer:
a first output diode region formed by a third ion implant region, wherein the third ion implant region is adjacent to the first output gate, and extends vertically below the p-type modulation doped QW structure, and wherein the first output gate isolates the first output diode region from the first charge storage region; and
a second output diode region formed by a fourth ion implant region, wherein the fourth ion implant region is adjacent to the second output gate, and extends vertically below the n-type modulation doped QW structure, and wherein the second output gate isolates the second output diode region from the second charge storage region.

6. The semiconductor device of claim 5, further comprising:
first and second barrier regions disposed adjacent to the first and second charge storage regions, respectively;
a fifth ion implant region deposited adjacent to the first output diode region, wherein the fifth ion implant region is a first reset diode region of the semiconductor device;
a sixth ion implant region deposited into a recess formed by etching down till the p-type layer, and adjacent to the second output diode region, wherein the sixth ion implant region is a second reset diode region of the semiconductor device;
a first reset gate disposed between the first output diode region and the fifth ion implant region, wherein the first reset diode region empties the first charge storage region and the first output diode region based on an electrical signal applied to the first reset gate, and wherein the first reset gate controls a potential barrier of the first buried QW channel to isolate the first output diode region from the first reset diode region; and
a second reset gate disposed between the second output diode region and the sixth ion implant region, wherein the second reset diode region empties the second charge storage region and the second output diode region based on an electrical signal applied to the second reset gate, and wherein the second reset gate controls a potential barrier of the second buried QW channel to isolate the second output diode region from the second reset diode region.

7. The semiconductor device of claim 6, wherein:
the first and second input diode regions populate the p-type and n-type modulation doped QW structures with majority carriers, respectively, and wherein the first input gate controls the potential barrier of the first buried QW channel between the first input diode region and the first barrier region, and wherein the second input gate controls the potential barrier of the second buried QW channel between the second input diode region and the second barrier region; and
the first and second output diode regions drive corresponding output transistors of the imaging cell, and wherein charge accumulated in the first and second charge storage regions are output to the first and second output diode regions based on electrical signals applied to the first and second output gates, respectively.

8. The semiconductor device of claim 6, further comprising:
a third trench formed adjacent to the first transfer gate, and that extends till the spacer layer wherein the third trench defines a first sidewall of the first charge storage region;
a fourth trench formed adjacent to the second transfer gate, and that extends till the p-type layer, wherein the fourth trench defines a first sidewall of the second charge storage region;
a third doped region formed directly below the third trench, and that extends below the p-type modulation doped QW structure, wherein the third doped region is a p-type doped region;
a fourth doped region formed directly below the fourth trench, and that extends below the n-type modulation doped QW structure, wherein the fourth doped region is an n-type doped region;
a fifth trench formed adjacent to the first output gate, and that extends till the spacer layer, wherein the fifth trench defines a second sidewall of the first charge storage region and a first sidewall of the first output gate;
a sixth trench formed adjacent to the second output gate, and that extends till the p-type layer, wherein the sixth trench defines a second sidewall of the second charge storage region and a first sidewall of the second output gate;
a fifth doped region formed directly below the fifth trench, and that extends below the p-type modulation doped QW structure, wherein the fifth doped region is a p-type doped region; and
a sixth doped region formed directly below the sixth trench, and that extends below the n-type modulation doped QW structure, wherein the sixth doped region is an n-type doped region.

9. The semiconductor device of claim 6, wherein
the imaging cell is adapted to operate in at least one of the following modes
i) a pixel setup mode whereby the n-type, modulation doped QW structure of the imaging region is filled with electrons and the p-type modulation doped QW structure of the imaging region of the imaging cell is filled with holes;
ii) a signal integration mode whereby the hole photocurrent generated by the first QD-in-QW structure of the imaging region is transported laterally by the first buried QW channel for charge accumulation in the first charge storage region and the electron photocurrent generated by the second QD-in-QW structure of the imaging region is transported laterally by the second buried QW channel for charge accumulation in the second charge storage region; and
iii) a readout mode that generates output signals corresponding to the charge accumulated in the first and second charge storage regions of the imaging cell in the signal integration mode.

10. The semiconductor device of claim 9, wherein
the imaging cell is configured to perform a sequence of imaging cycles, each cycle including the pixel setup mode, the signal integration mode, and the readout mode.

11. The semiconductor device of claim 9, wherein the first transfer gate covers the first buried QW channel to control the potential barrier of the first buried QW channel between the imaging region and the first charge storage region, thereby controlling flow of the hole photocurrent through the first buried QW channel between the imaging region and the first charge storage region, and wherein the second transfer gate covers the second buried QW channel to control the potential barrier of the second buried QW channel between the imaging region and the second charge storage region, thereby controlling flow of the electron photocurrent through the second buried QW channel between the imaging region and the second charge storage region.

12. The semiconductor device of claim 9, wherein
in the signal integration mode, the first transfer gate controls the potential barrier of the first buried QW channel to block flow of charge that initially fills the p-type modulation doped QW structure of the imaging region while allowing the hole photocurrent to flow through the first buried QW channel to the first charge storage region, and
wherein the second transfer gate controls the potential barrier of the second buried QW channel to block flow of charge that initially fills the n-type modulation doped QW structure of the imaging region while allowing the electron photocurrent to flow through the second buried QW channel to the second charge storage region.

13. The semiconductor device of claim 9, wherein
in the readout mode, the charge accumulated in the first charge storage region is output to the first output diode region for driving a first output transistor of the imaging cell as part of an active-pixel-type imaging array, and wherein the charge accumulated in the second charge storage region is output to the second output diode region for driving a second output transistor of the imaging cell as part of the active-pixel-type imaging array.

14. The semiconductor device of claim 6, wherein
the first charge storage region comprises a seventh ion implant region formed directly below the second mesa of the spacer layer, wherein the seventh ion implant region extends below the p-type modulation doped QW structure, wherein the second charge storage region comprises an eight ion implant region formed directly below the third mesa of the p-type ohmic contact layer, and wherein the eight ion implant region extends below the n-type modulation doped QW structure.

15. The semiconductor device of claim 14, wherein
each imaging cell of the array of imaging cells have corresponding first and second charge storage regions that accumulate charge, wherein the accumulated charge in the first charge storage regions is transferred between the first charge storage regions as part of a CCD-type imaging array, and wherein the accumulated charge the second charge storage regions is transferred between the second charge storage regions as part of the CCD-type imaging array.

16. The semiconductor device of claim 2, further comprising:
a bottom distributed bragg reflector (DBR) mirror deposited on the substrate; and
a top DBR mirror deposited above the p-type ohmic contact layer and the spacer layer, wherein a distance between the top and bottom DBR mirrors represents a length of a resonant cavity.

17. The semiconductor device of claim 1, wherein
the p-type and n-type modulation doped QW structures and the first and second QD-in-QW structures are disposed within a resonant cavity of the imaging cell that receives the incident electromagnetic radiations having wavelengths within predetermined first and second wavelength bands.

18. The semiconductor device of claim 1, wherein
the p-type and n-type modulation doped QW structures and the first and second QD-in-QW structures are disposed below a structured metal film having a periodic array of holes.

19. The semiconductor device of claim 1, wherein
the semiconductor device defines built-in electric fields that transport carriers of the hole photocurrent to the first buried QW channel for accumulation of charge corresponding to the hole photocurrent in the first charge storage region, and wherein the built-in electric fields transport carriers of the electron photocurrent to the second buried QW channel for accumulation of charge corresponding to the electron photocurrent in the second charge storage region.

20. The semiconductor device of claim 1, wherein:
the imaging region is configured to generate first and second diffusion currents that supplies carriers to the first and second QD-in-QW structures, respectively, whereby the first and second diffusion currents are less than the hole and electron photocurrents, respectively;
the first QD-in-QW structure generates the hole photocurrent by the carriers undergoing intersubband transitions arising from absorption of the incident electromagnetic radiation within the predetermined first wavelength band; and
the second QD-in-QW structure generates the electron photocurrent by the carriers undergoing intersubband transitions arising from absorption of the incident electromagnetic radiation within the predetermined second wavelength band.

* * * * *